United States Patent
Hitomi et al.

(10) Patent No.: US 11,370,950 B2
(45) Date of Patent: *Jun. 28, 2022

(54) SURFACE-MODIFIED INORGANIC NITRIDE, COMPOSITION, THERMALLY CONDUCTIVE MATERIAL, AND DEVICE WITH THERMALLY CONDUCTIVE LAYER

(71) Applicant: FUJIFILM Corporation, Tokyo (JP)

(72) Inventors: Seiichi Hitomi, Ashigara-kami-gun (JP); Keita Takahashi, Ashigara-kami-gun (JP); Naoyuki Hayashi, Ashigara-kami-gun (JP); Teruki Niori, Ashigara-kami-gun (JP); Daisuke Hayashi, Ashigara-kami-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/735,789

(22) Filed: Jan. 7, 2020

(65) Prior Publication Data
US 2020/0140738 A1    May 7, 2020

Related U.S. Application Data

(63) Continuation of application No. PCT/JP2018/026483, filed on Jul. 13, 2018.

(30) Foreign Application Priority Data

Jul. 14, 2017 (JP) .............................. JP2017-138389

(51) Int. Cl.
| | | |
|---|---|---|
| C09K 5/14 | (2006.01) | |
| C08K 3/38 | (2006.01) | |
| C08K 9/04 | (2006.01) | |
| C09C 1/00 | (2006.01) | |
| C09C 3/08 | (2006.01) | |
| H01L 23/373 | (2006.01) | |

(52) U.S. Cl.
CPC .............. C09K 5/14 (2013.01); C08K 3/38 (2013.01); C08K 9/04 (2013.01); C09C 1/00 (2013.01); C09C 3/08 (2013.01); H01L 23/3737 (2013.01); C01P 2006/32 (2013.01); C08K 2003/385 (2013.01); C08K 2201/001 (2013.01)

(58) Field of Classification Search
CPC .... C09K 5/14; C09C 1/00; C09C 3/08; C08K 3/38; C08K 9/04; C08K 2003/385; C08K 2003/382; C08K 2201/001; H01L 23/3737; C01B 21/064; C01B 21/068; C01B 21/072

See application file for complete search history.

(56) References Cited

U.S. PATENT DOCUMENTS

| | | | | |
|---|---|---|---|---|
| 1,421,875 A | * | 7/1922 | Lloyd | ...................... A46D 1/00 15/210.1 |
| 2015/0069288 A1 | * | 3/2015 | Hong | .................. C01B 21/0648 252/71 |
| 2016/0340533 A1 | * | 11/2016 | Casiraghi | ............... C01G 41/00 |
| 2017/0247546 A1 | | 8/2017 | Takahashi | |

(Continued)

FOREIGN PATENT DOCUMENTS

| | | |
|---|---|---|
| JP | 2001-192500 A | 7/2001 |
| JP | 2007-290929 A | 11/2007 |
| JP | 2009-221039 A | 10/2009 |

(Continued)

OTHER PUBLICATIONS

Dongju Lee et al., "Enhanced Mechanical Properties of Epoxy Nanocomposites by Mixing Noncovalently Functionalized Boron Nitride Nanoflakes", Small, 2013, 9, No. 15, 2602-2610. Published online Mar. 4, 2013. (Year: 2013).*

Wenlong Wang et al., "Aqueous Noncovalent Functionalization and Controlled Near-Surface Carbon Doping of Multiwalled Boron Nitride Nanotubes", J. Am. Chem. Soc., 2008, 130, 8144-8145. Published online Jun. 10, 2008 (Year: 2008).*

Communication dated May 18, 2020, from the European Patent Office in European Application No. 18831152.6.

Communication dated Jan. 19, 2021, from the Japanese Patent Office in Application No. 2019-529800.

(Continued)

*Primary Examiner* — Jane L Stanley
(74) *Attorney, Agent, or Firm* — Sughrue Mion, PLLC

(57) ABSTRACT

A first object of the present invention is to provide a surface-modified inorganic nitride having excellent dispersibility. Furthermore, a second object of the present invention is to provide a composition, a thermally conductive material, and a device with a thermally conductive layer which contain the surface-modified inorganic nitride.

The surface-modified inorganic nitride of the present invention includes an inorganic nitride, and a specific compound adsorbed onto a surface of the inorganic nitride, and
the specific compound has a functional group selected from the group consisting of a boronic acid group, an aldehyde group, an isocyanate group, an isothiocyanate group, a cyanate group, an acyl azide group, a succinimide group, a sulfonyl chloride group, a carboxylic acid chloride group, an onium group, a carbonate group, an aryl halide group, a carbodiimide group, an acid anhydride group, a carboxylic acid group, a phosphonic acid group, a phosphinic acid group, a phosphoric acid group, a phosphoric acid ester group, a sulfonic acid group, a halogenated alkyl group, a nitrile group, a nitro group, an ester group, a carbonyl group, an imidoester group, an alkoxysilyl group, an acrylic group, a methacrylic group, an oxetanyl group, a vinyl group, an alkynyl group, a maleimide group, a thiol group, a hydroxyl group, a halogen atom, and an amino group, and has a fused-ring structure containing two or more rings selected from the group consisting of an aromatic hydrocarbon ring and an aromatic heterocyclic ring.

22 Claims, 8 Drawing Sheets

(56) References Cited

U.S. PATENT DOCUMENTS

2018/0327265 A1    11/2018    Hitomi et al.

FOREIGN PATENT DOCUMENTS

| | | |
|---|---|---|
| JP | 2011-236376 A | 11/2011 |
| KR | 2002-0036933 A | 5/2002 |
| WO | 2016/084873 A1 | 6/2016 |
| WO | 2017/131005 A1 | 8/2017 |

OTHER PUBLICATIONS

International Search Report dated Oct. 16, 2018, issued by the International Searching Authority in application No. PCT/JP2018/026483.
Written Opinion dated Oct. 16, 2018, issued by the International Searching Authority in application No. PCT/JP2018/026483.
International Preliminary Report on Patentability dated Jan. 14, 2020, issued by the International Bureau in application No. PCT/JP2018/026483.
Office Action dated Jul. 26, 2021 from the Korean Intellectual Property Office in Korean Application No. 10-2020-7000027, with translation; 22 pages total.

* cited by examiner

SURFACE-MODIFIED INORGANIC NITRIDE, COMPOSITION, THERMALLY CONDUCTIVE MATERIAL, AND DEVICE WITH THERMALLY CONDUCTIVE LAYER

CROSS-REFERENCE TO RELATED APPLICATIONS

This application is a Continuation of PCT International Application No. PCT/JP2018/026483 filed on Jul. 13, 2018, which claims priority under 35 U.S.C. § 119(a) to Japanese Patent Application No. 2017-138389 filed on Jul. 14, 2017. The above application is hereby expressly incorporated by reference, in its entirety, into the present application.

BACKGROUND OF THE INVENTION

1. Field of the Invention

The present invention relates to a surface-modified inorganic nitride, a composition, a thermally conductive material, and a device with a thermally conductive layer.

2. Description of the Related Art

In order to widen the range of applications of an inorganic nitride, a method of modifying the surface of the inorganic nitride has been suggested.

For example, JP2001-192500A discloses a method of treating the surface of boron nitride, which is an inorganic nitride, with 1,4-phenylene diisocyanate.

SUMMARY OF THE INVENTION

In a case where an inorganic nitride is used by being mixed with an organic substance such as a resin binder, the inorganic nitride is required to exhibit further improved affinity with the organic substance. For example, in a case where an inorganic nitride such as boron nitride is used as a thermally conductive material by being mixed with an organic substance, in view of further improving the thermally conductive properties, the improvement of the dispersibility of the inorganic nitride in the organic substance is desired. In order to improve the dispersibility of the inorganic nitride, the surface of the inorganic nitride needs to be modified.

The present inventors prepared a surface-modified inorganic nitride obtained by treating a surface of boron nitride with 1,4-phenylene diisocyanate with reference to JP2001-192500A, mixed the surface-modified inorganic nitride with an organic substance to prepare a thermally conductive material, and evaluated the dispersibility of the surface-modified inorganic nitride in the organic substance, and as a result, the present inventors found that the dispersibility was insufficient and was required to be further improved.

Therefore, an object of the present invention is to provide a surface-modified inorganic nitride having excellent dispersibility.

Furthermore, another object of the present invention is to provide a composition, a thermally conductive material, and a device with a thermally conductive layer which contain the surface-modified inorganic nitride.

As a result of thorough examination conducted to achieve the objects, the present inventors have found that the objects can be achieved by using an inorganic nitride subjected to a surface treatment with a specific compound which will be described later, and have completed the present invention.

That is, the present inventors have found that the objects can be achieved by the following constitution.

[1] A surface-modified inorganic nitride comprising:
an inorganic nitride; and
a specific compound adsorbed onto a surface of the inorganic nitride,
in which the specific compound has a functional group selected from the group consisting of a boronic acid group, an aldehyde group, an isocyanate group, an isothiocyanate group, a cyanate group, an acyl azide group, a succinimide group, a sulfonyl chloride group, a carboxylic acid chloride group, an onium group, a carbonate group, an aryl halide group, a carbodiimide group, an acid anhydride group, a carboxylic acid group, a phosphonic acid group, a phosphinic acid group, a phosphoric acid group, a phosphoric acid ester group, a sulfonic acid group, a halogenated alkyl group, a nitrile group, a nitro group, an ester group, a carbonyl group, an imidoester group, an alkoxysilyl group, an acrylic group, a methacrylic group, an oxetanyl group, a vinyl group, an alkynyl group, a maleimide group, a thiol group, a hydroxyl group, a halogen atom, and an amino group, and has a fused-ring structure containing two or more rings selected from the group consisting of an aromatic hydrocarbon ring and an aromatic heterocyclic ring.

[2] The surface-modified inorganic nitride described in [1],
in which the specific compound is a compound represented by General Formula (1) which will be described later.

[3] The surface-modified inorganic nitride described in [2],
in which the compound represented by General Formula (1) is a compound represented by General Formula (2) which will be described later.

[4] The surface-modified inorganic nitride described in [2],
in which Y contains a functional group selected from the group consisting of a boronic acid group and an aldehyde group.

[5] The surface-modified inorganic nitride described in [2],
in which X has a fused-ring structure containing two or more aromatic hydrocarbon rings.

[6] The surface-modified inorganic nitride described in [5],
in which X has a fused-ring structure containing two or more benzene rings.

[7] The surface-modified inorganic nitride described in [5] or [6],
in which X has a fused-ring structure containing three or more benzene rings.

[8] The surface-modified inorganic nitride described in [5],
in which X has a fused-ring structure having a fused ring selected from the group consisting of biphenylene, indacene, acenaphthylene, fluorene, phenalene, phenanthrene, anthracene, fluoranthene, acephenanthrylene, aceanthrylene, pyrene, chrysene, tetracene, pleiadene, picene, perylene, pentaphene, pentacene, tetraphenylene, hexaphene, and triphenylene.

[9] The surface-modified inorganic nitride described in [3],
in which $Y^{11}$ contains a functional group selected from the group consisting of a boronic acid group and an aldehyde group.

[10] The surface-modified inorganic nitride described in [3] or [9],
in which $X^{11}$ has a fused-ring structure containing two or more aromatic hydrocarbon rings.

[11] The surface-modified inorganic nitride described in [10],
in which $X^{11}$ has a fused-ring structure containing two or more benzene rings.

[12] The surface-modified inorganic nitride described in [10] or [11],
in which $X^{11}$ has a fused-ring structure containing three or more benzene rings.

[13] The surface-modified inorganic nitride described in [10],
in which $X^{11}$ has a fused-ring structure having a fused ring selected from the group consisting of biphenylene, indacene, acenaphthylene, fluorene, phenalene, phenanthrene, anthracene, fluoranthene, acephenanthrylene, aceanthrylene, pyrene, chrysene, tetracene, pleiadene, picene, perylene, pentaphene, pentacene, tetraphenylene, hexaphene, and triphenylene.

[14] The surface-modified inorganic nitride described in any one of [1] to [13],
in which the inorganic nitride is at least one kind of nitride selected from the group consisting of boron nitride and aluminum nitride.

[15] The surface-modified inorganic nitride described in [14],
in which the inorganic nitride is boron nitride.

[16] A composition comprising:
the surface-modified inorganic nitride described in any one of [1] to [15]; and
a polymerizable monomer.

[17] The composition described in [16],
in which the polymerizable monomer has a group selected from the group consisting of an acryloyl group, a methacryloyl group, an oxiranyl group, and a vinyl group.

[18] The composition described in [16] or [17],
in which the polymerizable monomer or a cured substance thereof exhibits liquid crystallinity.

[19] The composition described in any one of [16] to [18] that is used for forming a thermally conductive material.

[20] A thermally conductive material comprising the surface-modified inorganic nitride described in any one of [1] to [15].

[21] The thermally conductive material described in [20] that is in the form of a sheet.

[22] The thermally conductive material described in [20] or [21] that is used in a heat dissipation sheet.

[23] A device with a thermally conductive layer, comprising:
a device; and
a thermally conductive layer which is disposed on the device and contains the thermally conductive material described in any one of [20] to [22].

According to the present invention, it is possible to provide a surface-modified inorganic nitride having excellent dispersibility.

Furthermore, according to the present invention, it is possible to provide a composition, a thermally conductive material, and a device with a thermally conductive layer which contain the surface-modified inorganic nitride.

DESCRIPTION OF THE PREFERRED EMBODIMENTS

Figure 1:
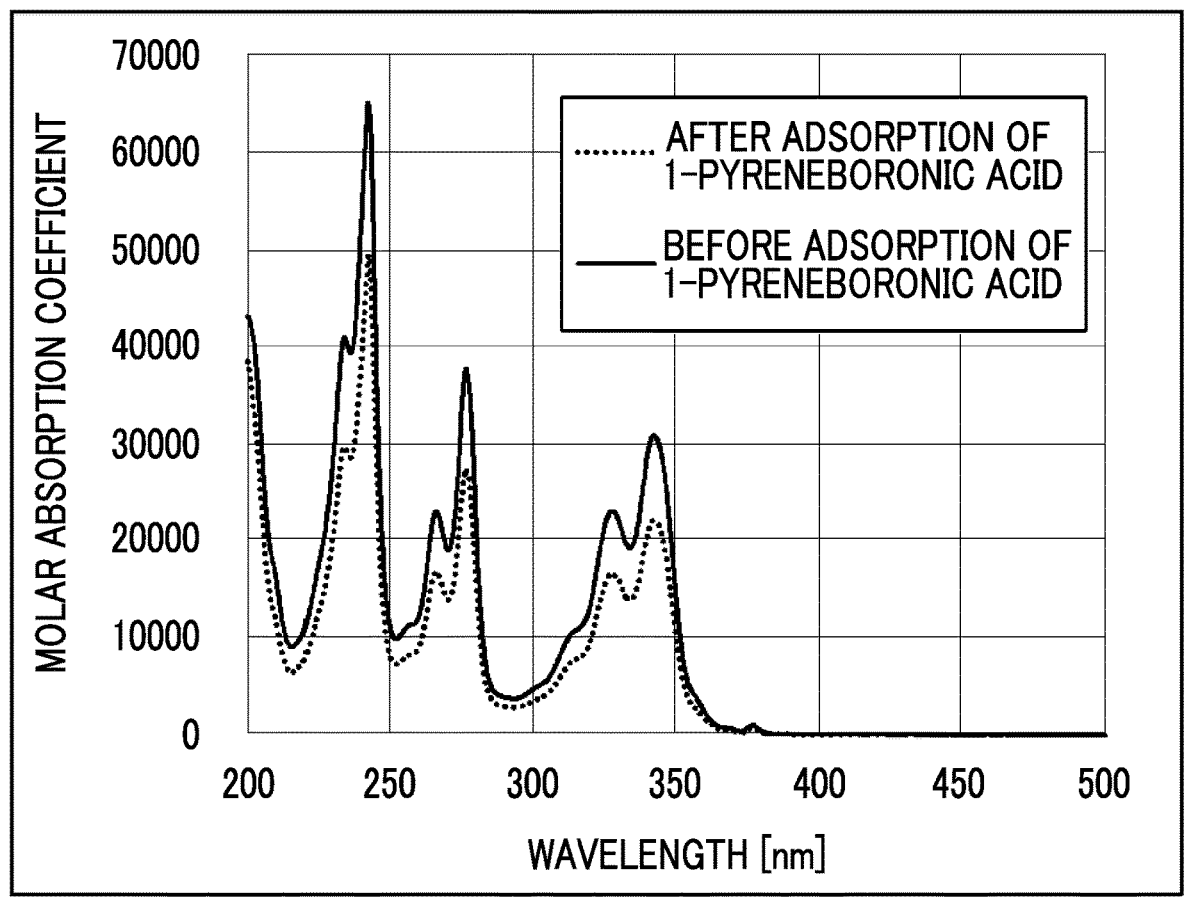
FIG. 1 shows ultraviolet•visible absorption spectra of a 1-pyreneboronic acid-containing solution before and after the addition of boron nitride.
Figure 2:
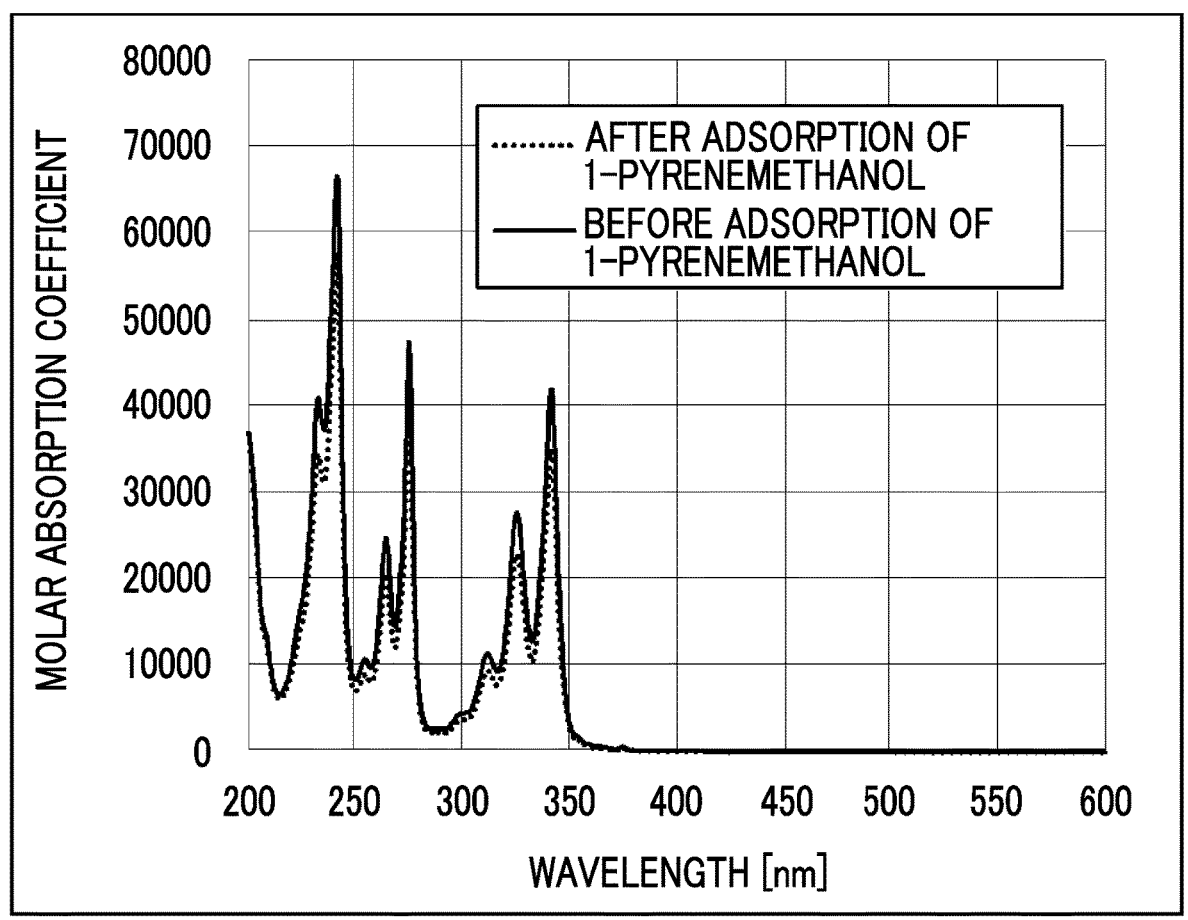
FIG. 2 shows ultraviolet•visible absorption spectra of a 1-pyrenemethanol-containing solution before and after the addition of boron nitride.
Figure 3:
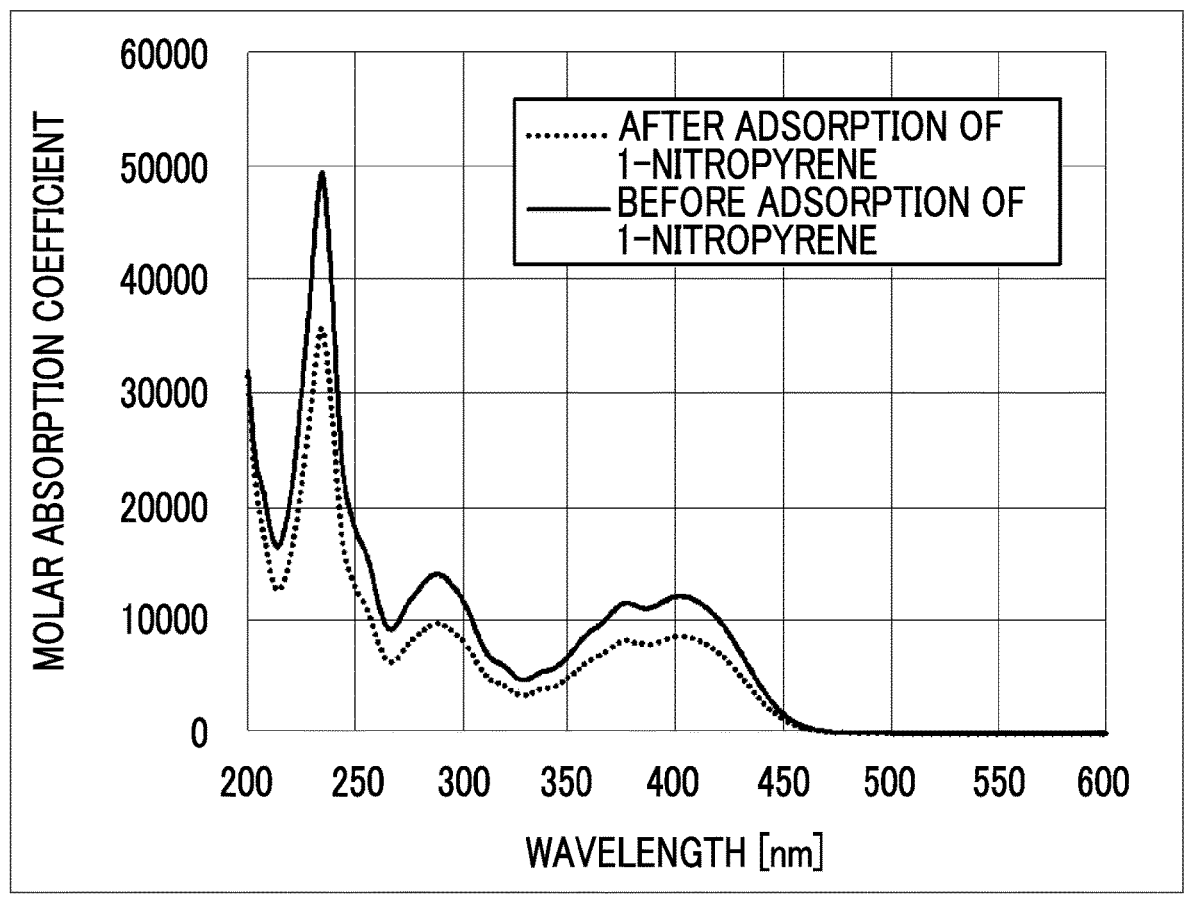
FIG. 3 shows ultraviolet•visible absorption spectra of a 1-nitropyrene-containing solution before and after the addition of boron nitride.
Figure 4:
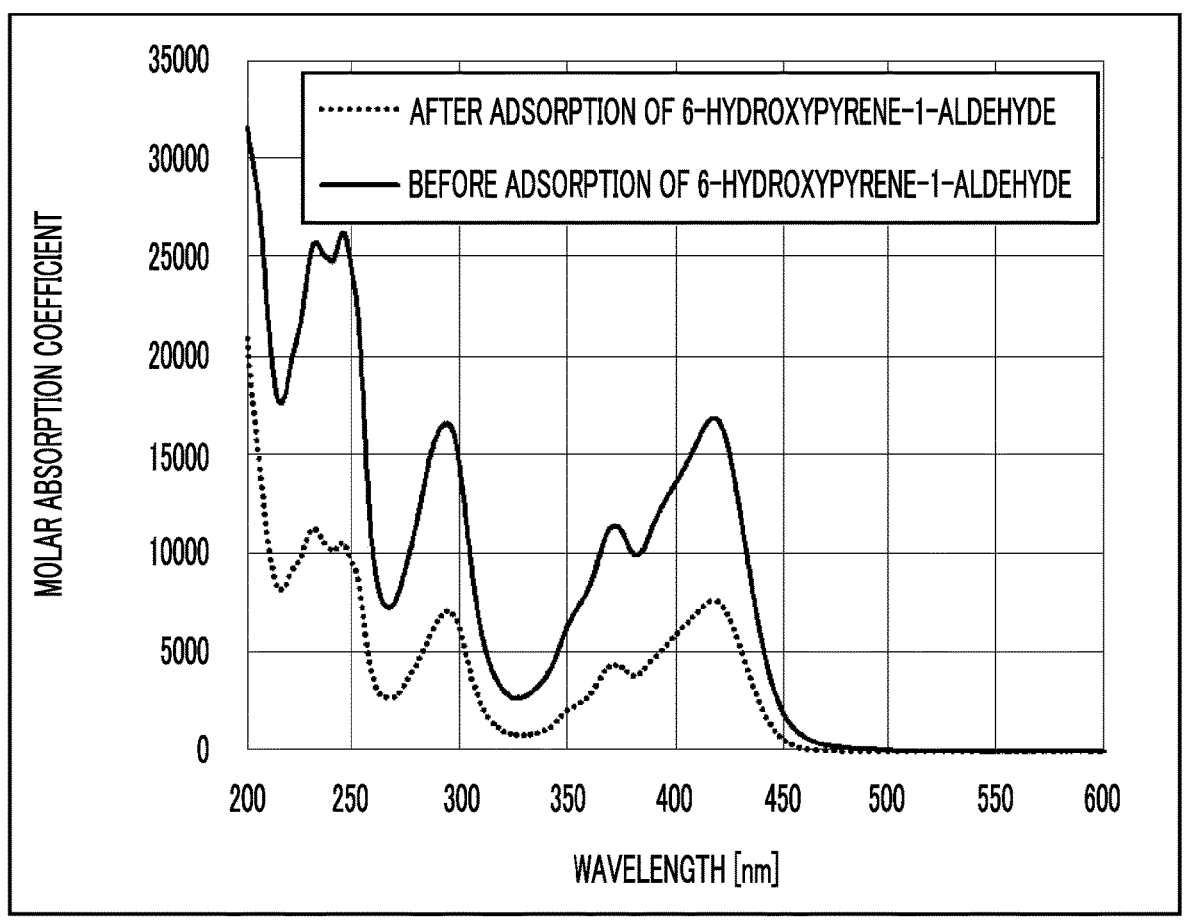
FIG. 4 shows ultraviolet•visible absorption spectra of a 6-hydroxypyrene-1-aldehyde-containing solution before and after the addition of boron nitride.
Figure 5:
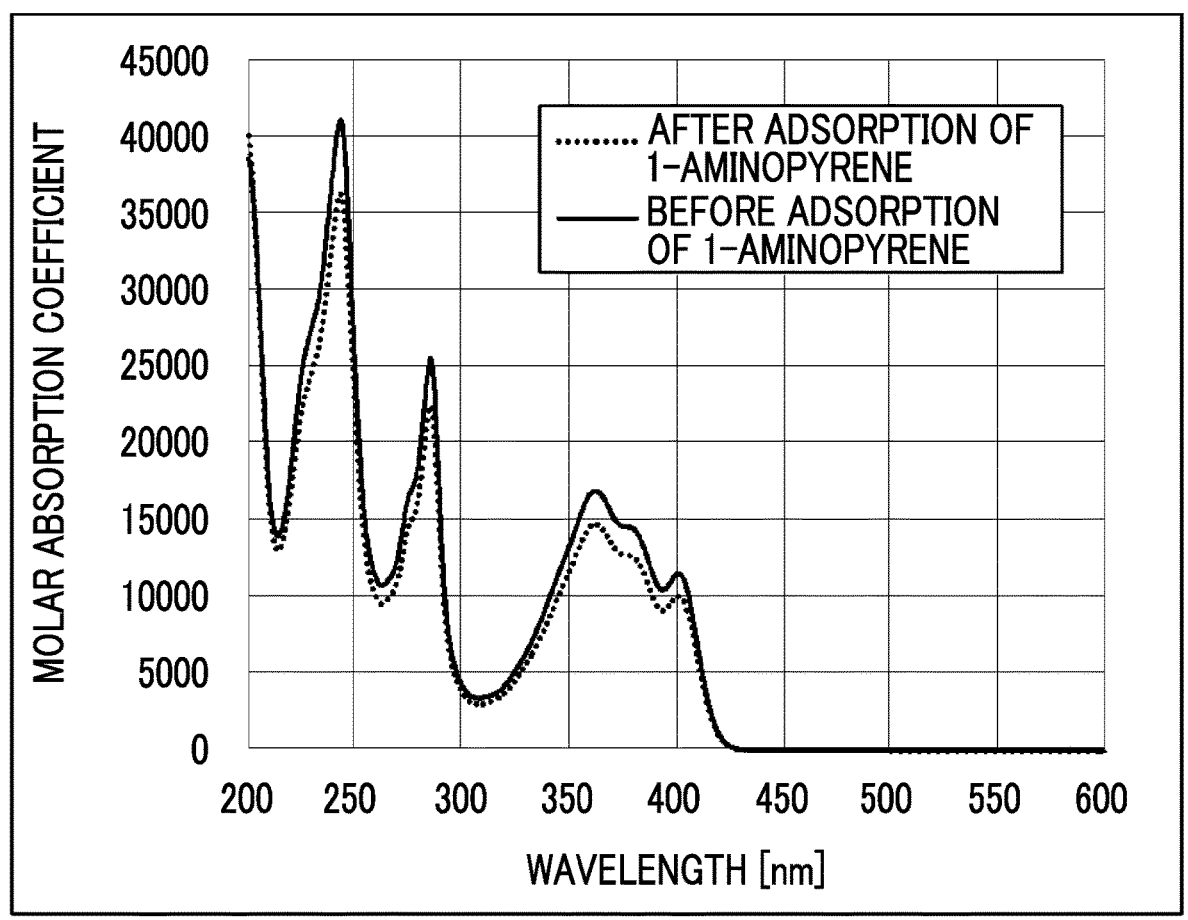
FIG. 5 shows ultraviolet•visible absorption spectra of a 1-aminopyrene-containing solution before and after the addition of boron nitride.
Figure 6:
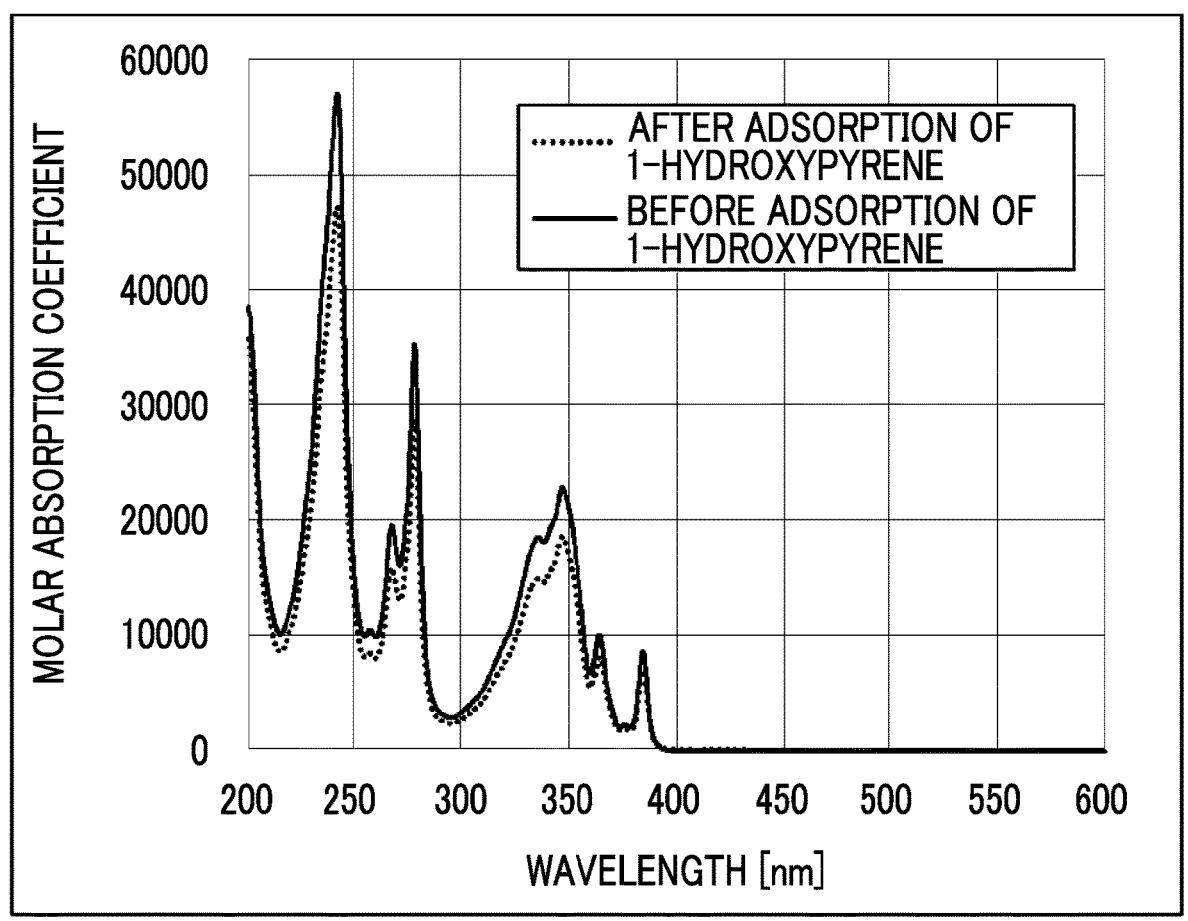
FIG. 6 shows ultraviolet•visible absorption spectra of a 1-hydroxypyrene-containing solution before and after the addition of boron nitride.
Figure 7:
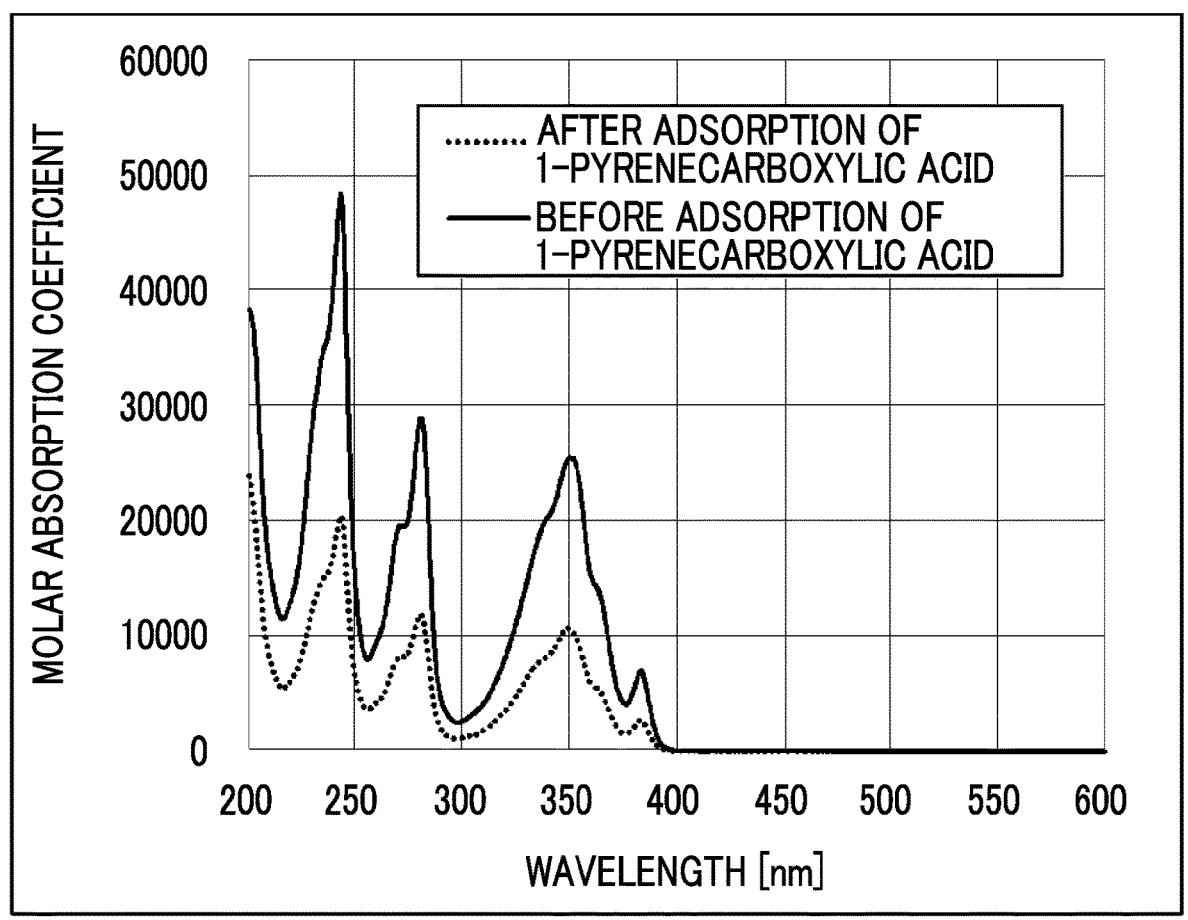
FIG. 7 shows ultraviolet•visible absorption spectra of a 1-pyrenecarboxylic acid-containing solution before and after the addition of boron nitride.
Figure 8:
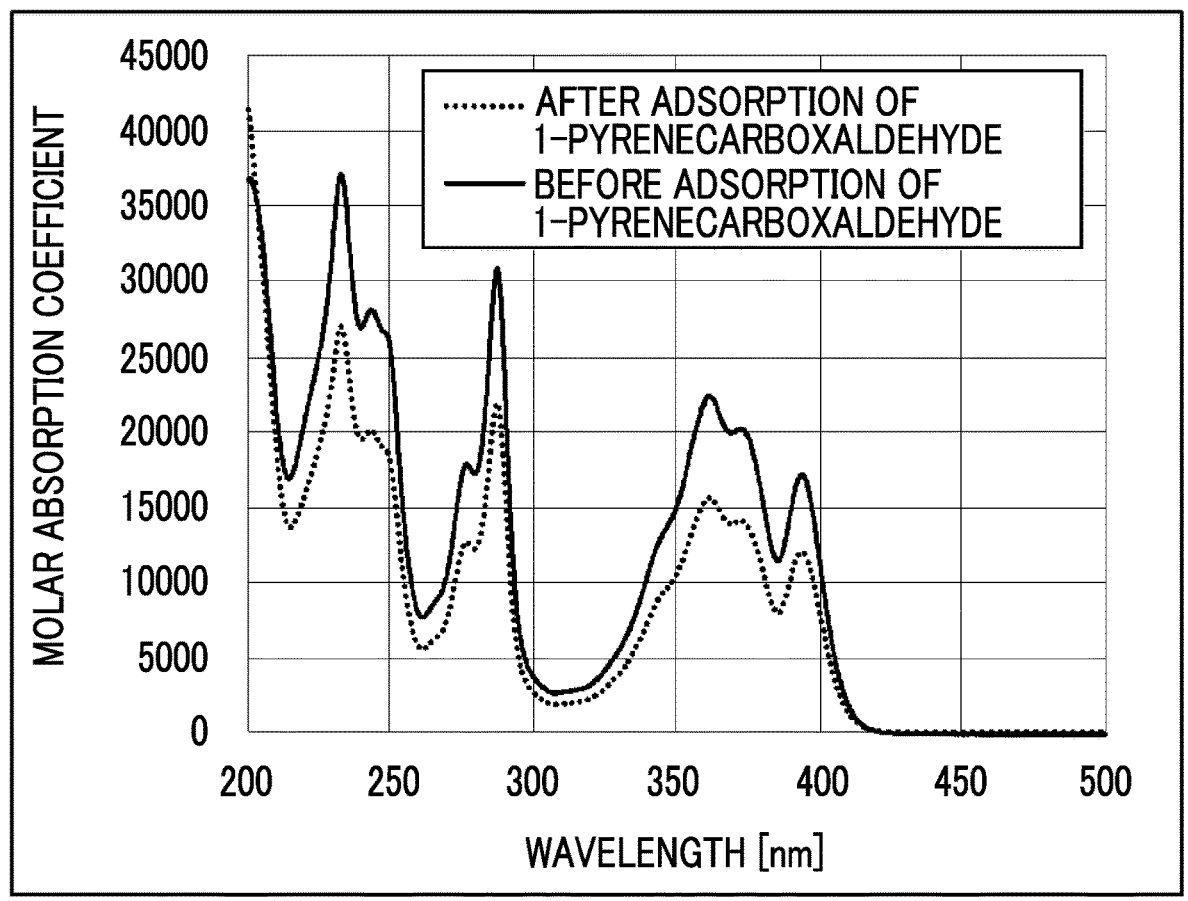
FIG. 8 shows ultraviolet•visible absorption spectra of a 1-pyrenecarboxaldehyde-containing solution before and after the addition of boron nitride.

Hereinafter, a surface-modified inorganic nitride, a composition, a thermally conductive material, and a device with a thermally conductive layer according to an embodiment of the present invention will be specifically described.

The following constituent elements may be described based on the representative embodiments of the present invention, but the present invention is not limited to the embodiments.

In the present specification, the numerical range expressed using "to" means a range including the numerical values listed before and after "to" as a lower limit and an upper limit.

In the present specification, the description of "(meth) acryloyl group" means "either or both of an acryloyl group and a methacryloyl group".

In the present specification, an oxiranyl group is a functional group which is also referred to as an epoxy group. For example, a group, in which two adjacent carbon atoms of a saturated hydrocarbon ring group are bonded to each other through an oxo group (—O—) such that an oxirane ring is formed, and the like are also included in the oxiranyl group.

In the present specification, an acid anhydride group may be a monovalent group or a divalent group. In a case where the acid anhydride group represents a monovalent group, an example thereof includes a substituent obtained by removing any hydrogen atom from an acid anhydride such as maleic acid anhydride, phthalic acid anhydride, pyromellitic acid anhydride, or trimellitic acid anhydride. Furthermore, in a case where the acid anhydride group represents a divalent group, the divalent group means a group represented by *—CO—O—CO—* (* represents a bonding position).

In the present specification, a "surface-modified inorganic nitride" means an inorganic nitride whose surface is modified with a specific compound which will be described later.

In the present specification, "surface-modified" means a state where a specific compound which will be described later is adsorbed onto at least a portion of the surface of an inorganic nitride. The way the specific compound is adsorbed is not particularly limited, but it is preferable that the specific compound is in a bonded state. "Surface-modified" also includes a state where an organic group (for example, a cationic group) obtained by desorption of a portion of a specific compound forms a bond with a surface of an inorganic nitride. The bond may be any one of a covalent bond, a coordinate bond, an ionic bond, a hydrogen bond, a van der Waals bond, or a metallic bond. In the "surface-modified" state, a monolayer may be formed on at least a portion of the surface of the inorganic nitride.

In the present specification, only a portion of the surface of the inorganic nitride may be modified, or the entire surface of the inorganic nitride may be modified.

In the present specification, in a case where the description of "may have a substituent" appears, the type of a substituent, the position of a substituent, and the number of substituents are not particularly limited. The number of substituents may be, for example, 1, 2, 3, or more. Examples of the substituent include a group of monovalent nonmetallic atoms excluding a hydrogen atom, and the substituent can be selected from the following substituent group T, for example.

Substituent group T: a halogen atom (—F, —Br, —Cl, or —I), a hydroxyl group, an alkoxy group, an aryloxy group, a thiol group, an alkylthio group, an arylthio group, an alkyldithio group, an aryldithio group, an amino group, a N-alkylamino group, a N,N-dialkylamino group, a N-arylamino group, a N,N-diarylamino group, a N-alkyl-N-arylamino group, an acyloxy group, a carbamoyloxy group, a N-alkylcarbamoyloxy group, a N-arylcarbamoyloxy group, a N,N-dialkylcarbamoyloxy group, a N,N-diarylcarbamoyloxy group, a N-alkyl-N-arylcarbamoyloxy group, an alkylsulfoxy group, an arylsulfoxy group, an acylthio group, an acylamino group, a N-alkylacylamino group, a N-arylacylamino group, a ureide group, a N'-alkylureide group, a N',N'-dialkylureide group, a N'-arylureide group, a N',N'-diarylureide group, a N'-alkyl-N'-arylureide group, a N-alkylureide group, a N-arylureide group, a N'-alkyl-N-alkylureide group, a N'-alkyl-N-arylureide group, a N',N'-dialkyl-N-alkylureide group, a N',N'-dialkyl-N-arylureide group, a N'-aryl-N-alkylureide group, a N'-aryl-N-arylureide group, a N',N'-diaryl-N-alkylureide group, a N',N'-diaryl-N-arylureide group, a N'-alkyl-N'-aryl-N-alkylureide group, a N'-alkyl-N'-aryl-N-arylureide group, an alkoxycarbonylamino group, an aryloxycarbonylamino group, a N-alkyl-N-alkoxycarbonylamino group, a N-alkyl-N-aryloxycarbonylamino group, a N-aryl-N-alkoxycarbonylamino group, a N-aryl-N-aryloxycarbonylamino group, a formyl group, an acyl group, a carboxy group and a conjugated base group thereof, an alkoxycarbonyl group, an aryloxycarbonyl group, a carbamoyl group, a N-alkylcarbamoyl group, a N,N-dialkylcarbamoyl group, a N-arylcarbamoyl group, a N,N-diarylcarbamoyl group, a N-alkyl-N-arylcarbamoyl group, an alkylsufinyl group, an arylsulfinyl group, an alkylsulfonyl group, an arylsulfonyl group, a sulfo group (—SO$_3$H) and a conjugated base group thereof, an alkoxysulfonyl group, an aryloxysulfonyl group, a sulfinamoyl group, a N-alkylsulfinamoyl group, a N,N-dialkylsulfinamoyl group, a N-arylsulfinamoyl group, a N,N-diarylsulfinamoyl group, a N-alkyl-N-arylsulfinamoyl group, a sulfamoyl group, a N-alkylsulfamoyl group, a N,N-dialkylsulfamoyl group, a N-arylsulfamoyl group, a N,N-diarylsulfamoyl group, a N-alkyl-N-arylsulfamoyl group, a N-acylsulfamoyl group and a conjugated base group thereof, a N-alkylsulfonylsulfamoyl group (—SO$_2$NHSO$_2$(alkyl)) and a conjugated base group thereof, a N-arylsulfonylsulfamoyl group (—SO$_2$NHSO$_2$(aryl)) and a conjugated base group thereof, a N-alkylsulfonylcarbamoyl group (—CONHSO$_2$(alkyl)) and a conjugated base group thereof, a N-arylsulfonylcarbamoyl group (—CONHSO$_2$(aryl)) and a conjugated base group thereof, an alkoxysilyl group (—Si(Oalkyl)$_3$), an aryloxysilyl group (—Si(Oaryl)$_3$), a hydroxysilyl group (—Si(OH)$_3$) and a conjugated base group thereof, a phosphono group (—PO$_3$H$_2$) and a conjugated base group thereof, a dialkylphosphono group (—PO$_3$(alkyl)$_2$), a diarylphosphono group (—PO$_3$(aryl)$_2$), an alkylarylphosphono group (—PO$_3$(alkyl)(aryl)), a monoalkylphosphono group (—PO$_3$H(alkyl)) and a conjugated base group thereof, a monoarylphosphono group (—PO$_3$H(aryl)) and a conjugated base group thereof, a phosphonooxy group (—OPO$_3$H$_2$) and a conjugated base group thereof, a dialkylphosphonooxy group (—OPO$_3$(alkyl)$_2$), a diarylphosphonooxy group (—OPO$_3$(aryl)$_2$), an alkylarylphosphonooxy group (—OPO$_3$(alkyl)(aryl)), a monoalkylphosphonooxy group (—OPO$_3$H(alkyl)) and a conjugated base group thereof, a monoarylphosphonooxy group (—OPO$_3$H(aryl)) and a conjugated base group thereof, a cyano group, a nitro group, an aryl group, an alkyl group, a heterocyclic group, an oxiranyl group, an alkenyl group, and an alkynyl group.

These substituents may form a ring by being bonded to each other, if possible, or by being bonded to a group substituted with the substituent.

[Surface-Modified Inorganic Nitride]

The surface-modified inorganic nitride according to the embodiment of the present invention includes an inorganic nitride and a specific compound, which will be described later, adsorbed onto a surface of the inorganic nitride. In other words, the surface-modified inorganic nitride according to the embodiment of the present invention is a surface-modified inorganic nitride obtained by modifying a surface of an inorganic nitride with a specific compound which will be described later.

In the surface-modified inorganic nitride according to the embodiment of the present invention, a specific compound which will be described later is used as a surface modifier for the inorganic nitride. In a case where the specific compound is adsorbed onto the surface of the inorganic nitride, the dispersibility of the obtained surface-modified inorganic nitride is improved. In particular, in a case where the specific compound is a compound represented by General Formula (1) which will be described later (preferably, compound represented by General Formula (2) which will be described later), the dispersibility is further improved.

As a result, it is estimated that surface-modified inorganic nitrides are present in a well-dispersed state without being unevenly distributed in a material containing the surface-modified inorganic nitrides, and thus the thermally conductive properties of the material are excellent. In particular, it is considered that in a case where the specific compound has a polymerizable group, in a cured substance obtained from a composition containing the surface-modified inorganic nitride and the polymerizable monomer, a conductive path between the surface-modified inorganic nitrides is easily formed through the monomer, and thus the thermally conductive properties are further improved.

Furthermore, in a case where the specific compound has a specific fused-ring structure in a molecule, the obtained surface-modified inorganic nitride is considered to also have a function of aligning a polymerizable monomer. As a result, in particular, in a case where the polymerizable monomer or a cured substance thereof exhibits liquid crystallinity, the polymerizable monomers or cured substances thereof are aligned (vertical alignment) on the surface of the surface-modified inorganic nitride, and the aligned liquid crystal components are interposed between the surface-modified inorganic nitrides. Accordingly, the thermally conductive properties between the surface-modified inorganic nitrides are further improved, and as a result, it is estimated that the overall thermally conductive properties of the material are further improved.

Hereinafter, the components contained in the surface-modified inorganic nitride will be specifically described, and then a method for producing the surface-modified inorganic nitride, the use of the surface-modified inorganic nitride, and the like will be specifically described.

<Inorganic Nitride>

The type of the inorganic nitride is not particularly limited.

Examples of the inorganic nitride include boron nitride (BN), carbon nitride ($C_3N_4$), silicon nitride ($Si_3N_4$), gallium nitride (GaN), indium nitride (InN), aluminum nitride (AlN), chromium nitride ($Cr_2N$), copper nitride ($Cu_3N$), iron nitride ($Fe_4N$ or $Fe_3N$), lanthanum nitride (LaN), lithium nitride ($Li_3N$), magnesium nitride ($Mg_3N_2$), molybdenum nitride ($Mo_2N$), niobium nitride (NbN), tantalum nitride (TaN), titanium nitride (TiN), tungsten nitride ($W_2N$, $WN_2$, or WN), yttrium nitride (YN), zirconium nitride (ZrN), and the like.

The above inorganic nitrides may be used singly, or a plurality thereof may be used in combination.

In view of further improving the thermally conductive properties of the obtained surface-modified inorganic nitride, it is preferable that the inorganic nitride contains at least one kind of atom selected from the group consisting of a boron atom, an aluminum atom, and a silicon atom. More specifically, the inorganic nitride is more preferably at least one kind of nitride selected from the group consisting of aluminum nitride, boron nitride, and silicon nitride, even more preferably boron nitride or aluminum nitride, and particularly preferably boron nitride.

The shape of the inorganic nitride is not particularly limited, and the inorganic nitride may have a granule shape, a film shape, or a plate shape. In a case where the inorganic nitride has a granule shape, for example, the inorganic nitride may have a rice grain shape, a spherical shape, a cubical shape, a spindle shape, a scale shape, an aggregated shape, or an amorphous shape.

The size of the inorganic nitride is not particularly limited. However, in view of further improving the dispersibility of the surface-modified inorganic nitride, an average particle diameter of the inorganic nitrides is preferably 500 μm or less, more preferably 300 μm or less, and even more preferably 200 μm or less. The lower limit of the size is not particularly limited. However, in view of handleability, the lower limit is preferably 10 nm or greater, and more preferably 100 nm or greater.

As a method for measuring the average particle diameter, 100 inorganic nitrides are randomly selected using an electron microscope, particle diameters (major axes) of the inorganic nitrides are measured, and the arithmetic mean thereof is calculated. In a case where a commercial product is used, the value listed in the catalog may be used.

<Specific Compound>

As described above, the specific compound is a component adsorbed onto the surface of the inorganic nitride. Hereinafter, the specific compound will be described.

The specific compound satisfies the following Conditions 1 and 2.

Condition 1: the specific compound has a functional group (hereinafter, also referred to as a "specific functional group") selected from the following group P of functional groups.

(Group P of Functional Groups)

A functional group selected from the group consisting of a boronic acid group (—$B(OH)_2$), an aldehyde group (—CHO), an isocyanate group (—N=C=O), an isothiocyanate group (—N=C=S), a cyanate group (—O—CN), an acyl azide group, a succinimide group, a sulfonyl chloride group (—$SO_2Cl$), a carboxylic acid chloride group (—COCl), an onium group, a carbonate group (—O—CO—O—), an aryl halide group, a carbodiimide group (—N=C=N—), an acid anhydride group (—CO—O—CO— or a monovalent acid anhydride group such as maleic acid anhydride, phthalic acid anhydride, pyromellitic acid anhydride, or trimellitic acid anhydride), a carboxylic acid group (—COOH), a phosphonic acid group (—$PO(OH)_2$), a phosphinic acid group (—HPO(OH)), a phosphoric acid group (—OP(=O)$(OH)_2$), a phosphoric acid ester group (—OP(=O)$(OR^B)_2$), a sulfonic acid group (—$SO_3H$), a halogenated alkyl group, a nitrile group (—CN), a nitro group (—$NO_2$), an ester group (—CO—O— or —O—CO—), a carbonyl group (—CO—), an imidoester group (—C(=$NR^C$)—O— or —O—C(=$NR^C$)—), an alkoxysilyl group, an acrylic group (—OCOCH$_2$=CH$_2$), a methacrylic group (—OCOCH($CH_3$)=$CH_2$), an oxetanyl group, a vinyl group (—CH=$CH_2$), an alkynyl group (a group obtained by removing one hydrogen atom from alkyne, and examples thereof include an ethynyl group and a prop-2-yn-1-yl group), a maleimide group, a thiol group (—SH), a hydroxyl group (—OH), a halogen atom (a F atom, a Cl atom, a Br atom, and an I atom), and an amino group.

The acyl azide group means a group represented by the following structure. * in the formula represents a bonding position. A counter anion ($Z^-$) of the acyl azide group is not particularly limited, and examples thereof include a halogen ion.

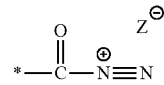

The succinimide group, the oxetanyl group, and the maleimide group each represent a group formed by removing one hydrogen atom at any position from the compound represented by the following formula.

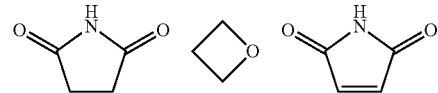

Furthermore, the onium group means a group having an onium salt structure. The onium salt is a compound which is generated in a case where a compound having an electron pair not being involved in chemical bonding forms a coordinate bond with another cationic compound through the electron pair. Generally, the onium salt contains a cation and an anion.

The onium salt structure is not particularly limited, and examples thereof include an ammonium salt structure, a pyridinium salt structure, an imidazolium salt structure, a pyrrolidinium salt structure, a piperidinium salt structure, a triethylenediamine salt structure, a phosphonium salt structure, a sulfonium salt structure, a thiopyrylium salt structure, and the like. Moreover, the type of the anion used as a counter is not particularly limited, and known anions are used. The valence of the anion is not particularly limited.

Examples of the anion include monovalent to trivalent anions, and monovalent and divalent anions are preferable.

As the onium group, a group having an ammonium salt structure represented by General Formula (A1) is particularly preferable.

(A1)

In General Formula (A1), $R^{1A}$ to $R^{3A}$ each independently represent a hydrogen atom or an alkyl group (including all of a linear alkyl group, a branched alkyl group, and a cyclic alkyl group). The number of carbon atoms in the alkyl group is, for example, 1 to 10, preferably 1 to 6, and more preferably 1 to 3. $M^-$ represents an anion. * represents a bonding position. Moreover, the alkyl group may further have a substituent (for example, the substituent group T).

The aryl halide group is not particularly limited as long as one or more halogen atoms are substituted on an aromatic ring group. The aromatic ring group may have any of a monocyclic structure or a polycyclic structure, but is preferably a phenyl group. Furthermore, examples of the halogen atom include a fluorine atom, a chlorine atom, a bromine atom, and an iodine atom, and a fluorine atom is preferable. Moreover, the aryl halide group may further have a substituent (for example, the substituent group T).

Specific examples of the aryl halide group include a fluorophenyl group, a perfluorophenyl group, a chlorophenyl group, a bromophenyl group, an iodophenyl group, and the like.

The phosphoric acid ester group is not particularly limited as long as the phosphoric acid ester group is a group represented by —OP(=O)(OR$^B$)$_2$. Examples of $R^B$ include a hydrogen atom or a monovalent organic group. Here, any one or more of $R^B$'s represent a monovalent organic group. Examples of the monovalent organic group include an alkyl group (including all of a linear alkyl group, a branched alkyl group, and a cyclic alkyl group) and an aryl group. The number of carbon atoms in the alkyl group is, for example, 1 to 10, preferably 1 to 6, and more preferably 1 to 3. Moreover, the alkyl group may further have a substituent (for example, the substituent group T). Furthermore, the aryl group is not particularly limited, and examples thereof include a phenyl group, a pyrenyl group, and the like.

The halogenated alkyl group is not particularly limited, and examples thereof include a group in which one or more halogen atoms are substituted on an alkyl group having 1 to 10 carbon atoms. The number of carbon atoms in the alkyl group (including all of a linear alkyl group, a branched alkyl group, and a cyclic alkyl group) is preferably 1 to 6 and more preferably 1 to 3. Examples of the halogen atom include a fluorine atom, a chlorine atom, a bromine atom, and an iodine atom, and a fluorine atom, a chlorine atom, or a bromine atom is preferable. Moreover, the halogenated alkyl group may further have a substituent (for example, the substituent group T).

The imidoester group is not particularly limited as long as the imidoester group is a group represented by —C(=NR$^C$)—O— or —O—C(=NR$^C$)—. Examples of R$^C$ include a hydrogen atom and an alkyl group (including all of a linear alkyl group, a branched alkyl group, and a cyclic alkyl group). The number of carbon atoms in the alkyl group is, for example, 1 to 10, preferably 1 to 6, and more preferably 1 to 3. Moreover, the alkyl group may further have a substituent (for example, the substituent group T).

Furthermore, the imidoester group may have an onium salt structure by a coordinate bond between an electron pair not being involved in chemical bonding of imine nitrogen and another cation (for example, a hydrogen ion).

The alkoxysilyl group is not particularly limited, and examples thereof include a group represented by General Formula (A2).

General Formula (A2):

In General Formula (A2), $R^D$'s each independently represent an alkyl group (including all of a linear alkyl group, a branched alkyl group, and a cyclic alkyl group). * represents a bonding position.

The alkyl group represented by $R^D$ is, for example, an alkyl group having 1 to 10 carbon atoms, preferably has 1 to 6 carbon atoms, and more preferably has 1 to 3 carbon atoms.

Specific examples thereof include a trimethoxysilyl group, a triethoxysilyl group, and the like.

Moreover, the alkyl group may further have a substituent (for example, the substituent group T).

The amino group is not particularly limited, and may be any of a primary amino group, a secondary amino group, or a tertiary amino group. Specific examples thereof include an amino group represented by —N(R$^E$)$_2$(R$^E$'s each independently represents a hydrogen atom or an alkyl group (including all of a linear alkyl group, a branched alkyl group, and a cyclic alkyl group)). The number of carbon atoms in the alkyl group is, for example, 1 to 10, preferably 1 to 6, and more preferably 1 to 3. Moreover, the alkyl group may further have a substituent (for example, the substituent group T).

The number of the specific functional groups in the specific compound is not particularly limited as long as the number thereof is 1 or more. The upper limit thereof is not particularly limited, but is preferably 15 or smaller. Among them, in view of further improving the dispersibility of the surface-modified inorganic nitride, the number of the specific functional groups is preferably 1 to 8, more preferably 1 to 3, and even more preferably for 2.

Condition 2: the specific compound has a fused-ring structure containing two or more rings selected from the group consisting of an aromatic hydrocarbon ring and an aromatic heterocyclic ring.

The aromatic hydrocarbon ring is not particularly limited, and examples thereof include a monocyclic aromatic hydrocarbon ring having a 5- or higher membered ring. The upper limit of the number of ring members is not particularly limited, but is 10 or smaller in many cases. As the aromatic hydrocarbon ring, a monocyclic aromatic hydrocarbon ring having a 5-membered or 6-membered ring is preferable.

Examples of the aromatic hydrocarbon ring include a cyclopentadienyl ring, a benzene ring, and the like.

The aromatic heterocyclic ring is not particularly limited, and examples thereof include a monocyclic aromatic heterocyclic ring having a 5- or higher membered ring. The upper limit of the number of ring members is not particularly limited, but is 10 or smaller in many cases. As the aromatic heterocyclic ring, a monocyclic aromatic heterocyclic ring having a 5-membered or 6-membered ring is preferable.

Examples of the aromatic heterocyclic ring include a thiophene ring, a thiazole ring, an imidazole ring, a pyridine ring, a pyridazine ring, a pyrimidine ring, a pyrazine ring, and a triazine ring.

The condensed structure is not particularly limited as long as the condensed structure is a fused-ring structure containing two or more rings selected from the group consisting of an aromatic hydrocarbon ring and an aromatic heterocyclic ring. However, in view of superior effects of the present invention, among them, the condensed structure is preferably a fused-ring structure containing two or more aromatic hydrocarbon rings, more preferably a fused-ring structure containing two or more benzene rings, and even more preferably a fused-ring structure containing three or more benzene rings. The upper limit of the number of the aromatic hydrocarbon rings or the aromatic heterocyclic rings contained in the condensed structure is not particularly limited, but is, for example, 10 or smaller in many cases.

Specifically, the fused-ring structure having two or more aromatic hydrocarbon rings is preferably a fused-ring structure having a fused ring selected from the group consisting of biphenylene, indacene, acenaphthylene, fluorene, phenalene, phenanthrene, anthracene, fluoranthene, acephenanthrylene, aceanthrylene, pyrene, chrysene, tetracene, pleiadene, picene, perylene, pentaphene, pentacene, tetraphenylene, hexaphene, and triphenylene, and in view of superior effects of the present invention, among them, is more preferably a condensed structure having a fused ring containing two or more benzene rings, even more preferably a condensed structure having a fused ring containing three or more benzene rings, and particularly preferably a condensed structure having pyrene or perylene.

In view of further improving the dispersibility, the specific compound is preferably a compound represented by General Formula (1) and more preferably a compound represented by General Formula (2).

Hereinafter, the compound represented by General Formula (1) and the compound represented by General Formula (2) will be described, respectively.

(Compound represented by General Formula (1))

$$X{\text{-}}(Y)_n \qquad (1)$$

In General Formula (1), X represents an n-valent organic group which has a fused-ring structure containing two or more rings selected from the group consisting of an aromatic hydrocarbon ring and an aromatic heterocyclic ring.

X represents an n-valent organic group (n is an integer of 1 or greater). n is not particularly limited as long as n is an integer of 1 or greater. The upper limit thereof is not particularly limited, but is preferably an integer of 15 or smaller. Among them, in view of further improving the dispersibility of the surface-modified inorganic nitride, n is preferably 1 to 8, more preferably 1 to 3, and even more preferably 1 or 2.

Examples of the fused-ring structure containing two or more rings selected from the group consisting of the aromatic hydrocarbon ring and the aromatic heterocyclic ring in X include structures described above, and the preferred aspect thereof is also the same as described above.

The n-valent organic group represented by X is not particularly limited as long as the organic group has a fused-ring structure containing two or more rings selected from the group consisting of an aromatic hydrocarbon ring and an aromatic heterocyclic ring. However, in view of superior effects of the present invention, a group formed by extracting n hydrogen atoms from a fused ring containing two or more rings selected from the group consisting of an aromatic hydrocarbon ring and an aromatic heterocyclic ring is preferable.

Moreover, the condensed structure may further have a substituent (for example, the substituent group T) in addition to the specific functional group.

Y represents a monovalent group represented by General Formula (B1), a monovalent group represented by General Formula (B2), or a monovalent group represented by General Formula (B4), or, in a case where n represents an integer of 2 or greater, represents a divalent group represented by General Formula (B3), formed by bonding a plurality of Y's to each other.

In other words, in a case where n is 1, Y represents a monovalent group represented by General Formula (B1), a monovalent group represented by General Formula (B2), or a monovalent group represented by General Formula (B4). In a case where n represents an integer of 2 or greater, Y represents a monovalent group represented by General Formula (B1), a monovalent group represented by General Formula (B2), or a monovalent group represented by General Formula (B4), or represents a divalent group represented by General Formula (B3), formed by bonding a plurality of Y's to each other. Moreover, in a case where n is 2 or greater, the plurality of Y's may be the same as or different from each other.

In a case where Y represents a divalent group represented by General Formula (B3), the compound represented by General Formula (1) is represented by General Formula (3).

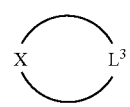

(3)

In General Formula (3), X has the same definition as X in General Formula (1). Furthermore, $L^3$ has the same definition as $L^3$ in General Formula (B3) which will be described later.

$*^1{\text{-}}L^1{\text{-}}P^1$        General Formula (B1):

In General Formula (B1), $L^1$ represents a single bond or a divalent linking group.

The divalent linking group is not particularly limited, and examples thereof include —O—, —S—, —NR$^F$— (R$^F$ represents a hydrogen atom or an alkyl group), a divalent hydrocarbon group (for example, an alkylene group, an alkenylene group (for example, —CH=CH—), an alkynylene group (for example, —C≡C—), and an arylene group), a divalent organic group (a carbonate group (—O—CO—O—), a carbodiimide group (—N=C=N—), an acid anhydride group (—CO—O—CO—), an ester group (—CO—O— or —O—CO—), a carbonyl group (—CO—), an imidoester group (—C(=NR$^C$)—O— or —O—C(=NR$^C$)—)) in the group P of functional groups, and a group obtained by combining these.

Examples of the combined group include -(divalent hydrocarbon group)-X$^{111}$—, —X$^{111}$-(divalent hydrocarbon group)-, -(divalent hydrocarbon group)-X$^{111}$-(divalent hydrocarbon group)-, —X$^{111}$-(divalent hydrocarbon group)-X$^{111}$-(divalent hydrocarbon group)-, -(divalent hydrocarbon group)-X$^{111}$-(divalent hydrocarbon group)-X$^{111}$—, and the like. —X$^{111}$— is —O—, —S—, —NR$^F$—, a divalent organic group in the group P of functional groups, or a group obtained by combining these. The total number of carbon atoms in the combined group is, for example, 1 to 20 and preferably 1 to 12.

$P^1$ represents a monovalent organic group (a boronic acid group ($-B(OH)_2$), an aldehyde group ($-CHO$), an isocyanate group ($-N=C=O$), an isothiocyanate group ($-N=C=S$), a cyanate group ($-O-CN$), an acyl azide group, a succinimide group, a sulfonyl chloride group ($-SO_2Cl$), a carboxylic acid chloride group ($-COCl$), an onium group, an aryl halide group, an acid anhydride group (examples thereof include a monovalent acid anhydride group such as maleic acid anhydride, phthalic acid anhydride, pyromellitic acid anhydride, or trimellitic acid anhydride), a carboxylic acid group ($-COOH$), a phosphonic acid group ($-PO(OH)_2$), a phosphinic acid group ($-HPO(OH)$), a phosphoric acid group ($-OP(=O)(OH)_2$), a phosphoric acid ester group ($-OP(=O)(OR^B)_2$), a sulfonic acid group ($-SO_3H$), a halogenated alkyl group, a nitrile group ($-CN$), a nitro group ($-NO_2$), an alkoxysilyl group, an acrylic group ($-OCOCH_2=CH_2$), a methacrylic group ($-OCOCH(CH_3)=CH_2$), an oxetanyl group, a vinyl group ($-CH=CH_2$), an alkynyl group (a group obtained by removing one hydrogen atom from alkyne, and examples thereof include an ethynyl group and a prop-2-yn-1-yl group), a maleimide group, a thiol group ($-SH$), a hydroxyl group ($-OH$), or a halogen atom (a F atom, a Cl atom, a Br atom, and an I atom)) in the group P of functional groups.

*$^1$ represents a position bonded to X.

*$^2$-$L^2$-$P^2$          General Formula (B2):

In General Formula (B2), $L^2$ represents a divalent linking group containing a divalent organic group (a carbonate group ($-O-CO-O-$), a carbodiimide group ($-N=C=N-$), an acid anhydride group ($-CO-O-CO-$), an ester group ($-CO-O-$ or $-O-CO-$), a carbonyl group ($-CO-$), or an imidoester group ($-C(=NR^C)-O-$ or $-O-C(=NR^C)-$)) in the group P of functional groups.

Examples of $L^2$ include a divalent organic group in the group P of functional groups, and a group obtained by combining a divalent organic group in the group P of functional groups with a linking group selected from the group consisting of $-O-$, $-S-$, $-NR^F-$ ($R^F$ represents a hydrogen atom or an alkyl group), and a divalent hydrocarbon group (for example, an alkylene group, an alkenylene group (for example, $-CH=CH-$), an alkynylene group (for example, $-C\equiv C-$), and an arylene group).

Examples of the combined group include -(divalent hydrocarbon group)-$X^{112}-$ and the like. $-X^{112}-$ is a divalent organic group in the group P of functional groups, or a group obtained by combining a divalent organic group in the group P of functional groups with a divalent group selected from $-O-$, $-S-$, and $-NR^F-$. The total number of carbon atoms in the combined group is, for example, 1 to 20 and preferably 1 to 12.

$P^2$ represents a monovalent organic group. The monovalent organic group represented by $P^2$ is not particularly limited, and examples thereof include an alkyl group. The number of carbon atoms in the alkyl group is, for example, 1 to 10, preferably 1 to 6, and more preferably 1 to 3.

*$^2$ represents a position bonded to X.

*$^{31}$-$L^3$-*$^{32}$          General Formula (B3):

In General Formula (B3), $L^3$ represents a divalent linking group containing a divalent organic group (a carbonate group ($-O-CO-O-$), a carbodiimide group ($-N=C=N-$), an acid anhydride group ($-CO-O-CO-$), an ester group ($-CO-O-$ or $-O-CO-$), a carbonyl group ($-CO-$), or an imidoester group ($-C(=NR^C)-O-$ or $-O-C(=NR^C)-$)) in the group P of functional groups.

Examples of $L^3$ include a divalent organic group in the group P of functional groups, and a group obtained by combining a divalent organic group in the group P of functional groups with a linking group selected from the group consisting of $-O-$, $-S-$, $-NR^F-$ ($R^F$ represents a hydrogen atom or an alkyl group), and a divalent hydrocarbon group (for example, an alkylene group, an alkenylene group (for example, $-CH=CH-$), an alkynylene group (for example, $-C\equiv C-$), and an arylene group).

Examples of the combined group include -(divalent hydrocarbon group)-$X^{113}$-(divalent hydrocarbon group)-, -(divalent hydrocarbon group)-$X^{113}-$, $-X^{113}$-(divalent hydrocarbon group)-, $-X^{113}$-(divalent hydrocarbon group)-$X^{113}-$, and the like. $-X^{113}-$ is a divalent organic group in the group P of functional groups, or a group obtained by combining a divalent organic group in the group P of functional groups with a divalent group selected from $-O-$, $-S-$, and $-NR^F-$. The total number of carbon atoms in the combined group is, for example, 1 to 20 and preferably 1 to 12.

*$^{31}$ and *$^{32}$ represent positions bonded to X. That is, $L^3$ forms a ring together with two different carbon atoms on a fused-ring structure represented by X.

General Formula (B4):

*$^4$-$L^4$-$(P^4)_{m^{11}}$

In General Formula (B4), $L^4$ represents an ($m^{11}$+1)-valent linking group.

$m^{11}$ represents an integer of 2 or greater. The upper limit of $m^{11}$ is not particularly limited, but is, for example, 100 or smaller, preferably 30 or smaller, more preferably 20 or smaller, and even more preferably 15 or smaller. The lower limit of $m^{11}$ is not particularly limited, but is preferably 4 or greater.

The linking group represented by $L^4$ is not particularly limited, and examples thereof include an ($m^{11}$+1)-valent aromatic hydrocarbon ring or a group represented by General Formula (M1).

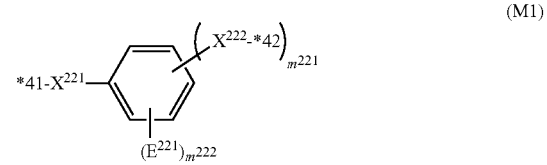

In General Formula (M1), $X^{221}$ and $X^{222}$ each independently represent a single bond or a divalent linking group. The divalent linking group represented by $X^{221}$ or $X^{222}$ has the same definition as the divalent linking group represented by $L'$ in General Formula (B1).

$E^{221}$ represents a substituent. Examples of the substituent represented by $E^{221}$ include the groups exemplified in the substituent group T.

$m^{221}$ represents an integer 2 to 5. $m^{221}$ is particularly preferably 2 or 3.

$m^{222}$ represents an integer 0 to 3.

Here, $m^{221}+m^{222}$ represents an integer 2 to 5.

*$^{41}$ represents a position bonded to X.

*$^{42}$ represents a position bonded to P$^4$.

The group represented by General Formula (M1) is particularly preferably a group represented by General Formula (M2).

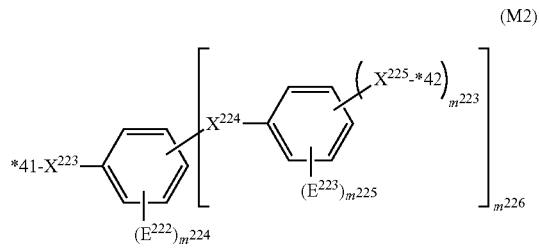

(M2)

In General Formula (M2), $X^{223}$, $X^{224}$, and $X^{225}$ each independently represent a single bond or a divalent linking group. The divalent linking group represented by $X^{223}$, $X^{224}$, or $X^{225}$ has the same definition as the divalent linking group represented by L' in General Formula (B1).

$E^{222}$ and $E^{223}$ each independently represent a substituent. Examples of the substituent represented by $E^{222}$ or $E^{223}$ include the groups exemplified in the substituent group T.

$m^{223}$ represents an integer 1 to 5. $m^{223}$ is particularly preferably 2 or 3.

$m^{224}$ represents an integer 0 to 3.

$m^{225}$ represents an integer 0 to 4.

$m^{226}$ represents an integer 2 to 5. $m^{226}$ is particularly preferably 2 or 3.

Here, $m^{224}+m^{226}$ represents an integer 2 to 5. Furthermore, $m^{223}+m^{225}$ represents an integer 1 to 5.

*$^{41}$ represents a position bonded to X.

*$^{42}$ represents a position bonded to P$^4$.

P$^4$ has the same definition as P$^1$ in General Formula (B1).

*$^4$ represents a position bonded to X.

(Compound represented by General Formula (2))

(2)

In General Formula (2), X" represents an $(n^{11}+n^{12})$-valent organic group which has a fused-ring structure containing two or more rings selected from the group consisting of an aromatic hydrocarbon ring and an aromatic heterocyclic ring.

$X^{11}$ represents an $(n^{11}+n^{12})$-valent organic group ($n^{11}$ and $n^{12}$ are each independently an integer of 1 or greater). $n^{11}$ and $n^{12}$ are not particularly limited as long as $n^{11}$ and $n^{12}$ are each independently an integer of 1 or greater. The upper limit of $n^{11}+n^{12}$ is not particularly limited, but is preferably an integer of 15 or smaller. Among them, in view of further improving the dispersibility of the surface-modified inorganic nitride, $n^{11}+n^{12}$ is preferably 2 to 8, more preferably 2 or 3, and even more preferably 2.

Examples of the fused-ring structure containing two or more rings selected from the group consisting of the aromatic hydrocarbon ring and the aromatic heterocyclic ring in $X^{11}$ include structures described above, and the preferred aspect thereof is also the same as described above.

The $(n^{11}+n^{12})$-valent organic group represented by $X^{11}$ is not particularly limited as long as the organic group has a fused-ring structure containing two or more rings selected from the group consisting of an aromatic hydrocarbon ring and an aromatic heterocyclic ring. However, in view of superior effects of the present invention, a group formed by extracting $(n^{11}+n^{12})$ hydrogen atoms from a fused ring containing two or more rings selected from the group consisting of an aromatic hydrocarbon ring and an aromatic heterocyclic ring is preferable.

Moreover, the condensed structure may further have a substituent (for example, the substituent group T) in addition to $Y^{11}$ and $Y^{12}$.

$Y^{11}$ contains a functional group selected from the following group Q of functional groups. Functional groups exemplified in the following group Q of functional groups correspond particularly to functional groups which tend to have excellent absorptivity to an inorganic nitride, among the functional groups exemplified in the group P of functional groups.

Furthermore, $Y^{12}$ contains a functional group selected from the following group R of functional groups. Functional groups exemplified in the following group R of functional groups correspond particularly to functional groups which have a function of easily promoting radical polymerization and epoxy curing, among the functional groups exemplified in the group P of functional groups.

(Group Q of Functional Groups)

A functional group selected from the group consisting of a boronic acid group (—B(OH)$_2$), an aldehyde group (—CHO), an isocyanate group (—N=C=O), an isothiocyanate group (—N=C=S), a cyanate group (—O—CN), an acyl azide group, a succinimide group, a sulfonyl chloride group (—SO$_2$Cl), a carboxylic acid chloride group (—COCl), an onium group, a carbonate group (—O—CO—O—), an aryl halide group, a carbodiimide group (—N=C=N—), an acid anhydride group (—CO—O—CO— or a monovalent acid anhydride group such as maleic acid anhydride, phthalic acid anhydride, pyromellitic acid anhydride, or trimellitic acid anhydride), a phosphonic acid group (—PO(OH)$_2$), a phosphinic acid group (—HPO (OH)), a phosphoric acid group (—OP(=O)(OH)$_2$), a phosphoric acid ester group (—OP(=O)(OR$^B$)$_2$), a sulfonic acid group (—SO$_3$H), a halogenated alkyl group, a nitrile group (—CN), a nitro group (—NO$_2$), an ester group (—CO—O— or —O—CO—), a carbonyl group (—CO—), an imidoester group (—C(=NR$^C$)—O— or —O—C(=NR$^C$)—), and a halogen atom (a F atom, a Cl atom, a Br atom, and an I atom).

(Group R of Functional Groups)

A functional group selected from the group consisting of a carboxylic acid group (—COOH), an alkoxysilyl group, an acrylic group (—OCOCH$_2$=CH$_2$), a methacrylic group (—OCOCH(CH$_3$)=CH$_2$), an oxetanyl group, a vinyl group (—CH=CH$_2$), an alkynyl group (a group obtained by removing one hydrogen atom from alkyne, and examples thereof include an ethynyl group and a prop-2-yn-1-yl group), a maleimide group, a thiol group (—SH), a hydroxyl group (—OH), and an amino group.

In General Formula (2), specifically, $Y^{11}$ represents a monovalent group represented by General Formula (C1) or a monovalent group represented by General Formula (C2), or, in a case where $n^{11}$ represents an integer of 2 or greater, represents a divalent group represented by General Formula (C3), formed by bonding a plurality of $Y^{11}$'s to each other.

In other words, in a case where $n^{11}$ is 1, $Y^{11}$ represents a monovalent group represented by General Formula (C1) or a monovalent group represented by General Formula (C2). In a case where $n^{11}$ represents an integer of 2 or greater, $Y^{11}$ represents a monovalent group represented by General Formula (C1) or a monovalent group represented by General Formula (C2), or represents a divalent group represented by General Formula (C3), formed by bonding a plurality of $Y^{11}$'s to each other. In a case where $n^{11}$ is 2 or greater, the plurality of $Y^{11}$'s may be the same as or different from each other.

Furthermore, in a case where $Y^{11}$ represents a divalent group represented by General Formula (C3), the compound represented by General Formula (2) is represented by General Formula (4).

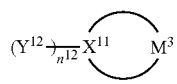
(4)

In General Formula (4), each of $X^{11}$, $Y^{12}$, and $n^{12}$ has the same definition as each of $X^{11}$, $Y^{12}$, and $n^{12}$ in General Formula (2). Moreover, $M^3$ has the same definition as $M^3$ in General Formula (C3) which will be described later.

$*^1$-$M^1$-$Q^1$     General Formula (C1):

In General Formula (C1), $M^1$ represents a single bond or a divalent linking group. The divalent linking group represented by $M^1$ has the same definition as $L^1$, and the preferred aspect thereof is also the same as that of $L^1$.

$Q^1$ represents a monovalent organic group (a boronic acid group (—B(OH)$_2$), an aldehyde group (—CHO), an isocyanate group (—N=C=O), an isothiocyanate group (—N=C=S), a cyanate group (—O—CN), an acyl azide group, a succinimide group, a sulfonyl chloride group (—SO$_2$Cl), a carboxylic acid chloride group (—COCl), an onium group, an aryl halide group, an acid anhydride group (a monovalent acid anhydride group such as maleic acid anhydride, phthalic acid anhydride, pyromellitic acid anhydride, or trimellitic acid anhydride), a phosphonic acid group (—PO(OH)$_2$), a phosphinic acid group (—HPO(OH)), a phosphoric acid group (—OP(=O)(OH)$_2$), a phosphoric acid ester group (—OP(=O)(OR$^B$)$_2$), a sulfonic acid group (—SO$_3$H), a halogenated alkyl group, a nitrile group (—CN), a nitro group (—NO$_2$), and a halogen atom (a F atom, a Cl atom, a Br atom, and an I atom)) in the group Q of functional groups. $*^1$ represents a position bonded to X.

$*^2$-$M^2$-$Q^2$     General Formula (C2):

In General Formula (C2), $M^2$ has the same definition as $L^2$, and the preferred aspect thereof is also the same as that of $L^2$. $Q^2$ represents a monovalent organic group. The monovalent linking group represented by $Q^2$ has the same definition as $P^2$, and the preferred aspect thereof is also the same as that of $P^2$. $*^2$ represents a position bonded to $X^{11}$.

$*^{31}$-$M^3$-$*^{32}$     General Formula (C3):

In General Formula (C3), $M^3$ has the same definition as $L^3$, and the preferred aspect thereof is also the same as that of $L^3$. $*^{31}$ and $*^{32}$ represent positions bonded to $X^{11}$. That is, $M^3$ forms a ring together with two different carbon atoms on a fused-ring structure represented by $X^{11}$.

$Y^{12}$ represents a monovalent group represented by General Formula (D1) or a monovalent group represented by General Formula (D2).

$*^1$—$W^1$—$R^1$     General Formula (D1):

In General Formula (D1), W represents a single bond or a divalent linking group. $R^1$ represents a carboxylic acid group, an alkoxysilyl group, an acrylic group, a methacrylic group, an oxetanyl group, a vinyl group, an alkynyl group, a maleimide group, a thiol group, a hydroxyl group, or an amino group. $*^1$ represents a position bonded to $X^{11}$. Moreover, $R^1$ represents a functional group exemplified in the group R of functional groups.

The divalent linking group represented by $W^1$ has the same definition as L', and the preferred aspect thereof is also the same as that of L'.

$*^1$ represents a position bonded to $X^{11}$.

General Formula (D2):

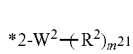

In General Formula (D2), $W^2$ represents an $(m^{21}+1)$-valent linking group.

$m^{21}$ represents an integer of 2 or greater. The upper limit of $m^{21}$ is not particularly limited, but is, for example, 100 or smaller, preferably 30 or smaller, more preferably 20 or smaller, and even more preferably 15 or smaller. The lower limit of $m^{21}$ is not particularly limited, but is preferably 4 or greater.

$R^2$ represents a carboxylic acid group, an alkoxysilyl group, an acrylic group, a methacrylic group, an oxetanyl group, a vinyl group, an alkynyl group, a maleimide group, a thiol group, a hydroxyl group, or an amino group. Moreover, $R^2$ represents a functional group exemplified in the group R of functional groups.

The $(m^{21}+1)$-valent linking group represented by $W^2$ has the same definition as $L^4$, and the preferred aspect thereof is also the same as that of $L^4$.

$*^2$ represents a position bonded to $X^{11}$.

The molecular weight of the specific compound is, for example, 150 or greater, and in view of further improving the dispersibility of the surface-modified inorganic nitride, is preferably 200 or greater. In view of solubility, the molecular weight thereof is preferably 2,000 or less and more preferably 1,000 or less.

Hereinafter, the specific examples of the specific compound are shown, but the present invention is not limited to the examples. Moreover, in the following examples, "Et" represents an ethyl group.

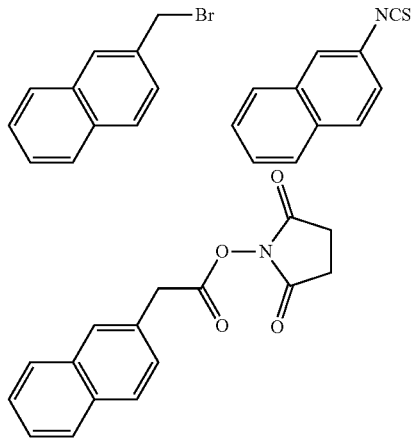

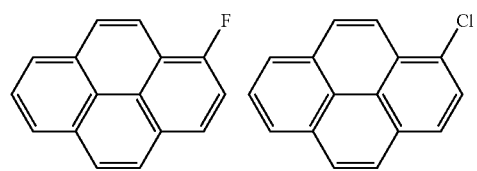
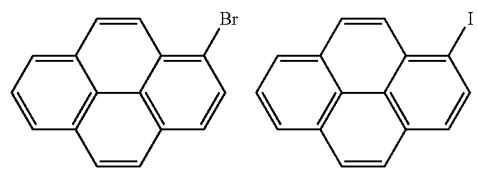
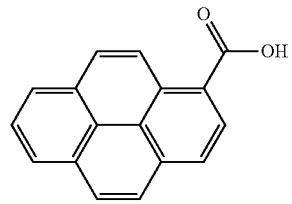
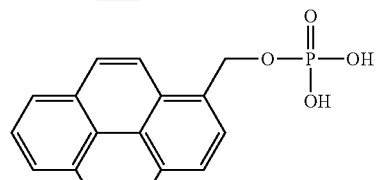
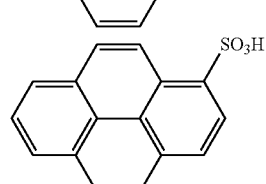
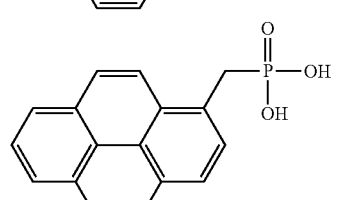
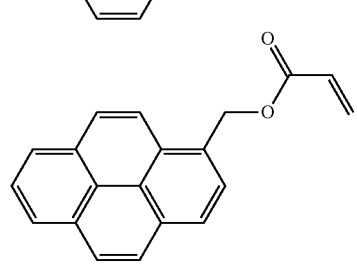
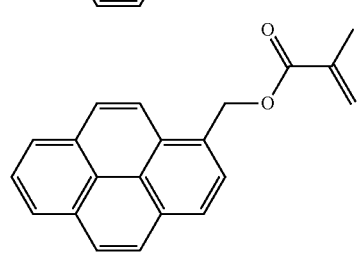
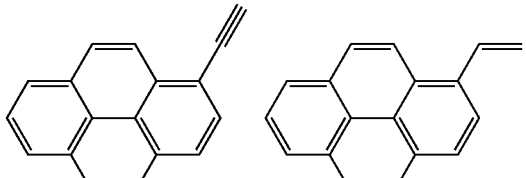
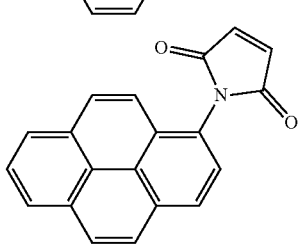
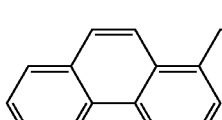
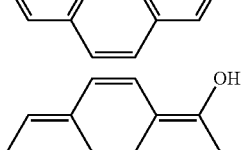
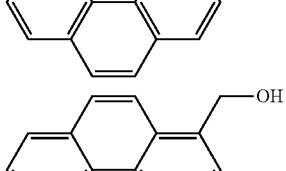
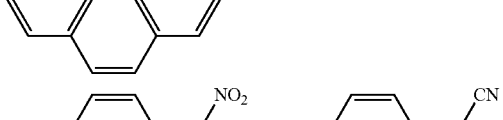
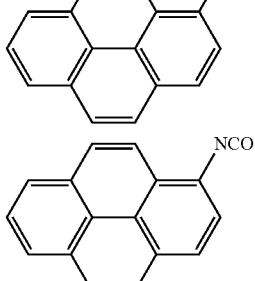
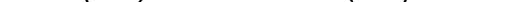
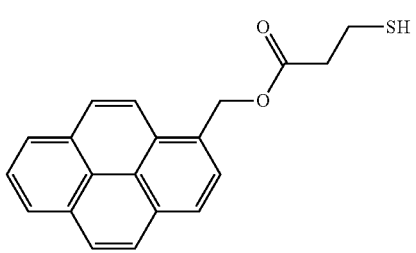

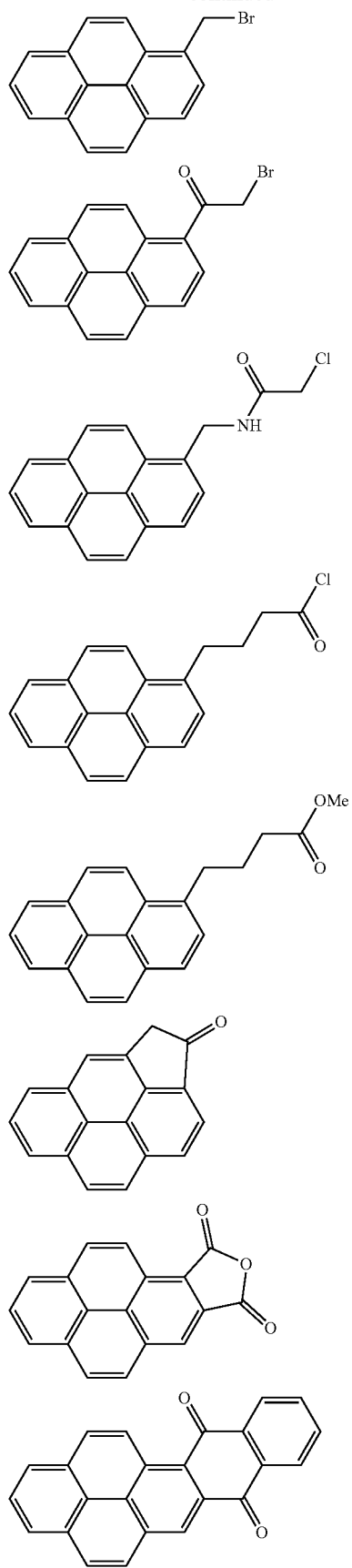
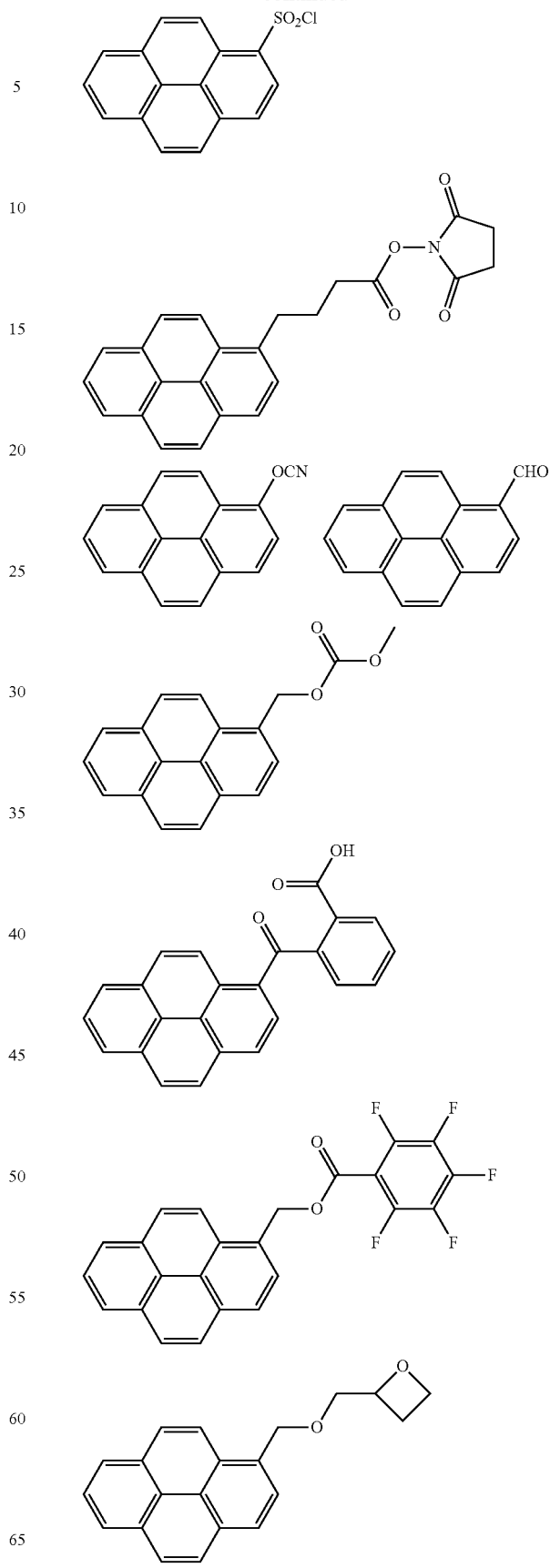

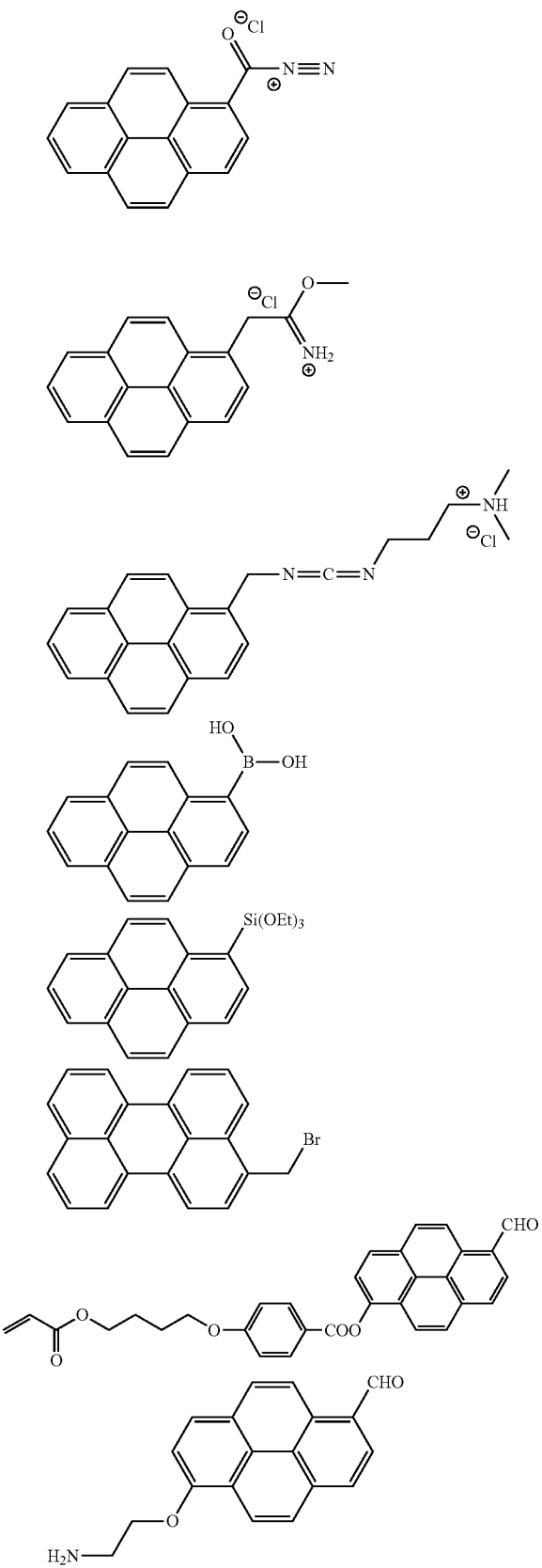
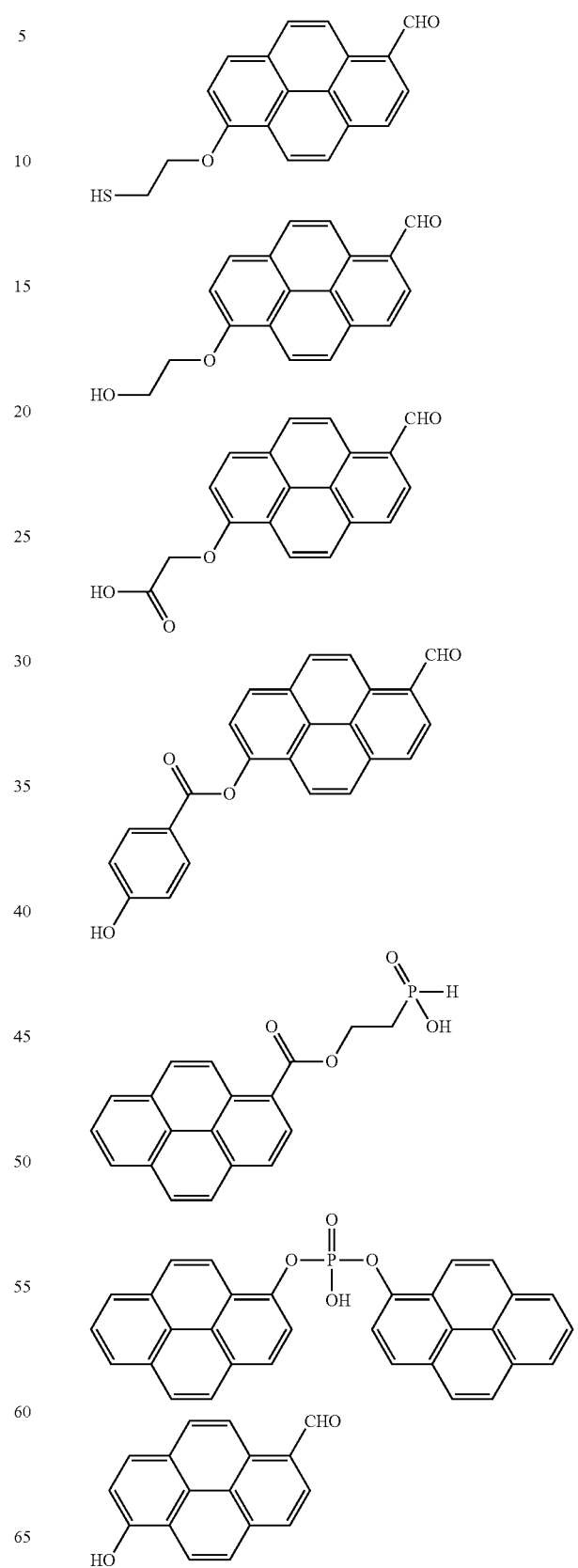

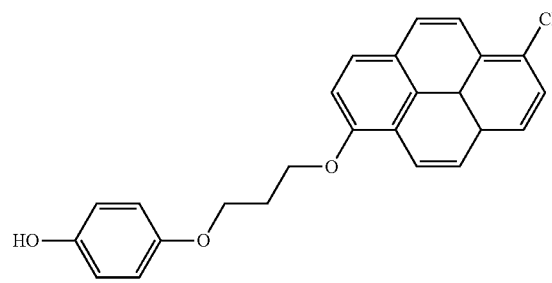

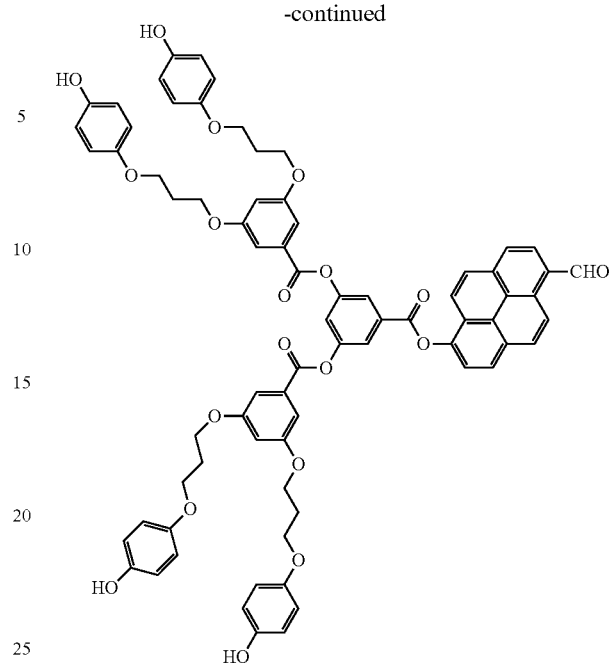

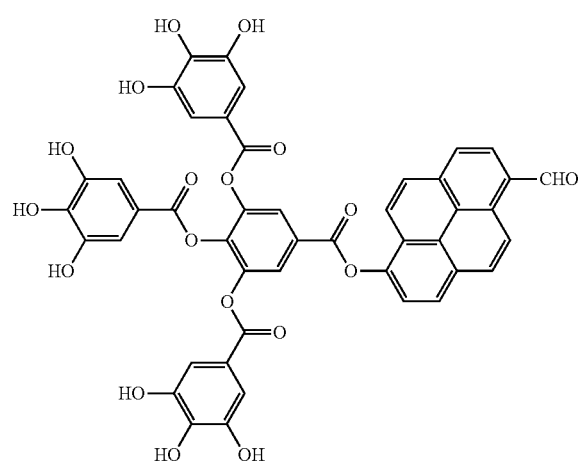

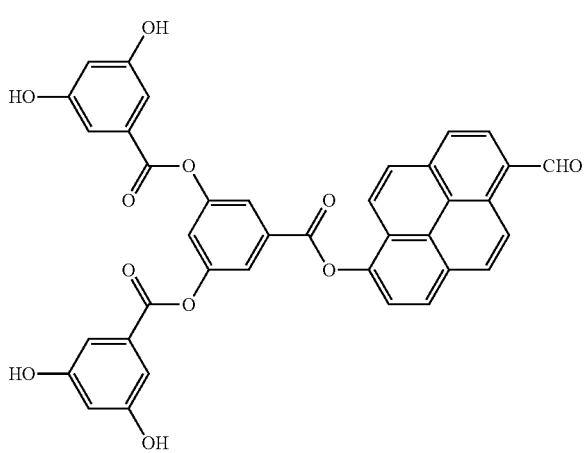

<Method for Producing Surface-Modified Inorganic Nitride>

The method for producing the surface-modified inorganic nitride is not particularly limited, and examples thereof include a method including a step of bringing an inorganic nitride into contact with a specific compound.

The inorganic nitride and the specific compound are brought into contact with each other, for example, by stirring a solution containing the inorganic nitride and the specific compound.

The type of a solvent of the solution is not particularly limited, but an organic solvent is preferable. Examples of the organic solvent include ethyl acetate, methyl ethyl ketone, dichloromethane, and tetrahydrofuran.

The solution may contain other components such as the polymerizable monomer which will be described later. In this case, the obtained mixture can also be used as the composition which will be described later.

The mixing ratio between the inorganic nitride and the specific compound may be determined in consideration of the structure and surface area of the inorganic nitride and the molecular structure of the molecule of the specific compound such as an aspect ratio.

The stirring conditions (a rotation speed for stirring and a temperature condition) are not particularly limited.

<Surface-Modified Inorganic Nitride>

In the surface-modified inorganic nitride, the specific compound modifies the surface of the inorganic nitride. It is preferable that the specific compound modifies the surface of the inorganic nitride by forming a bond such as a hydrogen bond with the inorganic nitride.

The shape of the surface-modified inorganic nitride is not particularly limited, and the surface-modified inorganic nitride may have a granule shape, a film shape, or a plate shape.

In the surface-modified inorganic nitride, a mass ratio between the specific compound and the inorganic nitride (mass of specific compound/mass of inorganic nitride) is not particularly limited. However, in view of further improving the dispersibility of the surface-modified inorganic nitride, the mass ratio is preferably 0.0001 to 0.5 and more preferably 0.0005 to 0.1.

In the surface-modified inorganic nitride, the specific compound may be adsorbed onto the surface of the inorganic nitride, or another surface modifier may be adsorbed onto the surface of the inorganic nitride. That is, the surface-modified inorganic nitride may contain the inorganic nitride and the specific compound and another surface modifier which are adsorbed onto the surface of the inorganic nitride.

[Composition]

The surface-modified inorganic nitride exhibits improved dispersibility in various materials. By exploiting these characteristics, the surface-modified inorganic nitride can be used as a composition for various uses by being mixed with other materials.

The content of the surface-modified inorganic nitride in the composition is not particularly limited, and according to the use of the composition, optimal content is appropriately selected. Particularly, in view of allowing the characteristics of the surface-modified inorganic nitride to be more markedly exhibited, the content of the surface-modified inorganic nitride with respect to the total solid content in the composition is preferably 20% to 95% by mass, more preferably 30% to 95% by mass, and even more preferably 40% to 85% by mass.

The composition may contain one kind of surface-modified inorganic nitride or two or more kinds of surface-modified inorganic nitrides.

As described above, the composition may contain materials other than the surface-modified inorganic nitride. Examples of the materials include a polymerizable monomer, a curing agent, a curing accelerator, a polymerization initiator, and the like.

Hereinafter, various components will be specifically described.

<Polymerizable Monomer>

The polymerizable monomer is a compound cured by a predetermined treatment using heat, light, or the like.

The polymerizable monomer has a polymerizable group.

The type of the polymerizable group is not particularly limited, and examples thereof include known polymerizable groups. In view of reactivity, a functional group capable of an addition polymerization reaction is preferable and a polymerizable ethylenic unsaturated group or a ring-opening polymerizable group is more preferable. Examples of the polymerizable group include an acryloyl group, a methacryloyl group, an oxiranyl group, a vinyl group, a maleimide group, a styryl group, an allyl group, an oxetanyl group, and the like. A hydrogen atom in each group may be substituted with another substituent such as a halogen atom. Particularly, in view of reactivity, the polymerizable group is preferably a group selected from the group consisting of an acryloyl group, a methacryloyl group, an oxiranyl group, and a vinyl group.

Furthermore, the number of polymerizable groups contained in the polymerizable monomer is not particularly limited. However, in view of further improving the heat resistance of a cured substance obtained by curing the composition, the number of polymerizable groups is preferably 2 or more and more preferably 3 or more. The upper limit thereof is not particularly limited, but is 8 or smaller in many cases.

The type of the polymerizable monomer is not particularly limited, and known polymerizable monomers can be used. Examples of the polymerizable monomer include the epoxy resin monomer and the acrylic resin monomer described in paragraph "0028" in JP4118691B, the epoxy compound described in paragraphs "0006" to "0011" in JP2008-013759A, the epoxy resin mixture described in paragraphs "0032" to "0100" in JP2013-227451A, and the like.

Furthermore, a bisphenol A diglycidyl ether monomer, a bisphenol F diglycidyl ether monomer, and the like can also be used.

The content of the polymerizable monomer in the composition is not particularly limited, and according to the use of the composition, optimal content is appropriately selected. Particularly, the content of the polymerizable monomer with respect to the total solid content in the composition is preferably 10% to 90% by mass, more preferably 15% to 70% by mass, and even more preferably 20% to 60% by mass.

The composition may contain one kind of polymerizable monomer or two or more kinds of polymerizable monomers.

It is preferable that the polymerizable monomer exhibits liquid crystallinity. That is, the polymerizable monomer is preferably a liquid crystal compound. In other words, the polymerizable monomer is preferably a liquid crystal compound having a polymerizable group.

Furthermore, it is also preferable that a cured substance of the polymerizable monomer exhibits liquid crystallinity. The cured substance of the polymerizable monomer means a cured substance obtained by curing the polymerizable monomer, and does not contain the aforementioned surface-modified inorganic nitride. If necessary, for obtaining the cured substance, the curing agent which will be described later may be used.

As described above, it is preferable that the polymerizable monomer or a cured substance thereof exhibits liquid crystallinity. That is, the polymerizable monomer or a cured substance thereof is preferably a liquid crystal component.

The polymerizable monomer may be any of a rod-like liquid crystal compound or a disk-like liquid crystal compound. That is, the polymerizable monomer may be any of a rod-like liquid crystal compound having a polymerizable group or a disk-like liquid crystal compound having a polymerizable group.

Hereinafter, the rod-like liquid crystal compound and the disk-like liquid crystal compound will be specifically described.

(Rod-Like Liquid Crystal Compound)

Examples of the rod-like liquid crystal compound include azomethines, azoxies, cyanobiphenyls, cyanophenyl esters, benzoic acid esters, cyclohexane carboxylic acid phenyl esters, cyanophenyl cyclohexanes, cyano-substituted phenylpyrimidines, alkoxy-substituted phenylpyrimidines, phenyldioxanes, tolans, and alkenylcyclohexyl benzonitriles. In addition to these low-molecular-weight liquid crystal compounds described above, high-molecular-weight liquid crystal compounds can also be used. The aforementioned high-molecular-weight liquid crystal compounds are polymer compounds obtained by polymerizing rod-like liquid crystal compounds having a low-molecular-weight reactive group.

Examples of preferable rod-like liquid crystal compounds include a rod-like liquid crystal compound represented by General Formula (XXI).

$Q^1\text{-}L^{111}\text{-}A^{111}\text{-}L^{113}\text{-}M\text{-}L^{114}\text{-}A^{112}\text{-}L^{112}\text{-}Q^2$   General Formula (XXI):

In the formula, $Q^1$ and $Q^2$ are each independently a polymerizable group, and $L^{111}$, $L^{112}$, $L^{113}$, and $L^{114}$ each independently represent a single bond or a divalent linking group. $A^{111}$ and $A^{112}$ each independently represent a divalent linking group (spacer group) having 1 to 20 carbon atoms. M represents a mesogenic group.

The definition of the polymerizable group is as described above.

As the divalent linking group represented by $L^{111}$, $L^{112}$, $L^{113}$, or $L^{114}$, a divalent linking group selected from the group consisting of —O—, —S—, —CO—, —$NR^{112}$—, —CO—O—, —O—CO—O—, —CO—$NR^{112}$—, —$NR^{112}$—CO—, —O—CO—, —$CH_2$—O—, —O—$CH_2$—, —O—CO—$NR^{112}$—, —$NR^{112}$—CO—O—, and —$NR^{112}$—CO—$NR^{112}$— is preferable. $R^{112}$ is an alkyl group having 1 to 7 carbon atoms or a hydrogen atom.

$A^{111}$ and $A^{112}$ each represent a divalent linking group having 1 to 20 carbon atoms. Particularly, $A^{111}$ and $A^{112}$ preferably each represent an alkylene group having 1 to 12 carbon atoms, an alkenylene group having 1 to 12 carbon atoms, or an alkynylene group having 1 to 12 carbon atoms, and more preferably each represent an alkylene group having 1 to 12 carbon atoms.

The divalent linking group is preferably linear and may contain oxygen atoms or sulfur atoms that are not adjacent to each other. Furthermore, the divalent linking group may have a substituent, and examples of the substituent include a halogen atom (a fluorine atom, a chlorine atom, or a bromine atom), a cyano group, a methyl group, and an ethyl group.

Examples of the mesogenic group represented by M include known mesogenic groups. Particularly, a group represented by General Formula (XXII) is preferable.

$$-(W^1-L^{115})_n-W^2- \qquad \text{General Formula (XXII):}$$

In the formula, $W^1$ and $W^2$ each independently represent a divalent cyclic alkylene group, a divalent cyclic alkenylene group, an arylene group, or a divalent heterocyclic group. $L^{115}$ represents a single bond or a divalent linking group. n represents 1, 2, or 3.

Examples of $W^1$ and $W^2$ include 1,4-cyclohexanediyl, 1,4-cyclohexanediyl, 1,4-phenylene, pyrimidine-2,5-diyl, pyridine-2,5-diyl, 1,3,4-thiadiazole-2,5-diyl, 1,3,4-oxadiazole-2,5-diyl, naphthalene-2,6-diyl, naphthalene-1,5-diyl, thiophene-2,5-diyl, and pyridazine-3,6-diyl. In a case where $W^1$ and $W^2$ each represent 1,4-cyclohexanediyl, the compound may be any of constitutional isomers of a trans-isomer and a cis-isomer, or a mixture in which the isomers are mixed at any ratio. Among them, a trans-isomer is preferable.

Each of $W^1$ and $W^2$ may have a substituent. Examples of the substituent include the groups exemplified in the substituent group T. More specifically, examples of the substituent include a halogen atom (a fluorine atom, a chlorine atom, a bromine atom, and an iodine atom), a cyano group, an alkyl group having 1 to 10 carbon atoms (for example, a methyl group, an ethyl group, a propyl group, and the like), an alkoxy group having 1 to 10 carbon atoms (for example, a methoxy group, an ethoxy group, and the like), an acyl group having 1 to 10 carbon atoms (for example, a formyl group, an acetyl group, and the like), an alkoxycarbonyl group having 1 to 10 carbon atoms (for example, a methoxycarbonyl group, an ethoxycarbonyl group, and the like), an acyloxy group having 1 to 10 carbon atoms (for example, an acetyloxy group, a propionyloxy group, and the like), a nitro group, a trifluoromethyl group, a difluoromethyl group, and the like.

Examples of the divalent linking group represented by $L^{115}$ include the specific examples of the divalent linking groups represented by $L^{111}$ to $L^{114}$, such as —CO—O—, —O—CO—, —$CH_2$—O—, and —O—$CH_2$—.

Examples of those preferable as the basic skeleton of the mesogenic group represented by General Formula (XXII) will be shown below. These may be substituted with the aforementioned substituent.

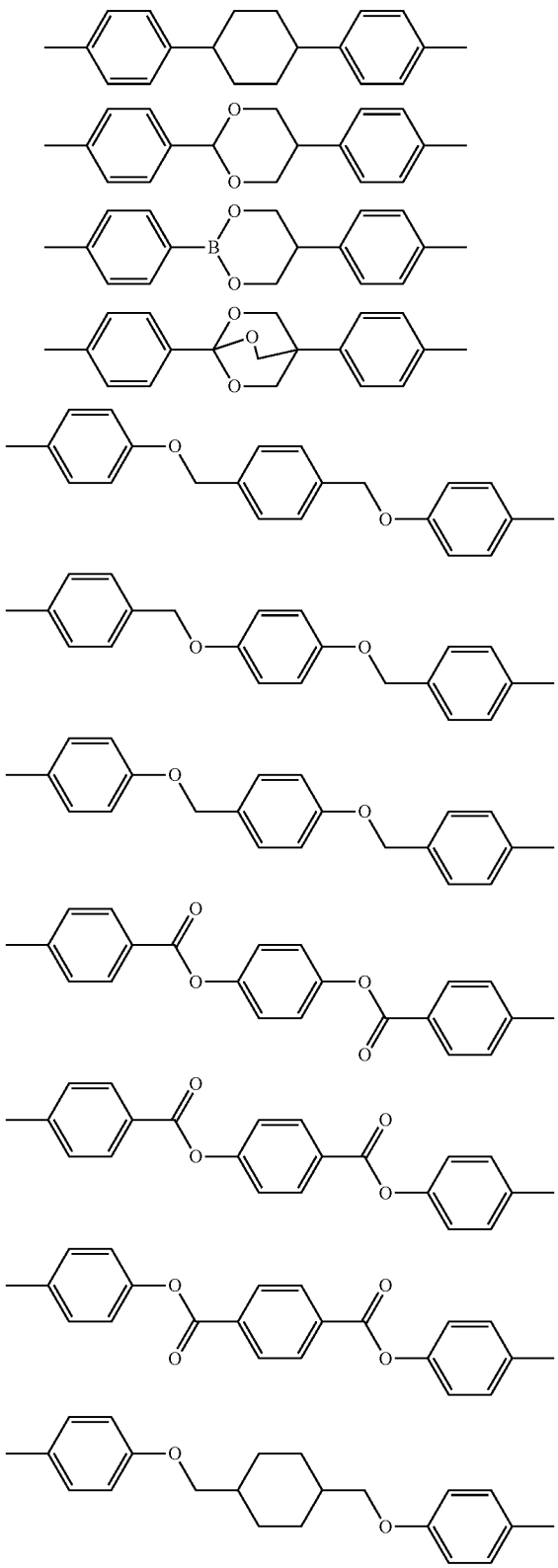

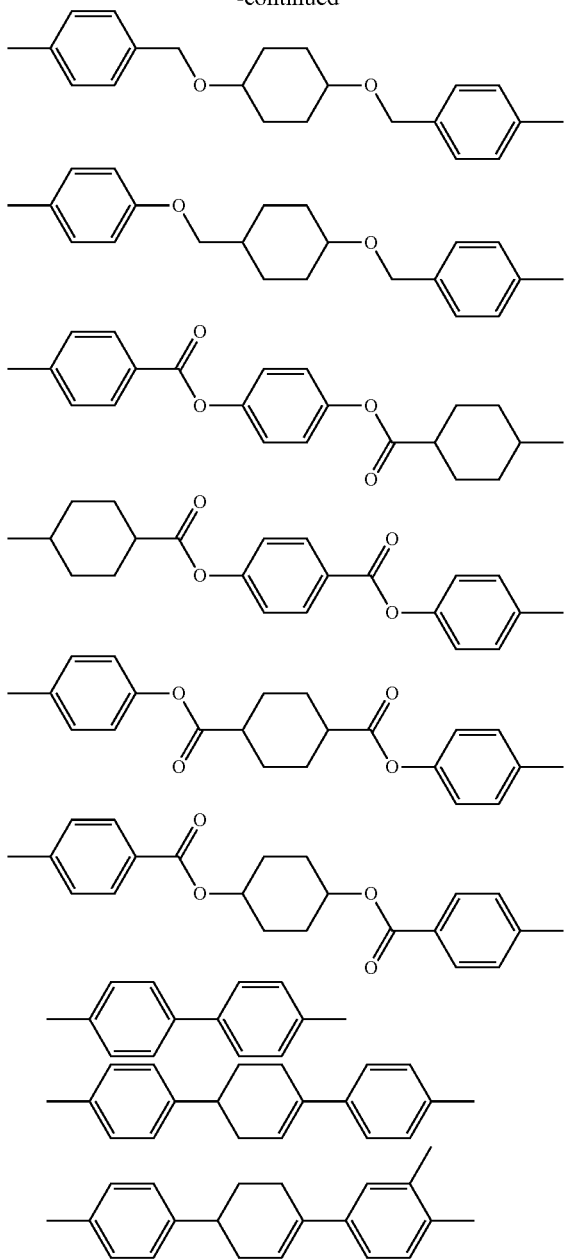

The compound represented by General Formula (XXI) can be synthesized with reference to the method described in JP1999-513019A (JP-H11-513019A) (WO97/000600).

The rod-like liquid crystal compound may be a monomer having the mesogenic group described in JP1999-323162A (JP-H11-323162A) and JP4118691B.

(Disk-Like Liquid Crystal Compound)

The disk-like liquid crystal compound has a disk-like structure in at least a portion thereof. The disk-like structure has at least an aromatic ring. Therefore, the disk-like liquid crystal compound can form a columnar structure by forming a stacking structure based on the intermolecular π-π interaction.

Specific examples of the disk-like structure include the triphenylene structure described in Angew. Chem. Int. Ed. 2012, 51, 7990-7993 or JP1995-306317A (JP-H07-306317A), the trisubstituted benzene structure described in JP2007-002220A or JP2010-244038A, and the like.

Particularly, In a case where the disk-like liquid crystal compound is used as a polymerizable monomer, a thermally conductive material showing high thermally conductive properties is obtained. The reason for this is considered as below. While the rod-like liquid crystal compound can only linearly (one-dimensionally) conduct heat, the disk-like liquid crystal compound can flatwise (two-dimensionally) conduct heat in a normal direction, and accordingly, the number of heat conduction paths increases, and the thermal conductivity is improved.

Furthermore, in a case where the disk-like liquid crystal compound is used, the heat resistance of the cured substance of the composition is improved.

It is preferable that the disk-like liquid crystal compound has three or more polymerizable groups. The cured substance of the composition containing the disk-like liquid crystal compound having three or more polymerizable groups tends to have a high glass transition temperature and high heat resistance. Compared to a rod-like liquid crystal compound, the disk-like liquid crystal compound is more likely to have three or more polymerizable groups without affecting the characteristics of a mesogenic portion. The number of polymerizable groups contained in the disk-like liquid crystal compound is preferably 8 or smaller and more preferably 6 or smaller.

As the disk-like liquid crystal compound, a compound represented by General Formula (XI) or a compound represented by General Formula (XII) is preferable.

General Formula XI

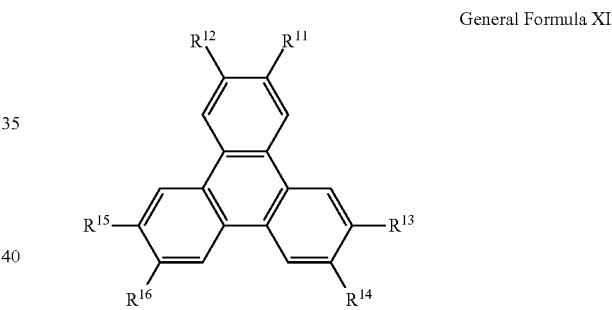

In the formula, $R^{11}$, $R^{12}$, $R^{13}$, $R^{14}$, $R^{15}$, and $R^{16}$ each independently represent *—$X^{11}$-$L^{11}$-$P^{11}$ or *—$X^{12}$—$Y^{12}$, * represents a position bonded to a triphenylene ring, two or more among $R^{11}$, $R^{12}$, $R^{13}$, $R^{14}$, $R^{15}$, and $R^{16}$ represent *—$X^{11}$-$L^{11}$-$P^{11}$, $X^{11}$ and $X^{12}$ each independently represent a single bond, —O—, —C(=O)—, —OC(=O)—, —OC(=O)O—, —OC(=O)NH—, —OC(=O)S—, —C(=O)O—, —C(=O)NH—, —C(=O)S—, —NHC(=O)—, —NHC(=O)O—, —NHC(=O)NH—, —NHC(=O)S—, —S—, —SC(=O)—, —SC(=O)O—, —SC(=O)NH—, or —SC(=O)S—, L″ represents a divalent linking group or a single bond, $P^{11}$ represents a polymerizable group, and $Y^{12}$ represents a hydrogen atom, a linear, branched, or cyclic alkyl group having 1 to 20 carbon atoms, or a group obtained by substituting one methylene group or two or more methylene groups in a linear, branched, or cyclic alkyl group having 1 to 20 carbon atoms with —O—, —S—, —NH—, —N($CH_3$)—, —C(=O)—, —OC(=O)—, or —C(=O)O—.

It is preferable that three or more out of $R^{11}$, $R^{12}$, $R^{13}$, $R^{14}$, $R^{15}$, and $R^{16}$ represent *—$X^{11}$-$L^{11}$-$P^{11}$. Particularly, it is more preferable that any one or more out of $R^{11}$ or $R^{12}$, any one or more out of $R^{13}$ or $R^{14}$, and any one or more out of $R^{15}$ or $R^{16}$ represent *—$X^{11}$-$L^{11}$-$P^{11}$. It is even preferable that all of $R^{11}$, $R^{12}$, $R^{13}$, $R^{14}$, $R^{15}$, and $R^{16}$ represent *—$X^{11}$-$L^{11}$-$P^{11}$. It is particularly preferable that all of $R^{11}$, $R^{12}$, $R^{13}$, $R^{14}$, $R^{15}$ and $R^{16}$ represent the same group represented by *—$X^{11}$-$L^{11}$-$P^{11}$.

$X^{11}$ and $X^{12}$ are each independently preferably —O—, —OC(=O)—, —OC(=O)O—, —OC(=O)NH—, —C(=O)O—, —C(=O)NH—, —NHC(=O)—, or NHC(=O)O—, more preferably —OC(=O)—, —C(=O)O—, —OC(=O)NH—, or —C(=O)NH—, and even more preferably —C(=O)O—.

$L^{11}$ represents a single bond or a divalent linking group which links $X^{11}$ and $P^{11}$ to each other. Examples of the divalent linking group include —O—, —OC(=O)—, —C(=O)O—, an alkylene group having 1 to 10 carbon atoms (preferably having 1 to 8 carbon atoms and more preferably having 1 to 6 carbon atoms), an arylene group having 6 to 20 carbon atoms (preferably having 6 to 14 carbon atoms and more preferably having 6 to 10 carbon atoms), a group obtained by combining these, and the like.

Examples of the alkylene group having 1 to 10 carbon atoms include a methylene group, an ethylene group, a propylene group, a butylene group, a pentylene group, a hexylene group, and the like.

Examples of the arylene group having 6 to 20 carbon atoms include a 1,4-phenylene group, a 1,3-phenylene group, a 1,4-naphthylene group, a 1,5-naphthylene group, an anthracenylene group, and the like, and a 1,4-phenylene group is preferable.

Each of the alkylene group and the arylene group may have a substituent. Examples of the substituent include the groups exemplified in the substituent group T. The number of substituents is preferably 1 to 3 and more preferably 1. The substitution position of the substituent is not particularly limited. As the substituent, a halogen atom or an alkyl group having 1 to 3 carbon atoms is preferable and a methyl group is more preferable. It is also preferable that the alkylene group and the arylene group are unsubstituted. It is particularly preferable that the alkylene group is unsubstituted.

$P^{11}$ represents a polymerizable group. The definition of the polymerizable group is as described above.

$P^{11}$ is preferably an acryloyl group, a methacryloyl group, or an oxiranyl group.

In a case where $P^{11}$ is a hydroxy group, $L^{11}$ includes an arylene group, and it is preferable that the arylene group is bonded to $P^{11}$.

$Y^{12}$ represents a hydrogen atom, a linear, branched, or cyclic alkyl group having 1 to 20 carbon atoms, or a group obtained by substituting one methylene group or two or more methylene groups in a linear, branched, or cyclic alkyl group having 1 to 20 carbon atoms with —O—, —S—, —NH—, —N(CH₃)—, —C(=O)—, —OC(=O)—, or —C(=O)O—.

In a case where $Y^{12}$ represents a linear, branched, or cyclic alkyl group having 1 to 20 carbon atoms or a group obtained by substituting one methylene group or two or more methylene groups in a linear, branched, or cyclic alkyl group having 1 to 20 carbon atoms with —O—, —S—, —NH—, —N(CH₃)—, —C(=O)—, —OC(=O)—, or —C(=O)O—, $Y^{12}$ may be substituted with a halogen atom.

Examples of the linear or branched alkyl group having 1 to 20 carbon atoms include a methyl group, an ethyl group, a n-propyl group, an isopropyl group, a n-butyl group, an isobutyl group, a sec-butyl group, a tert-butyl group, a n-pentyl group, an isopentyl group, a neopentyl group, a 1,1-dimethylpropyl group, a n-hexyl group, an isohexyl group, a linear or branched heptyl group, an octyl group, a nonyl group, a decyl group, an undecyl group, and a dodecyl group.

The number of carbon atoms in the cyclic alkyl group is preferably 3 or more and more preferably 5 or more. The number of carbon atoms in the cyclic alkyl group is preferably 20 or smaller, more preferably 10 or smaller, even more preferably 8 or smaller, and particularly preferably 6 or smaller. Examples of the cyclic alkyl group include a cyclopropyl group, a cyclobutyl group, a cyclopentyl group, a cyclohexyl group, a cycloheptyl group, and a cyclooctyl group.

$Y^{12}$ is preferably a hydrogen atom, a linear, branched, or cyclic alkyl group having 1 to 20 carbon atoms, or an alkylene oxide group having 1 to 20 carbon atoms, and more preferably a linear or branched alkyl group having 1 to 12 carbon atoms or an ethylene oxide group or propylene oxide group having 1 to 20 carbon atoms.

Regarding specific examples of the compound represented by General Formula (XI), compounds described in paragraphs "0028" to "0036" in JP1995-281028A (JP-H07-281028A), JP1995-306317A (JP-H07-306317A), paragraphs "0016" to "0018" in JP2005-156822A, paragraphs "0067" to "0072" in JP2006-301614A, and Liquid Crystal Handbook (published on 2000 from MARUZEN Co., Ltd.), pp. 330 to 333 can be referred to.

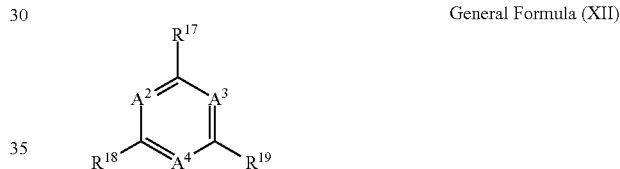

General Formula (XII)

In the formula, $A^2$, $A^3$, and $A^4$ each independently represent —CH= or —N=, $R^{17}$, $R^{18}$, and $R^{19}$ each independently represent *—$X^{211}$—$(Z^{21}—X^{212})_{n21}$-$L^{21}$-$P^{21}$ or *—$X^{211}$—$(Z^{22}—X^{222})_{n22}$—$Y^{22}$, * represents a position bonded to a central ring, two or more among $R^{17}$, $R^{18}$, and $R^{19}$ represent *—$X^{211}$—$(Z^{21}—X^{212})_{n21}$-$L^{21}$-$P^{21}$, $X^{211}$, $X^{212}$, and $X^{222}$ each independently represent a single bond, —O—, —C(=O)—, —OC(=O)—, —OC(=O)O—, —OC(=O)NH—, —OC(=O)S—, —C(=O)O—, —C(=O)NH—, —C(=O)S—, —NHC(=O)—, —NHC(=O)O—, —NHC(=O)NH—, —NHC(=O)S—, —S—, —SC(=O)—, —SC(=O)O—, —SC(=O)NH—, or —SC(=O)S—, $Z^{21}$ and $Z^{22}$ each independently represent an aromatic group as a 5-membered or 6-membered ring or a non-aromatic group as a 5-membered or 6-membered ring, $L^{21}$ represents a divalent linking group or a single bond linking $X^{212}$ and $P^{21}$ to each other, $P^{21}$ represents a polymerizable group, $Y^{22}$ represents a hydrogen atom, a linear, branched, or cyclic alkyl group having 1 to 20 carbon atoms, or a group obtained in a case where one methylene group or two or more methylene groups in a linear, branched, or cyclic alkyl group having 1 to 20 carbon atoms are substituted with —O—, —S—, —NH—, —N(CH₃)—, —C(=O)—, —OC(=O)—, or —C(=O)O—, n21 and n22 each independently represent an integer of 0 to 3, and in a case where each of n21 and n22 is 2 or greater, a plurality of groups represented by $Z^{21}$—$X^{212}$ and $Z^{22}$—$X^{222}$ may be the same as or different from each other.

It is preferable that all of $R^{17}$, $R^{18}$, and $R^{19}$ represent *—$X^{211}$—$(Z^{21}$—$X^{212})_{n21}$-$L^{21}$-$P^{21}$. It is more preferable that all of $R^{17}$, $R^{18}$, and $R^{19}$ represent the same group represented by *—$X^{211}$—($Z^{21}$—$X^{212}$)$_{n21}$-$L^{21}$-$P^{21}$.

As $X^{211}$, $X^{212}$, and $X^{222}$, a single bond or —OC(=O)— is preferable.

$Z^{21}$ and $Z^{22}$ each independently represent an aromatic group as a 5-membered or 6-membered ring or a non-aromatic group as a 5-membered or 6-membered ring. Examples thereof include a 1,4-phenylene group, a 1,3-phenylene group, a divalent heterocyclic group, and the like.

The aromatic group and the non-aromatic group may have a substituent. Examples of the substituent include the groups exemplified in the substituent group T. The number of substituents is preferably 1 or 2 and more preferably 1. The substitution position of the substituent is not particularly limited. As the substituent, a halogen atom or a methyl group is preferable. As the halogen atom, a chlorine atom or a fluorine atom is preferable. It is also preferable that the aromatic group and the non-aromatic group are unsubstituted.

Examples of the divalent heterocyclic ring include the following heterocyclic rings.

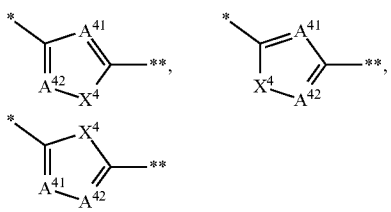

In the formulae, * represents a portion bonded to $X^{211}$ and ** represents a portion bonded to $X^{212}$ (or $X^{222}$); $A^{41}$ and $A^{42}$ each independently represent a methine group or a nitrogen atom; and $X^4$ represents an oxygen atom, a sulfur atom, a methylene group, or an imino group.

It is preferable that at least one of $A^{41}$ or $A^{42}$ represents a nitrogen atom. It is more preferable that both of $A^{41}$ and $A^{42}$ represent a nitrogen atom. Furthermore, it is preferable that $X^4$ represents an oxygen atom.

$L^{21}$ represents a divalent linking group or a single bond linking $X^{212}$ and $P^{21}$ to each other, and has the same definition as $L^H$ in General Formula (XI). As $L^{21}$, —O—, —OC(=O)—, —C(=O)O—, an alkylene group having 1 to 10 carbon atoms (preferably 1 to 8 carbon atoms and more preferably 1 to 6 carbon atoms), or a group obtained by combining these is preferable.

$P^{21}$ represents a polymerizable group. The definition of the polymerizable group is as described above.

$P^{21}$ is preferably an acryloyl group, a methacryloyl group, or an oxiranyl group.

$Y^{22}$ represents a hydrogen atom, a linear, branched, or cyclic alkyl group having 1 to 20 carbon atoms, or a group obtained in a case where one methylene group or two or more methylene groups in a linear, branched, or cyclic alkyl group having 1 to 20 carbon atoms are substituted with —O—, —S—, —NH—, —N(CH$_3$)—, —C(=O)—, —OC(=O)—, or —C(=O)O—. $Y^{22}$ has the same definition as $Y^{12}$ in General Formula (XI), and the preferred range thereof is also the same as that of $Y^{12}$ in General Formula (XI).

n21 and n22 each independently represent an integer of 0 to 3, preferably represent an integer of 1 to 3, and more preferably represent 2 or 3.

Regarding the details and specific examples of the compound represented by General Formula (XII), the description in paragraphs "0013" to "0077" in JP2010-244038A can be referred to, and the contents thereof are incorporated into the present specification.

In view of reinforcing stacking by reducing electron density and making it easy to form a columnar aggregate, it is preferable that the compound represented by General Formula (XI) or (XII) is a compound having a hydrogen-bonding functional group.

Examples of the hydrogen-bonding functional group include —OC(=O)NH—, —C(=O)NH—, —NHC(=O)—, —NHC(=O)O—, —NHC(=O)NH—, —NHC(=O)S—, SC(=O)NH—, and the like.

Specific examples of compounds particularly preferable as the compound represented by General Formula (XI) and the compound represented by General Formula (XII) include the following compounds.

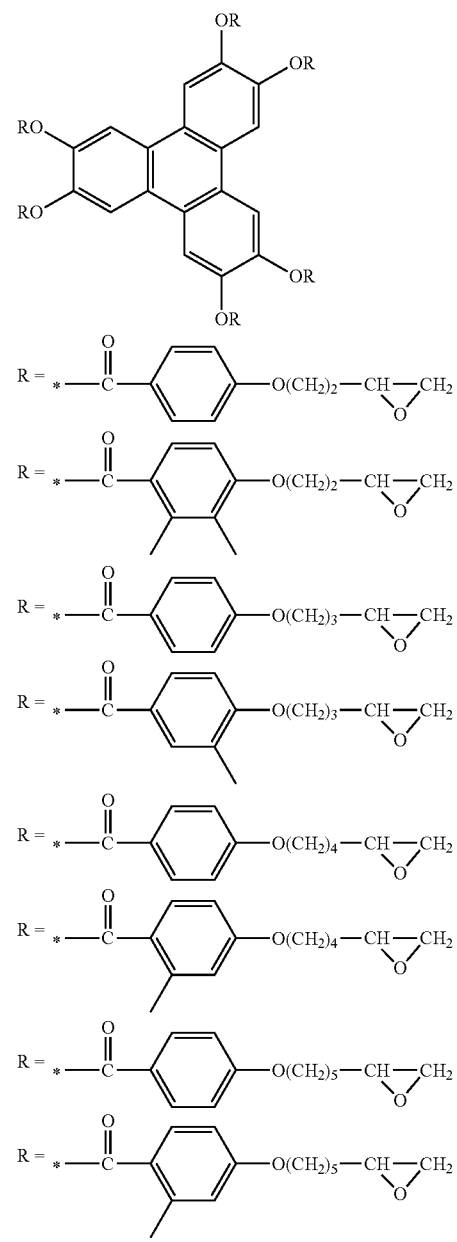

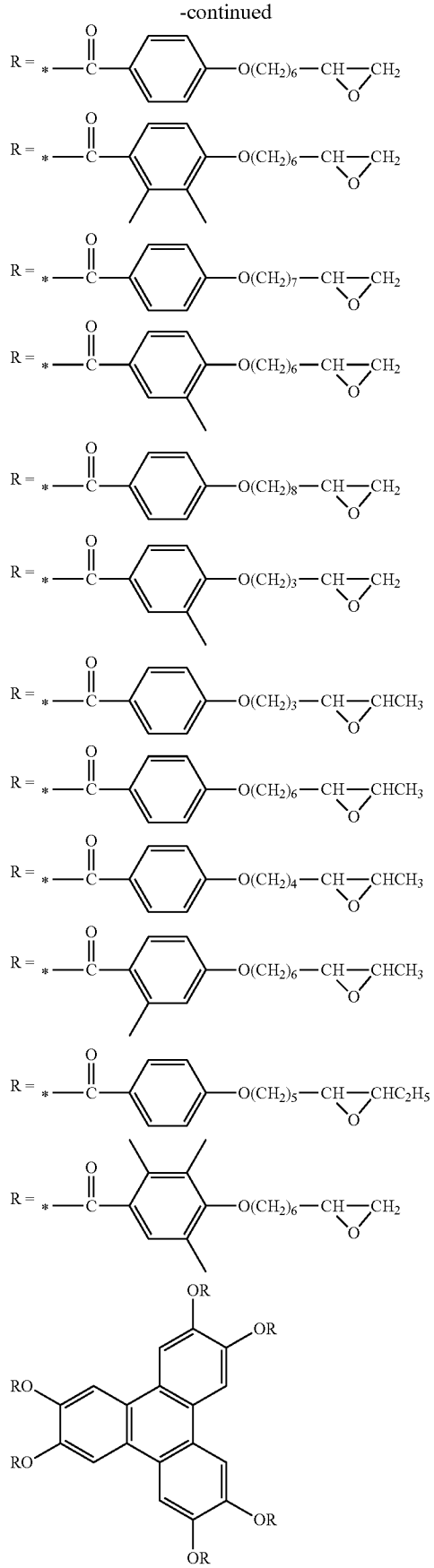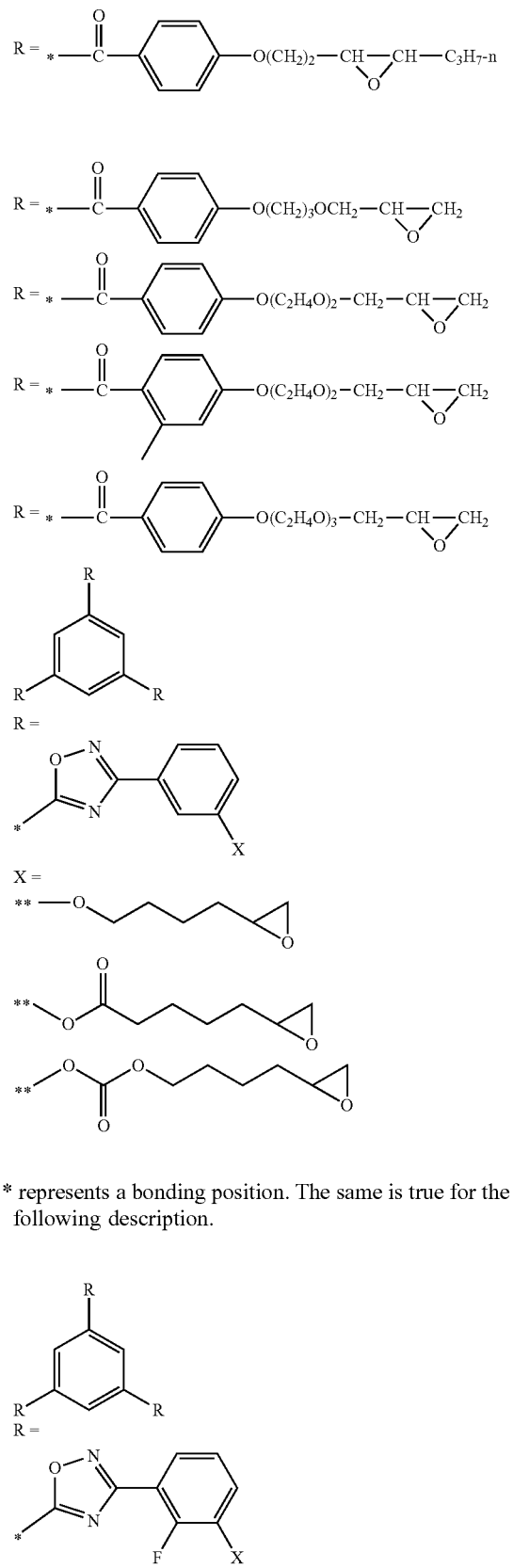
** represents a bonding position. The same is true for the following description.

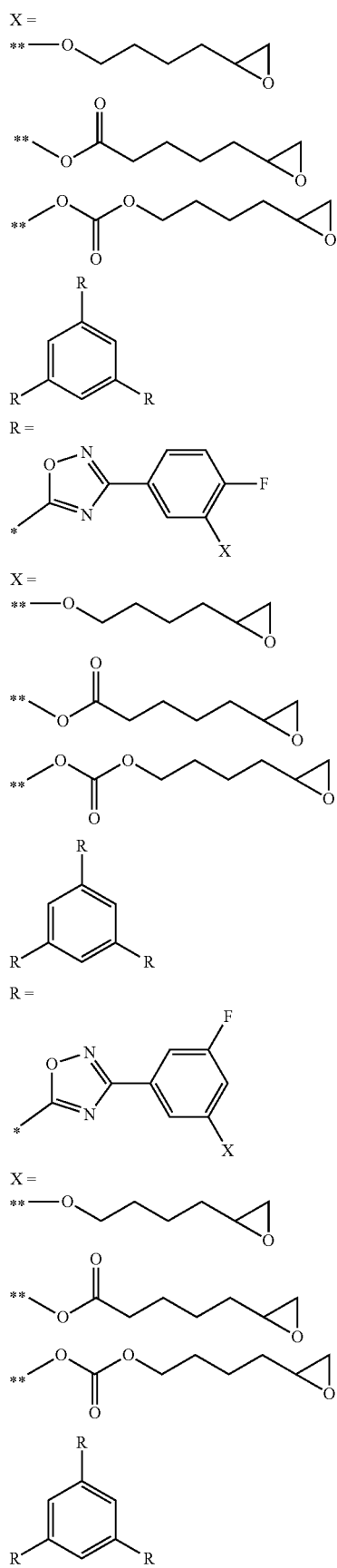
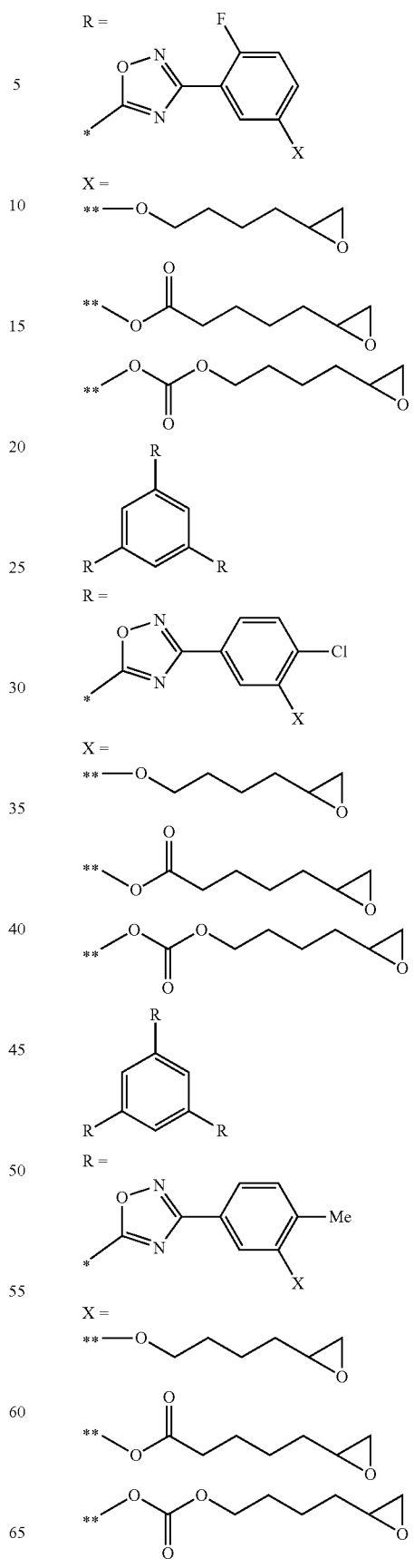

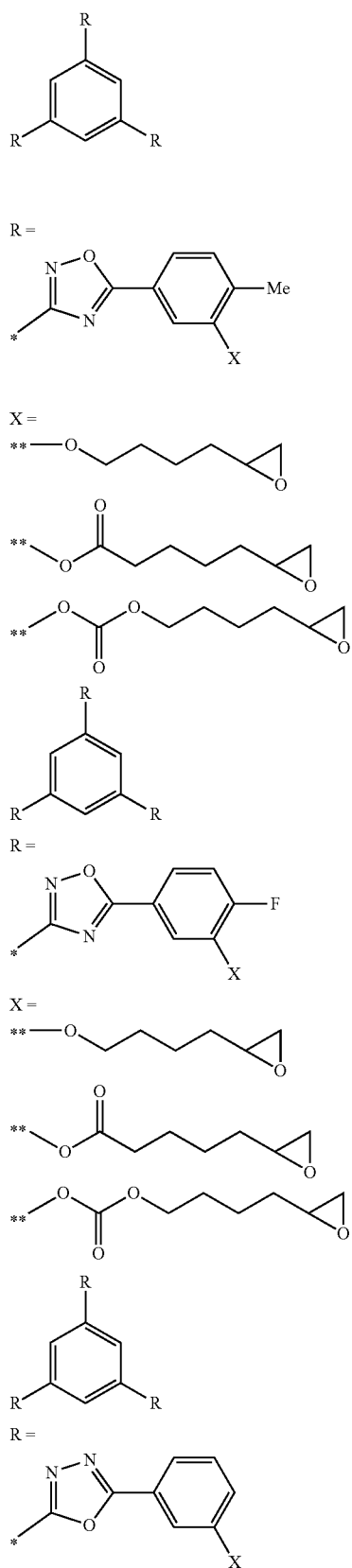
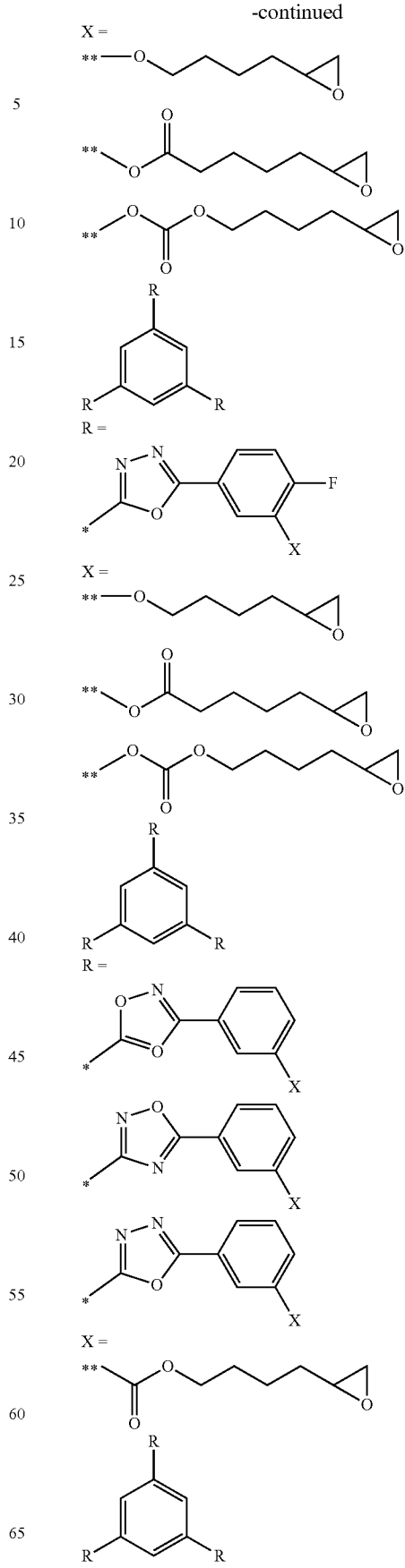

R =
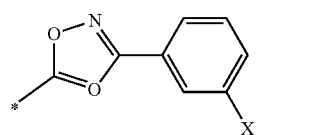
X =
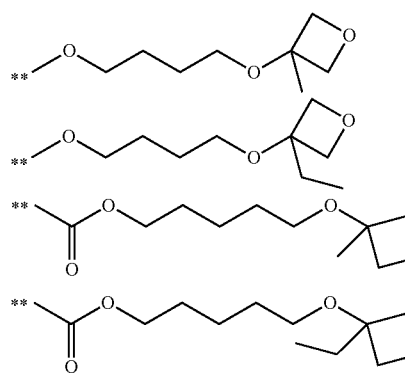
R =
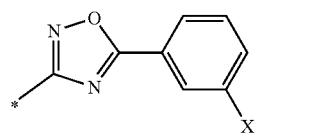
X =
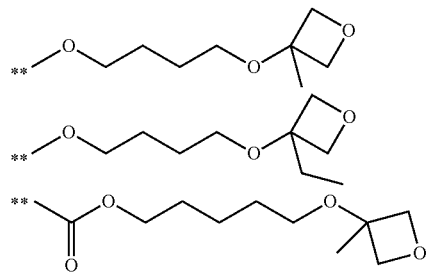
R =
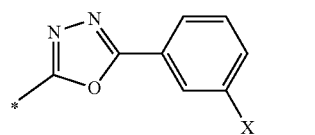
X =
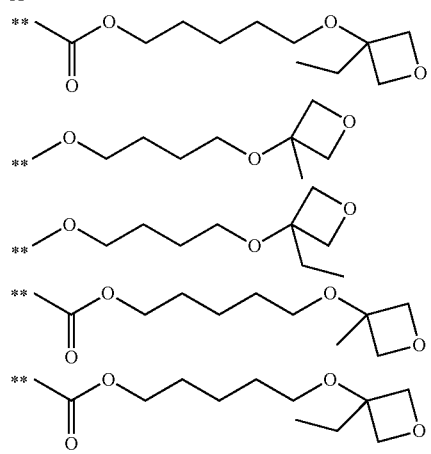
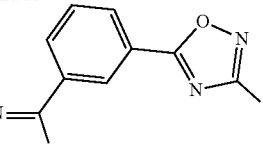
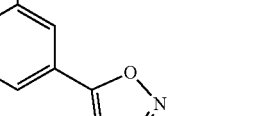
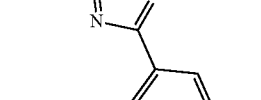
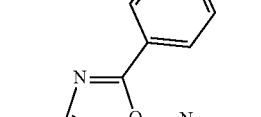
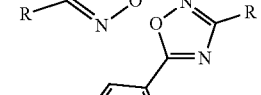
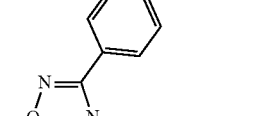
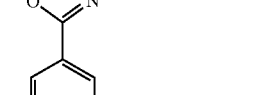
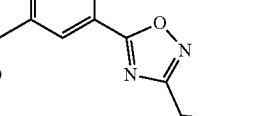
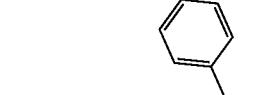
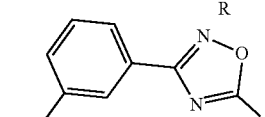
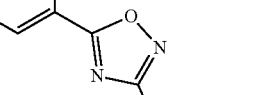
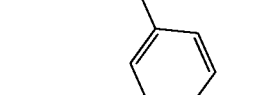
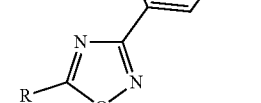

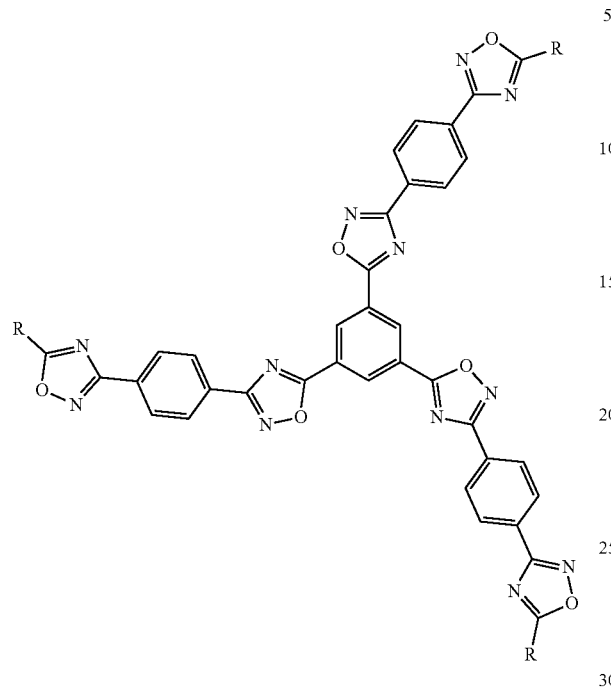
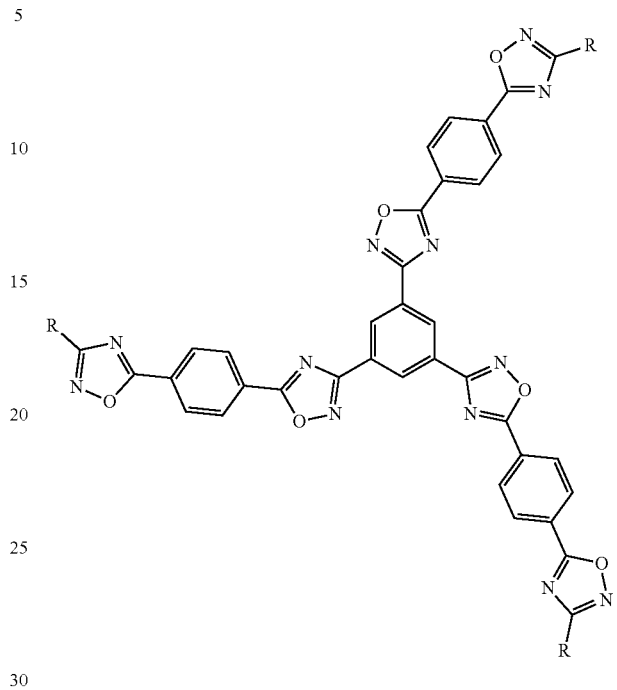
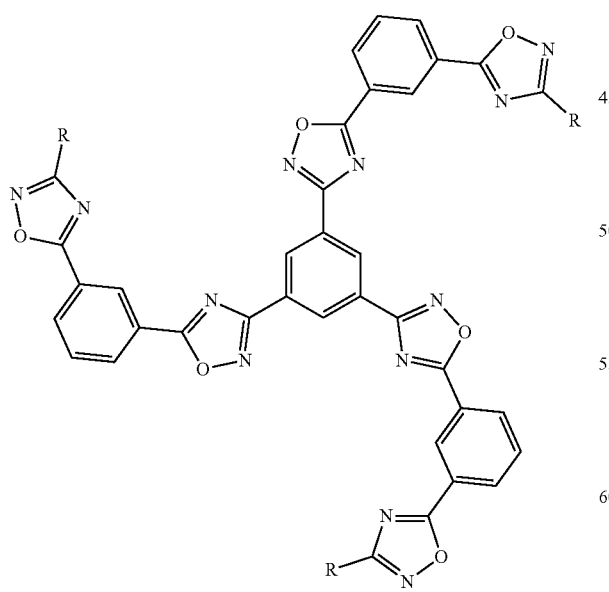
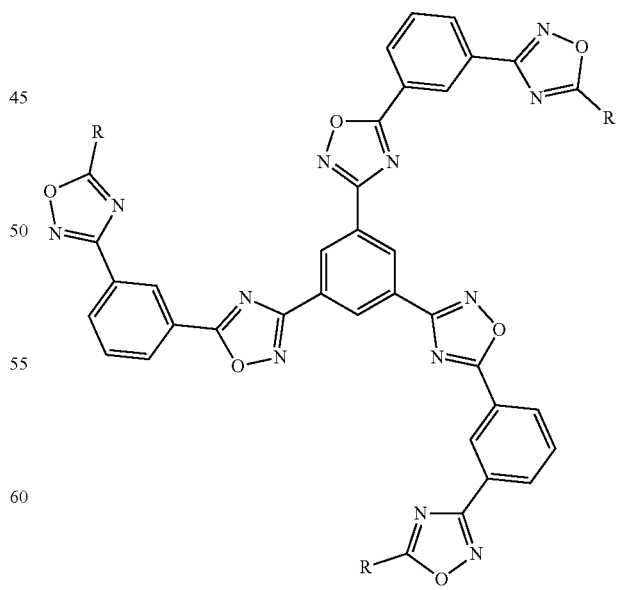

-continued

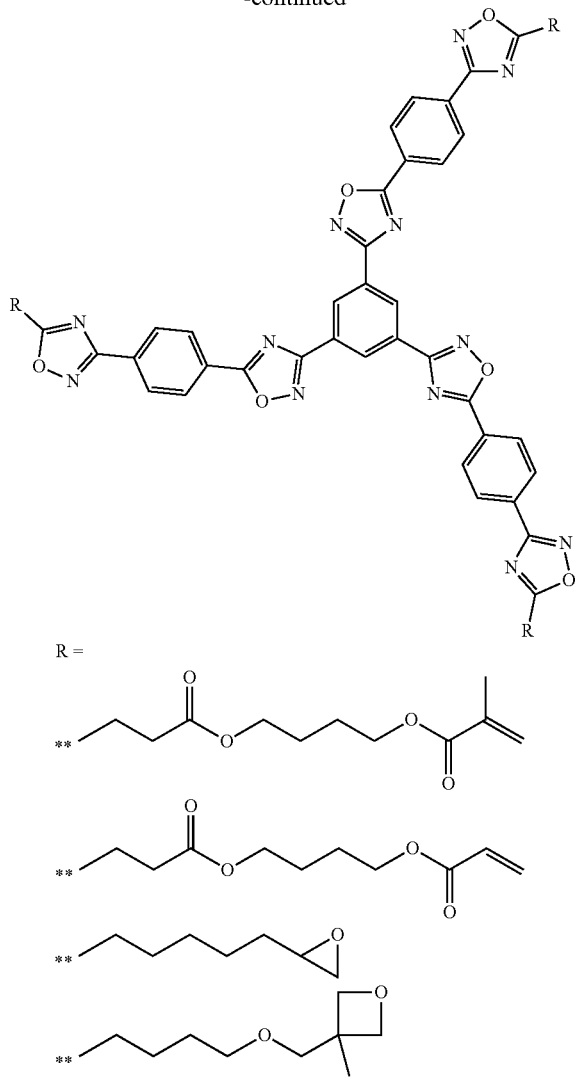

The compound represented by General Formula (XI) can be synthesized based on the methods described in JP1995-306317A (JP-H07-306317A), JP1995-281028A (JP-H07-281028A), JP2005-156822A, and JP2006-301614A.

The compound represented by General Formula (XII) can be synthesized based on the methods described in JP2010-244038A, JP2006-076992A, and JP2007-002220A.

<Other Components>
(Curing Agent)

The composition may further contain a curing agent.

The type of the curing agent is not particularly limited, and the curing agent may be a compound which can cure the aforementioned polymerizable monomer. The curing agent is preferably a compound having a functional group selected from the group consisting of a hydroxy group, an amino group, a thiol group, an isocyanate group, a carboxy group, a (meth)acryloyl group, and a carboxylic acid anhydride group, and more preferably a compound having a functional group selected from the group consisting of a hydroxy group, a (meth)acryloyl group, an amino group, and a thiol group.

The curing agent preferably has two or more of the functional groups described above and more preferably has two or three of the functional groups described above.

Examples of the curing agent include an amine-based curing agent, a phenol-based curing agent, a guanidine-based curing agent, an imidazole-based curing agent, a naphthol-based curing agent, an acrylic curing agent, an acid anhydride-based curing agent, an active ester-based curing agent, a benzoxazine-based curing agent, a cyanate ester-based curing agent, and the like. Among these, an acrylic curing agent, a phenol-based curing agent, or an amine-based curing agent is preferable.

The content of the curing agent in the composition is not particularly limited, but is preferably 1% to 50% by mass and more preferably 1% to 30% by mass with respect to the total solid content in the composition.

(Curing Accelerator)

The composition may further contain a curing accelerator.

The type of the curing accelerator is not particularly limited, and examples thereof include triphenylphosphine, 2-ethyl-4-methylimidazole, a boron trifluoride amine complex, 1-benzyl-2-methylimidazole, and those described in paragraph "0052" in JP2012-067225A.

The content of the curing accelerator in the composition is not particularly limited, but is preferably 0.1% to 20% by mass with respect to the total solid content in the composition.

(Polymerization Initiator)

The composition may further contain a polymerization initiator.

Particularly, in a case where the specific compound or the polymerizable monomer has a (meth)acryloyl group, it is preferable that the composition contains the polymerization initiator described in paragraph "0062" in JP2010-125782A and paragraph "0054" in JP2015-052710A.

The content of the polymerization initiator in the composition is not particularly limited, but is preferably 0.1% to 50% by mass with respect to the total solid content in the composition.

(Solvent)

The composition may further contain a solvent.

The type of the solvent is not particularly limited, but the solvent is preferably an organic solvent. Examples of the organic solvent include ethyl acetate, methyl ethyl ketone, dichloromethane, tetrahydrofuran, and the like.

<Method for Producing Composition>

The method for producing the composition is not particularly limited, and known methods can be adopted. For example, the composition can be produced by mixing together the aforementioned various components (the surface-modified inorganic nitride, the polymerizable monomer, and the like) by a known method. At the time of mixing, the various components may be mixed at a time or mixed sequentially.

Furthermore, as described above, at the time of producing the surface-modified inorganic nitride, the inorganic nitride, the specific compound, and other additives may be mixed together at a time so as to produce the composition.

<Method for Curing Composition>

The method for curing the composition is not particularly limited, and an optimal method is appropriately selected according to the type of the polymerizable monomer. The curing method may be a thermal curing reaction or a photocuring reaction, for example, and is preferably a thermal curing reaction.

The heating temperature at the time of the thermal curing reaction is not particularly limited, and may be appropriately selected within a range of 50° C. to 200° C., for example.

Furthermore, at the time of performing the thermal curing reaction, heating treatment may be performed plural times at different temperatures.

The curing reaction is preferably performed on the composition formed into a sheet. Specifically, for example, coating may be performed using the composition, and the obtained coating film may be subjected to the curing reaction. At this time, press working may also be performed.

The curing reaction may be a semi-curing reaction. That is, the obtained cured substance may be in a so-called B stage state (semi-cured state).

In a case where the cured substance semi-cured as described above is disposed to contact a device or the like, and then permanently cured by heating and the like, the adhesiveness between a layer containing a thermally conductive material, which is the cured substance, and the device is further improved.

<Use>

The surface-modified inorganic nitride and the composition described above can be used for various uses. For example, the surface-modified inorganic nitride and the composition can be applied to various fields as a pigment, a catalyst, an electrode material, a semiconductor material, a thermally conductive material, a lubricant, and the like. That is, a material containing the surface-modified inorganic nitride can be used for various uses. The shape of the material containing the surface-modified inorganic nitride is not particularly limited, and may be a sheet shape, for example.

Particularly, the surface-modified inorganic nitride and the composition described above are preferably used for forming a thermally conductive material or a lubricant.

Hereinafter, the suitable use will be specifically described.

(Thermally Conductive Material)

The thermally conductive material according to the embodiment of the present invention contains the surface-modified inorganic nitride.

The thermally conductive material may contain components other than the surface-modified inorganic nitride, and examples thereof include a binder. Examples of the binder include a binder formed by curing the polymerizable monomer described above.

The thermally conductive material can be prepared by curing the composition described above. That is, the composition can be used for forming the thermally conductive material. Regarding the preparation of the thermally conductive material including a curing reaction, "Highly Thermally Conductive Composite Material" (CMC Publishing CO., LTD., written by Yoshitaka TAKEZAWA) can be referred to.

The thermally conductive material may contain the surface-modified inorganic nitride, and the method for producing the thermally conductive material is not limited to the aspect in which the aforementioned composition is used.

The thermally conductive material is a material having excellent thermally conductive properties, and can be used as a heat dissipation material such as a heat dissipation sheet. For example, the thermally conductive material can be used for dissipating heat from various devices such as power semiconductor devices. More specifically, in a case where a device with a thermally conductive layer is prepared by disposing a thermally conductive layer containing the thermally conductive material on a device, the heat generated from the device can be efficiently dissipated by the thermally conductive layer.

The shape of the thermally conductive material is not particularly limited, and the thermally conductive material can be molded to have various shapes according to the use. Typically, the thermally conductive material is preferably in the form of a sheet.

The thermally conductive material may be in a completely cured state or a semi-cured state (B stage state described above). As described above, in a case where the thermally conductive material is in a semi-cured state, by disposing the thermally conductive material on a device and then performing a heating treatment thereon, a thermally conductive layer having excellent adhesiveness can be formed on the device.

(Lubricant)

The surface-modified inorganic nitride can be suitably used for preparing a lubricant. That is, examples of the use of the surface-modified inorganic nitride include a lubricant containing the surface-modified inorganic nitride.

The lubricant can be prepared by mixing the surface-modified inorganic nitride with grease (a low-molecular-weight monomer or a polymer resin) or the like. As the grease, known materials can be used.

As an example of the inorganic nitride in the surface-modified inorganic nitride at the time of preparing the lubricant, boron nitride is preferable. This is because boron nitride is known to exhibit lubricating properties by itself in a high-temperature region.

EXAMPLES

Hereinafter, the present invention will be more specifically described based on Examples. The materials, the amount and proportion of the materials used, the details of treatments, the procedure of treatments, and the like shown in the following Examples can be appropriately changed within a range that does not depart from the gist of the present invention. Accordingly, the scope of the present invention is not limitedly interpreted by the following Examples.

[Establishment of Experimental System]

Alizarin is a compound which is well known to modify the surface of zinc oxide by being bonded to zinc oxide (JP5479175B). Alizarin (12 mg, produced by Wako Pure Chemical Corporation, catalog No. 015-01151) was dissolved in 300 mL of methyl ethyl ketone. By using a visible absorption spectrum (measurement apparatus: UV-3100PC manufactured by Shimadzu Corporation) of the solution, the absorbance at a wavelength of 427 nm was measured. Furthermore, separately prepared fine zinc oxide particles (produced by Wako Pure Chemical Corporation, 264-00365) were added to the solution (25 mL) and gently stirred. After about 5 minutes, the supernatant solution of the obtained solution was filtered using a 0.45-micron filter (Minisart RC15 manufactured by Sartorius). For the obtained filtrate, the absorbance was measured in the same manner as described above. As a result, the absorbance of the solution obtained after the addition of the fine zinc oxide particles was 27.6% of the absorbance of the solution obtained before the addition of the fine zinc oxide particles. From the obtained result, it was understood that, by comparing the absorbances as described above, from the decrement of the absorbance, it is possible to determine whether or not the surface of an inorganic nitride is modified with a compound and to determine the degree of surface modification.

(Adsorption Test onto Inorganic Nitride)

1-Pyreneboronic acid (10 mg) was dissolved in acetonitrile (100 mL), and further diluted to 1/10 to obtain a solution. An ultraviolet•visible absorption spectrum (measurement apparatus: UV-3100PC manufactured by Shimadzu. Corporation) of the obtained solution was measured, and an absorbance X at an absorption maximum wavelength was determined.

Thereafter, boron nitride "SGPS" (0.5 g) produced by Denka Company Limited was added to the solution (20 mL) and stirred for several seconds. After stirring, the supernatant solution of the obtained solution was filtered using a filter. By using the obtained filtrate, an ultraviolet•visible absorption spectrum (measurement apparatus: UV-3100PC manufactured by Shimadzu Corporation) of the filtrate was measured in the same manner as described above, and an absorbance Y at an absorption maximum wavelength was determined. The results of the ultraviolet•visible absorption spectra are shown in FIG. 1.

Subsequently, a ratio (residual rate (%)) of the absorbance Y of the filtrate, which was obtained by the addition of boron nitride, measured at an absorption maximum wavelength to the absorbance X of the solution, to which boron nitride was not yet added, measured at an absorption maximum wavelength was calculated. The smaller residual rate (%) means superior adsorption onto boron nitride. The results are shown in Table 1.

In addition, the residual rate (%) of the absorbance after the addition of boron nitride was calculated in the same procedure as that described above by using each compound shown in Table 1, which will be described later, instead of 1-pyreneboronic acid. The results are summarized in Table 1 which will be described later.

Furthermore, the results of the ultraviolet•visible absorption spectra are respectively shown in FIGS. 2 to 8.

As is evident from the results in Table 1, in a case where the respective compounds shown in Table 1 were used, a decrease in the absorbance was confirmed in all cases. From this result, it was confirmed that the respective compounds shown in Table 1 were adsorbed onto the surface of the boron nitride. In addition, even in a case where a compound other than the compounds shown in Table 1 was used among compounds C-1 to C59 used in Examples which will be described later, a decrease in the absorbance was confirmed. From this result, it was confirmed that a compound other than the compounds shown in Table 1, among compounds C-1 to C59 used in Examples which will be described later, was also adsorbed onto the surface of the boron nitride.

[Preparation and Evaluation of Composition]

<Various Components>

Various components used in Examples and Comparative Examples will be shown below.

(Polymerizable Monomer)

As the polymerizable monomer, compounds represented by the following A-1 to A-4 were used.

A-1: Mixture of bisphenol F diglycidyl ether resin and bisphenol A diglycidyl ether resin, epoxy equivalent: 165.7 g/eq, total chlorine: 0.008% by weight, viscosity: 2,340 mPa·s, produced by NIPPON STEEL & SUMIKIN CHEMICAL CO., LTD.

TABLE 1

| | Absorption maximum wavelength (nm) | Absorbance before adsorption | Absorbance after adsorption | Residual rate (%) |
|---|---|---|---|---|
| 1-Pyreneboronic acid (corresponding to compound C-44 described later) | 346 | 0.695 | 0.172 | 24.7 |
| 1-Pyrenemethanol (corresponding to compound C-19 described later) | 344 | 0.73 | 0.452 | 61.9 |
| 1-Nitropyrene (corresponding to compound C-20 described later) | 404 | 0.832 | 0.674 | 81.0 |
| 6-Hydroxypyrene-1-aldehyde (corresponding to compound C-55 described later) | 417 | 0.69 | 0.31 | 44.9 |
| 1-Aminopyrene | 398 | 0.602 | 0.513 | 85.2 |
| 1-Hydroxypyrene (corresponding to compound C-18 described later) | 383 | 0.28 | 0.206 | 73.6 |
| 1-Pyrenecarboxylic acid (corresponding to compound C-8 described later) | 396 | 1.102 | 0.822 | 74.6 |
| 1-Pyrenecarboxaldehyde (corresponding to compound C-36 described later) | 385 | 0.161 | 0.021 | 13.0 |

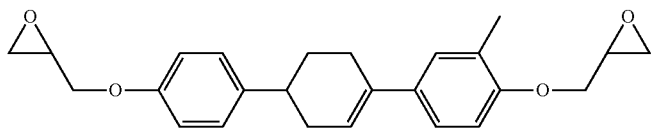

A-2

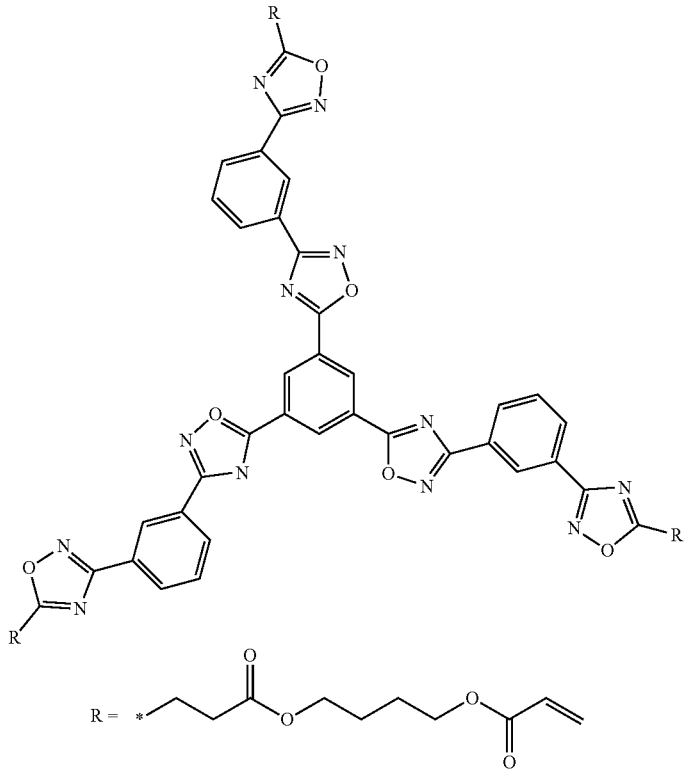

A-3

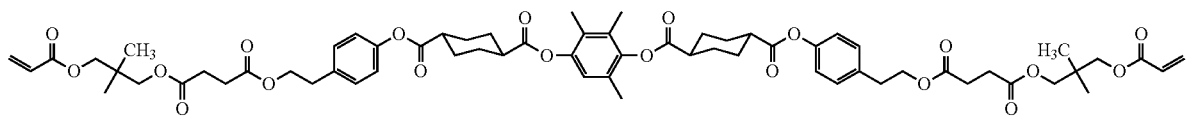

A-4

(Additive)

As the additive, compounds represented by the following B-1 to B-3 were used.

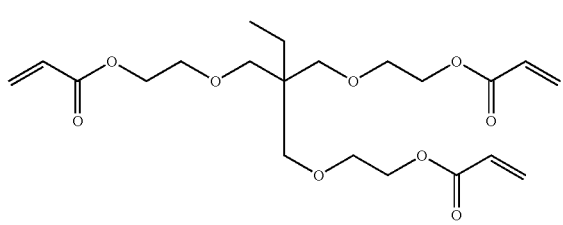

B-1

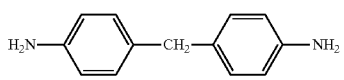

B-2

B-3: "KAYAHARD GPH-65" (produced by Nippon Kayaku Co., Ltd.)

(Solvent)

As the solvent, methyl ethyl ketone (MEK) was used.

(Polymerization Initiator)

As the polymerization initiator, VAm-110 (oil-soluble azo polymerization initiator, produced by Wako Pure Chemical Corporation) was used.

(Inorganic Nitride)

As the inorganic nitride, the followings were used.

SGPS (boron nitride, average particle diameter: 12 μm, produced by Denka Company Limited)

S-30 (aluminum nitride (described as AlN in the table), average particle diameter: 35 μm, produced by MARUWA Co., Ltd.)

(Surface Modifier)

As the surface modifier, compounds represented by the following C-1 to C-59 were used.

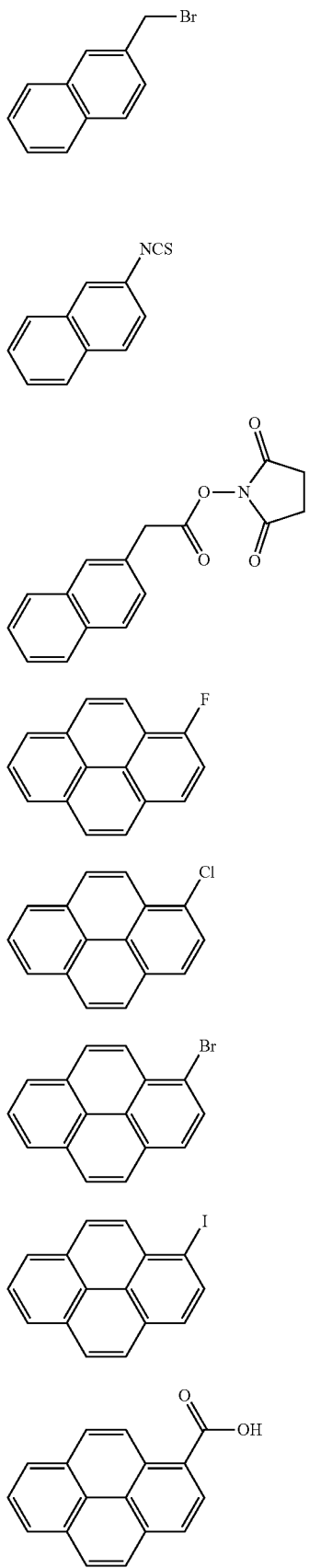
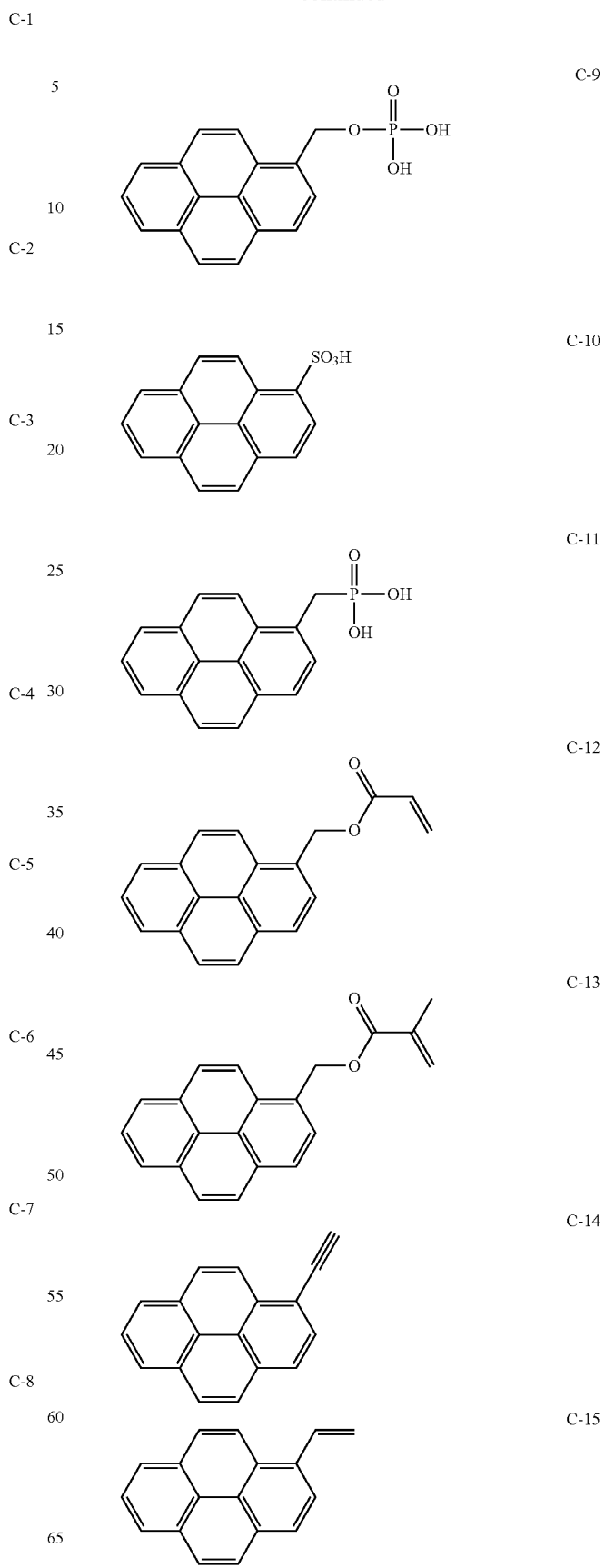

C-16
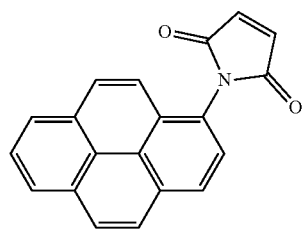
C-17
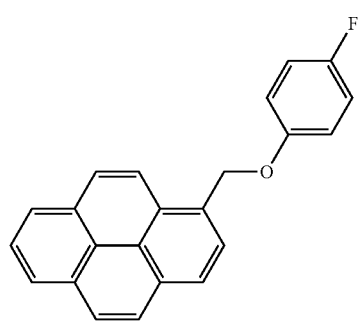
C-18
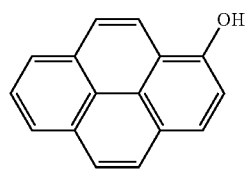
C-19
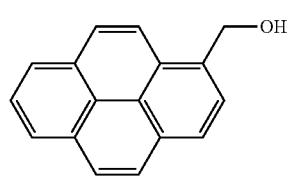
C-20
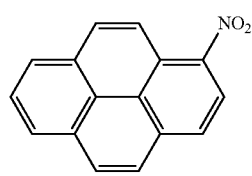
C-21
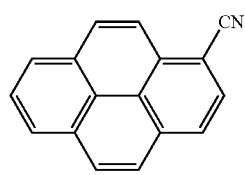
C-22
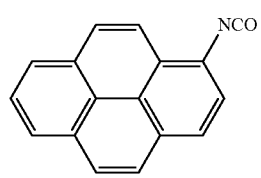
C-23
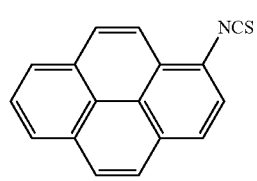
C-24
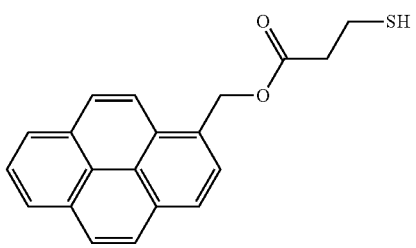
C-25
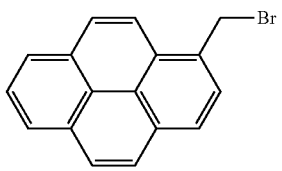
C-26
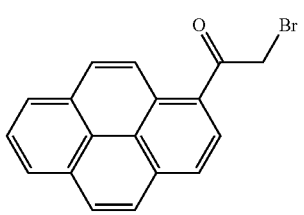
C-27
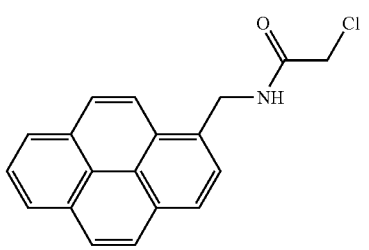
C-28
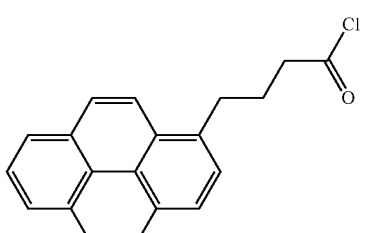
C-29
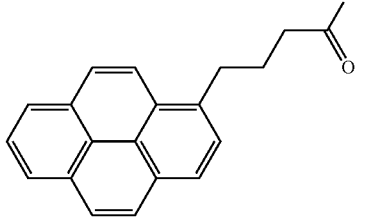
C-30
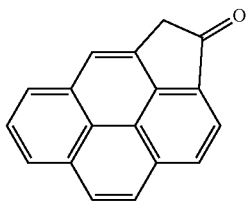

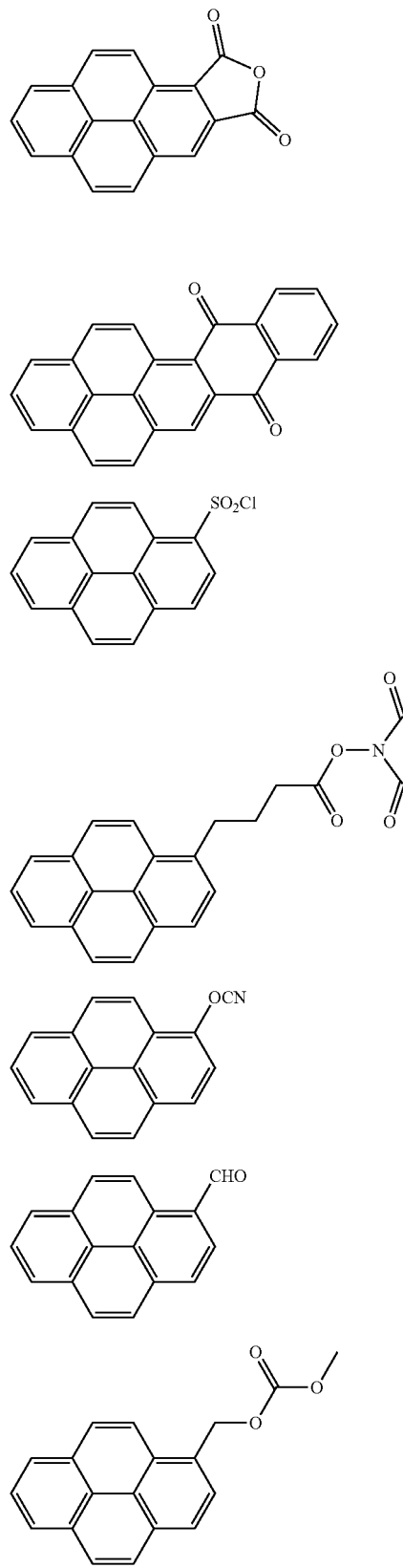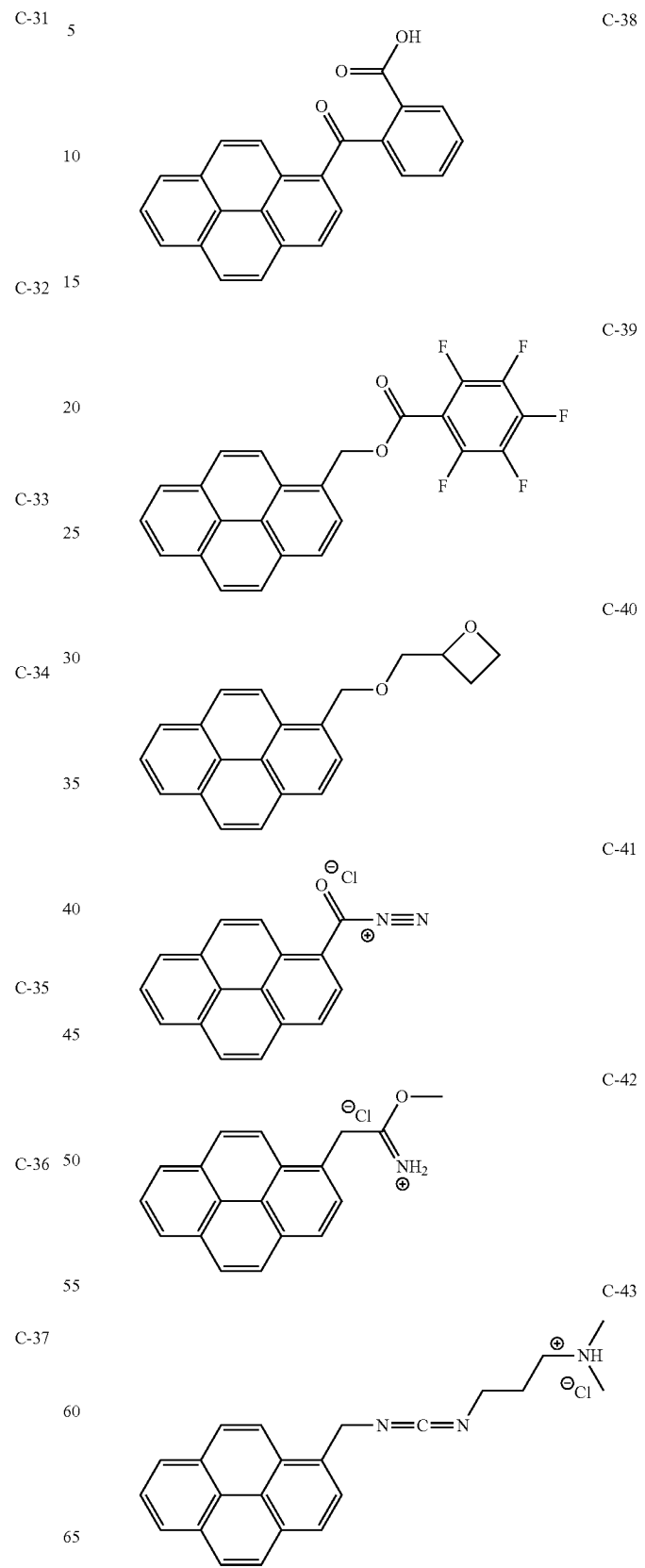

-continued
C-44
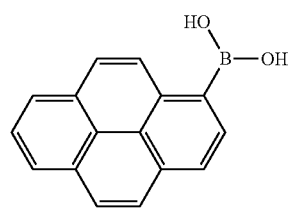
C-45
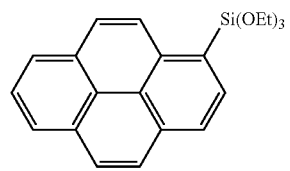
C-46
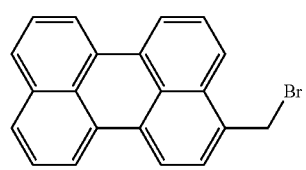
C-47
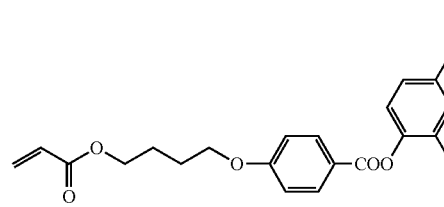
C-48
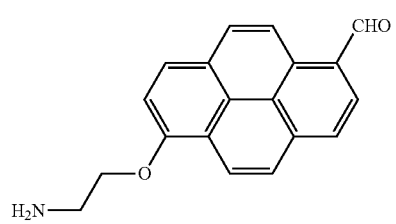
C-49
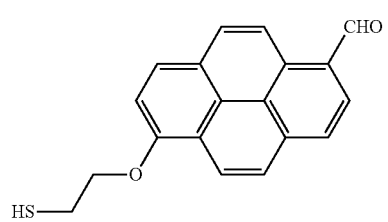
C-50
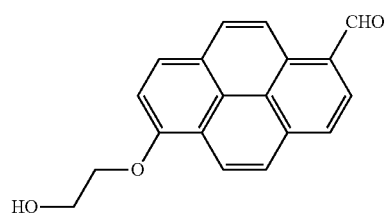
-continued
C-51
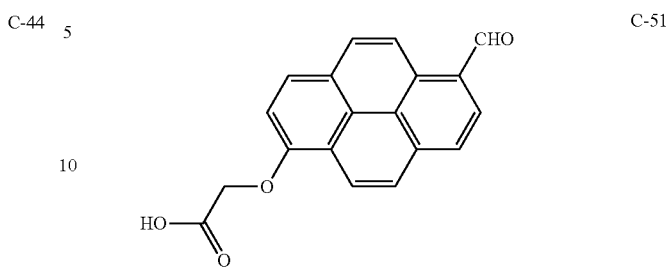
C-52
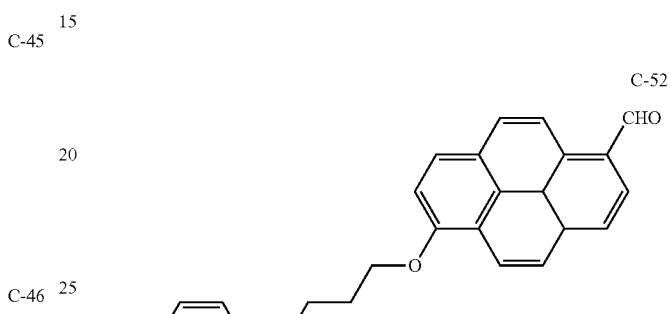
C-53
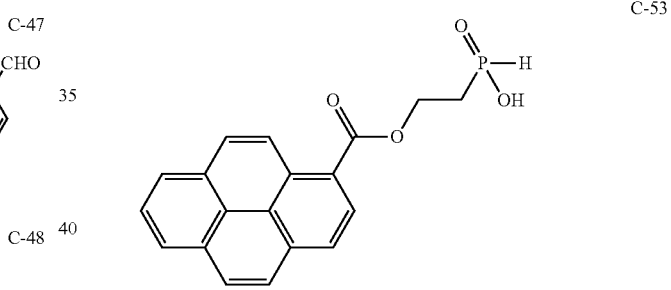
C-54
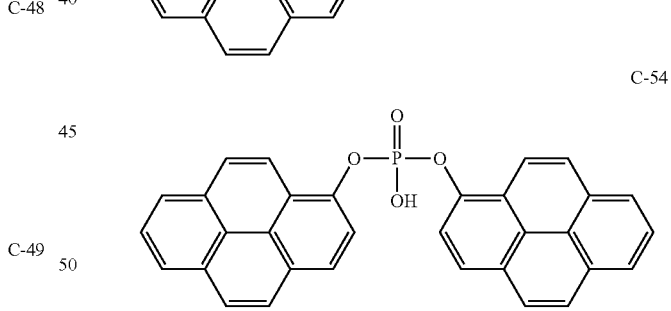
C-55
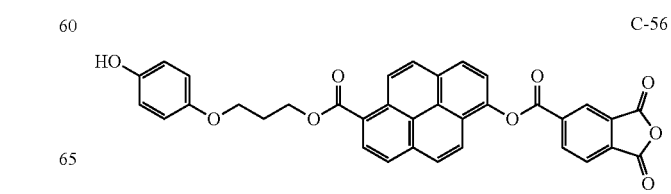
C-56
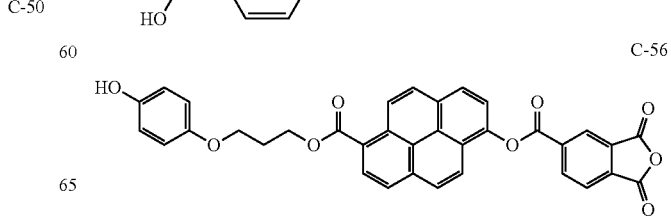

-continued

C-57

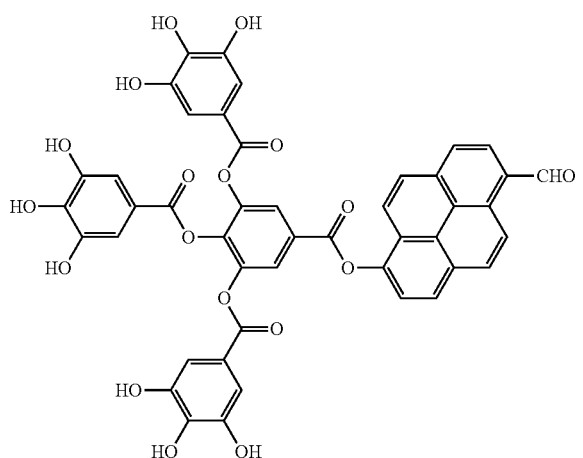

C-58

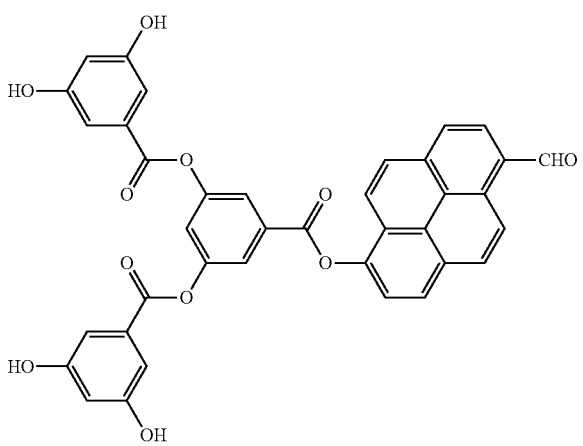

C-59

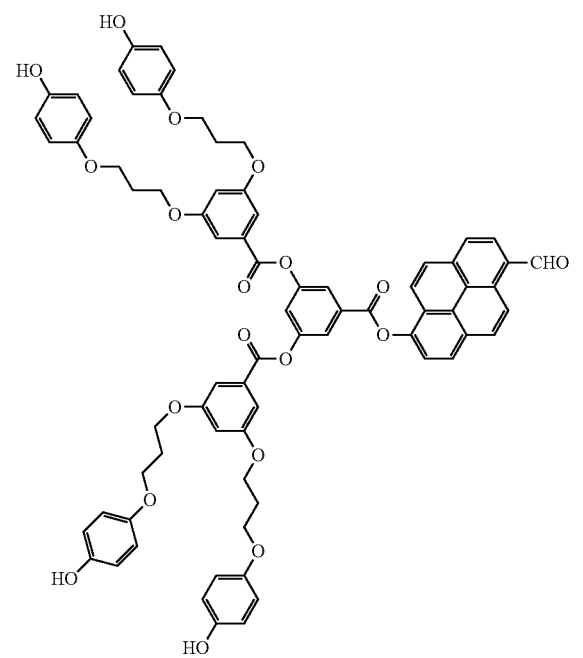

(Comparative Surface Modifier)

As the comparative surface modifier, compounds represented by the following D-1 and D-2 were used.

D-1

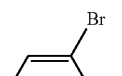

D-2

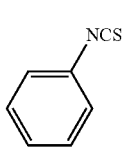

Example 1

Various components shown in Table 2 below were mixed in the order of the polymerizable monomer, the methyl ethyl ketone (MEK), the additive, the surface modifier (compound represented by General Formula (1)), and the polymerization initiator, and then the inorganic nitride was added thereto. The obtained mixture was treated for five minutes with a rotating and revolving mixer (manufactured by THINKY CORPORATION, AWATORI RENTARO ARE-310) to obtain a composition 1. In addition, the final solid content of the composition 1 was adjusted with MEK so as to have the solid content concentration (described in the column of "Solvent") described in Table 2.

Then, by using an applicator, a release surface of a polyester film (NP-100A, manufactured by PANAC CO., LTD., film thickness: 100 μm) was coated with the composition 1 such that the film thickness thereof became about 600 μm, and the obtained film was left to stand in the air for 1 hour to obtain a coating film 1.

Subsequently, a coating film surface of the coating film 1 was covered with another polyester film, and the coating film was cured by treatment with vacuum heat press (heat plate temperature: 130° C., degree of vacuum: <1 kPa, pressure: 12 MPa, treatment time: 5 minutes) to obtain a resin sheet. The polyester films on both surfaces of the resin sheet were peeled, thereby obtaining a thermally conductive sheet 1 having an average film thickness (in Example 1, the average film thickness was 350 μm) shown in Table 1.

(Evaluations)

The following evaluations were performed with respect to the obtained thermally conductive sheet 1.

[1] Dispersibility Evaluation

The dispersibility was evaluated by using the thermally conductive sheet 1. Specifically, the film thickness of the thermally conductive sheet 1 was measured at any five positions, a standard deviation was determined for variation in the measurement, and the evaluation was performed according to the following standards. A small standard deviation (in other words, small variation in the film thickness) indicates that the surface-modified inorganic nitrides are well dispersed. On the other hand, a large standard deviation (in other words, large variation in the film thickness) means that aggregation or the like occurs in the cured substance and thus surface irregularities are generated, that is, indicates that the dispersibility of the surface-modified inorganic nitride deteriorates.

The film thickness was measured by using "ai-Phase Mobile 1u" manufactured by ai-Phase Co., Ltd.

(Evaluation Standards)
"A": Standard deviation was less than 5
"B": Standard deviation was 5 or greater and less than 10
"C": Standard deviation was 10 or greater and less than 30
"D": Standard deviation was 30 or greater
The results are shown in Table 2.

[2] Thermally Conductive Properties Evaluation

The thermally conductive properties were evaluated by using the thermally conductive sheet 1. The thermal conductivity was measured by the following method, and the thermally conductive properties were evaluated according to the following standards.

Measurement of Thermal Conductivity (W/m·K)

(1) By using "ai-Phase Mobile 1u" manufactured by ai-Phase Co., Ltd., thermal diffusivity of the thermally conductive sheet 1 in a thickness direction was measured.

(2) By using a balance "XS204" ("solid specific gravity measuring kit" was used) manufactured by METTLER TOLEDO, the specific gravity of the thermally conductive sheet 1 was measured.

(3) By using "DSC320/6200" manufactured by Seiko Instruments Inc. and software of DSC7, the specific heat of the thermally conductive sheet 1 at 25° C. was determined under the heating condition of 10° C./min.

(4) The obtained thermal diffusivity was multiplied by the specific gravity and the specific heat, thereby calculating the thermal conductivity of the thermally conductive sheet 1.

(Evaluation Standards)
"A": 15 W/m·K or greater
"B": 12 W/m·K or greater and less than 15 W/m·K
"C": 9 W/m·K or greater and less than 12 W/m·K
"D": Less than 9 W/m·K
The results are shown in Table 2.

Examples 2 to 71 and Comparative Examples 1 and 2

Compositions of Examples and Comparative Examples shown in Table 2 below were obtained in the same procedure as that in Example 1. In addition, the final solid content of each of the compositions was adjusted with MEK so as to have the solid content concentration (described in the column of "Solvent") described in Table 2.

Furthermore, thermally conductive sheets 2 to 71 and comparative thermally conductive sheets 1 and 2 were prepared from the obtained respective compositions, and were subjected to the same evaluation tests as those in Example 1. The results are shown in Table 2.

In Table 2, the (numerical value) described in the column of each component means a content (% by mass) of each component with respect to the total solid content in the composition.

"Film thickness (μm)" described in Table 2 means an average film thickness of the thermally conductive sheet.

Furthermore, in Table 2, the curing accelerator A used in Example 67 is triphenylphosphine.

TABLE 2

| | Composition | | | | | | | Solvent (solid content concentration (% by mass)) | Evaluation | | |
|---|---|---|---|---|---|---|---|---|---|---|---|
| | Polymerizable monomer (% by mass) | Additive (% by mass) | Polymerization initiator (% by mass) | Inorganic nitride (% by mass) | Surface modifier (compound represented by General Formula (1)) | | | | | | |
| | | | | | Type (% by mass) | Specific functional group contained in group represented by Y | Fused-ring structure | | Dispersibility | Thermally conductive properties | Film thickness [μm] |
| Example 1 | A-1 (22) | B-2 (15) | None | SGPS (60) | C-1 (3) | Halogenated alkyl group | Naphthalene ring | MEK (40) | C | C | 350 |
| Example 2 | A-1 (22) | B-2 (15) | None | SGPS (60) | C-2 (3) | Isothiocyanate group | Naphthalene ring | MEK (40) | C | C | 350 |
| Example 3 | A-1 (22) | B-2 (15) | None | SGPS (60) | C-3 (3) | Ester group/succinimide group | Naphthalene ring | MEK (40) | C | C | 350 |
| Example 4 | A-1 (22) | B-2 (15) | None | SGPS (60) | C-4 (3) | Halogen atom | Pyrene ring | MEK (40) | B | B | 250 |
| Example 5 | A-1 (22) | B-2 (15) | None | SGPS (60) | C-5 (3) | Halogen atom | Pyrene ring | MEK (40) | B | B | 250 |
| Example 6 | A-1 (22) | B-2 (15) | None | SGPS (60) | C-6 (3) | Halogen atom | Pyrene ring | MEK (40) | B | B | 250 |
| Example 7 | A-1 (22) | B-2 (15) | None | SGPS (60) | C-7 (3) | Halogen atom | Pyrene ring | MEK (40) | B | B | 250 |
| Example 8 | A-1 (22) | B-2 (15) | None | SGPS (60) | C-8 (3) | Carboxylic acid group | Pyrene ring | MEK (40) | B | A | 250 |
| Example 9 | A-1 (22) | B-2 (15) | None | SGPS (60) | C-9 (3) | Phosphoric acid group | Pyrene ring | MEK (40) | B | A | 250 |
| Example 10 | A-1 (22) | B-2 (15) | None | SGPS (60) | C-10 (3) | Sulfonic acid group | Pyrene ring | MEK (40) | B | A | 250 |
| Example 11 | A-1 (22) | B-2 (15) | None | SGPS (60) | C-11 (3) | Phosphonic acid group | Pyrene ring | MEK (40) | B | A | 250 |
| Example 12 | A-1 (22) | B-2 (15) | None | SGPS (60) | C-12 (3) | Acrylic group | Pyrene ring | MEK (40) | B | A | 250 |
| Example 13 | A-1 (22) | B-2 (15) | None | SGPS (60) | C-13 (3) | Methacrylic group | Pyrene ring | MEK (40) | B | A | 250 |
| Example 14 | A-1 (22) | B-2 (15) | None | SGPS (60) | C-14 (3) | Alkynyl group | Pyrene ring | MEK (40) | B | A | 250 |
| Example 15 | A-1 (22) | B-2 (15) | None | SGPS (60) | C-15 (3) | Vinyl group | Pyrene ring | MEK (40) | B | A | 250 |
| Example 16 | A-1 (22) | B-2 (15) | None | SGPS (60) | C-16 (3) | Maleimide group | Pyrene ring | MEK (40) | B | A | 250 |
| Example 17 | A-1 (22) | B-2 (15) | None | SGPS (60) | C-17 (3) | Aryl halide group | Pyrene ring | MEK (40) | B | A | 250 |
| Example 18 | A-1 (22) | B-2 (15) | None | SGPS (60) | C-18 (3) | Hydroxyl group | Pyrene ring | MEK (40) | B | A | 250 |
| Example 19 | A-1 (22) | B-2 (15) | None | SGPS (60) | C-19 (3) | Hydroxyl group | Pyrene ring | MEK (40) | B | A | 250 |
| Example 20 | A-1 (22) | B-2 (15) | None | SGPS (60) | C-20 (3) | Nitro group | Pyrene ring | MEK (40) | B | A | 250 |
| Example 21 | A-1 (22) | B-2 (15) | None | SGPS (60) | C-21 (3) | Nitrile group | Pyrene ring | MEK (40) | B | A | 250 |
| Example 22 | A-1 (22) | B-2 (15) | None | SGPS (60) | C-22 (3) | Isocyanate group | Pyrene ring | MEK (40) | B | A | 250 |
| Example 23 | A-1 (22) | B-2 (15) | None | SGPS (60) | C-23 (3) | Isothiocyanate group | Pyrene ring | MEK (40) | B | A | 250 |
| Example 24 | A-1 (22) | B-2 (15) | None | SGPS (60) | C-24 (3) | Ester group/thiol group | Pyrene ring | MEK (40) | B | A | 250 |

TABLE 2-continued

| | Polymerizable monomer (% by mass) | Polymerization initiator (% by mass) | Additive (% by mass) | Inorganic nitride (% by mass) | Type (% by mass) | Specific functional group contained in group represented by $Y^{11}$ | Specific functional group contained in group represented by $Y^{12}$ | Fused-ring structure | Solvent (solid content concentration (% by mass)) | Dispersibility | Thermally conductive properties | Film thickness [μm] |
|---|---|---|---|---|---|---|---|---|---|---|---|---|
| Example 25 | A-1 (22) | B-2 (15) | None | SGPS (60) | C-25 (3) | Halogenated alkyl group | | Pyrene ring | MEK (40) | B | A | 250 |
| Example 26 | A-1 (22) | B-2 (15) | None | SGPS (60) | C-26 (3) | Carbonyl group/halogenated alkyl group | | Pyrene ring | MEK (40) | B | A | 250 |
| Example 27 | A-1 (22) | B-2 (15) | None | SGPS (60) | C-27 (3) | Carbonyl group/halogenated alkyl group | | Pyrene ring | MEK (40) | B | A | 250 |
| Example 28 | A-1 (22) | B-2 (15) | None | SGPS (60) | C-28 (3) | Carboxylic acid chloride group | | Pyrene ring | MEK (40) | B | A | 250 |
| Example 29 | A-1 (22) | B-2 (15) | None | SGPS (60) | C-29 (3) | Ester group | | Pyrene ring | MEK (40) | B | A | 250 |
| Example 30 | A-1 (22) | B-2 (15) | None | SGPS (60) | C-30 (3) | Carbonyl group | | Pyrene ring | MEK (40) | B | A | 250 |
| Example 31 | A-1 (22) | B-2 (15) | None | SGPS (60) | C-31 (3) | Acid anhydride group | | Pyrene ring | MEK (40) | B | A | 250 |
| Example 32 | A-1 (22) | B-2 (15) | None | SGPS (60) | C-32 (3) | Carbonyl group | | Pyrene ring | MEK (40) | B | A | 250 |
| Example 33 | A-1 (22) | B-2 (15) | None | SGPS (60) | C-33 (3) | Sulfonyl chloride group | | Pyrene ring | MEK (40) | B | A | 250 |
| Example 34 | A-1 (22) | B-2 (15) | None | SGPS (60) | C-34 (3) | Ester group/succinimide group | | Pyrene ring | MEK (40) | B | A | 250 |
| Example 35 | A-1 (22) | B-2 (15) | None | SGPS (60) | C-34 (3) | Ester group/succinimide group | | Pyrene ring | MEK (40) | B | A | 250 |
| Example 36 | A-1 (22) | B-2 (15) | None | SGPS (60) | C-34 (3) | Ester group/succinimide group | | Pyrene ring | MEK (40) | B | A | 250 |
| Example 37 | A-3 (22) | B-1 (14) | VAm-110 (1) | SGPS (60) | C-34 (3) | Ester group/succinimide group | | Pyrene ring | MEK (40) | B | A | 250 |
| Example 38 | A-4 (22) | B-1 (14) | VAm-110 (1) | SGPS (60) | C-34 (3) | Ester group/succinimide group | | Pyrene ring | MEK (40) | B | A | 250 |
| Example 39 | A-1 (22) | B-2 (15) | None | SGPS (60) | C-34 (3) | Ester group/succinimide group | | Pyrene ring | MEK (40) | B | A | 250 |
| Example 40 | A-1 (22) | B-2 (15) | None | SGPS (60) | C-34 (3) | Ester group/succinimide group | | Pyrene ring | MEK (40) | B | A | 250 |
| Example 41 | A-1 (19) | B-2 (13) | None | SGPS (65) | C-34 (3) | Ester group/succinimide group | | Pyrene ring | MEK (40) | A | A | 250 |
| Example 42 | A-1 (17) | B-2 (10) | None | SGPS (70) | C-34 (3) | Ester group/succinimide group | | Pyrene ring | MEK (40) | A | A | 250 |
| Example 43 | A-1 (22) | B-2 (15) | None | SGPS (60) | C-35 (3) | Cyanate group | | Pyrene ring | MEK (40) | B | A | 250 |
| Example 44 | A-1 (22) | B-2 (15) | None | SGPS (60) | C-36 (3) | Aldehyde group | | Pyrene ring | MEK (40) | B | A | 250 |
| Example 45 | A-1 (22) | B-2 (15) | None | SGPS (60) | C-37 (3) | Carbonate group | | Pyrene ring | MEK (40) | B | A | 250 |
| Example 46 | A-1 (22) | B-2 (15) | None | SGPS (60) | C-38 (3) | Carbonyl group/carboxylic acid group | | Pyrene ring | MEK (40) | B | A | 250 |
| Example 47 | A-1 (22) | B-2 (15) | None | SGPS (60) | C-39 (3) | Ester group/aryl halide group | | Pyrene ring | MEK (40) | B | A | 250 |
| Example 48 | A-1 (22) | B-2 (15) | None | SGPS (60) | C-40 (3) | Oxetanyl group | | Pyrene ring | MEK (40) | B | A | 250 |
| Example 49 | A-1 (22) | B-2 (15) | None | SGPS (60) | C-41 (3) | Acyl azide group | | Pyrene ring | MEK (40) | B | A | 250 |
| Example 50 | A-1 (22) | B-2 (15) | None | SGPS (60) | C-42 (3) | Imidoester group | | Pyrene ring | MEK (40) | B | A | 250 |
| Example 51 | A-1 (22) | B-2 (15) | None | SGPS (60) | C-43 (3) | Carbodiimide group/onium group | | Pyrene ring | MEK (40) | B | A | 250 |
| Example 52 | A-1 (22) | B-2 (15) | None | SGPS (60) | C-44 (3) | Boronic acid group | | Pyrene ring | MEK (40) | B | A | 250 |
| Example 53 | A-1 (22) | B-2 (15) | None | SGPS (60) | C-45 (3) | Alkoxysilyl group | | Pyrene ring | MEK (40) | B | A | 250 |
| Example 54 | A-1 (22) | B-2 (15) | None | SGPS (60) | C-46 (3) | Halogenated alkyl group | | Benzene ring | MEK (40) | B | A | 250 |
| Example 55 | A-2 (22) | B-2 (15) | None | SGPS (60) | C-53 (3) | Phosphinic acid group/ester group | | Pyrene ring | MEK (40) | B | A | 250 |
| Example 56 | A-2 (22) | B-2 (15) | None | SGPS (60) | C-54 (3) | Phosphoric acid ester group | | Pyrene ring | MEK (40) | B | A | 250 |
| Comparative Example 1 | A-1 (22) | B-2 (15) | None | SGPS (60) | D-1 (3) | Halogen atom | | Benzene ring | MEK (40) | D | D | 350 |
| Comparative Example 2 | A-1 (22) | B-2 (15) | None | SGPS (60) | D-2 (3) | Isothiocyanate group | | Benzene ring | MEK (40) | D | D | 400 |
| Example 57 | A-3 (22) | B-1 (14) | VAm-110 (1) | SGPS (60) | C-47 (3) | Aldehyde group | Acrylic group/ester group | Pyrene ring | MEK (40) | A | A | 250 |
| Example 58 | A-1 (22) | B-2 (15) | None | SGPS (60) | C-48 (3) | Aldehyde group | Amino group | Pyrene ring | MEK (40) | A | A | 250 |

TABLE 2-continued

| Example | | | | | | | | | | | | |
|---|---|---|---|---|---|---|---|---|---|---|---|---|
| Example 59 | A-1 (22) | B-2 (15) | None | SGPS (60) | C-49 (3) | Aldehyde group | Thiol group | Pyrene ring | MEK (40) | A | A | 250 |
| Example 60 | A-1 (22) | B-2 (15) | None | SGPS (60) | C-50 (3) | Aldehyde group | Hydroxyl group | Pyrene ring | MEK (40) | A | A | 250 |
| Example 61 | A-1 (22) | B-2 (15) | None | SGPS (60) | C-51 (3) | Aldehyde group | Carboxylic acid group | Pyrene ring | MEK (40) | A | A | 250 |
| Example 62 | A-1 (22) | B-2 (15) | None | SGPS (60) | C-52 (3) | Aldehyde group | Hydroxyl group | Pyrene ring | MEK (40) | A | A | 250 |
| Example 63 | A-2 (22) | B-2 (15) | None | SGPS (60) | C-52 (3) | Aldehyde group | Hydroxyl group | Pyrene ring | MEK (40) | A | A | 250 |
| Example 64 | A-2 (22) | B-2 (15) | None | SGPS (60) | C-52 (3) | Aldehyde group | Hydroxyl group | Pyrene ring | MEK (40) | A | A | 250 |
| Example 65 | A-2 (22) | B-2 (15) | None | SGPS (60) | C-55 (3) | Aldehyde group | Hydroxyl group | Pyrene ring | MEK (40) | A | A | 250 |
| Example 66 | A-2 (22) | B-2 (15) | None | AlN (60) | C-55 (3) | Aldehyde group | Hydroxyl group | Pyrene ring | MEK (40) | A | A | 250 |
| Example 67 | A-2 (22) | B-3 (14) | Curing accelerator A (1) | SGPS (60) | C-52 (3) | Aldehyde group | Hydroxyl group | Pyrene ring | MEK (40) | A | A | 250 |
| Example 68 | A-1 (22) | B-2 (15) | None | SGPS (60) | C-56 (3) | Ester group/acid anhydride group | Ester group/hydroxyl group | Pyrene ring | MEK (40) | A | A | 250 |
| Example 69 | A-1 (22) | B-2 (15) | None | SGPS (60) | C-57 (3) | Aldehyde group | Ester group/hydroxyl group | Pyrene ring | MEK (40) | A | A | 250 |
| Example 70 | A-1 (22) | B-2 (15) | None | SGPS (60) | C-58 (3) | Aldehyde group | Ester group/hydroxyl group | Pyrene ring | MEK (40) | A | A | 250 |
| Example 71 | A-1 (22) | B-2 (15) | None | SGPS (60) | C-59 (3) | Aldehyde group | Ester group/hydroxyl group | Pyrene ring | MEK (40) | A | A | 250 |

As shown in the above tables, it was confirmed that in a case where the surface-modified inorganic nitride according to the embodiment of the present invention is used, the thermal conductivity is further improved. The improvement of thermal conductivity results from the improvement of the dispersibility of the surface-modified inorganic nitride in the sample. That is, it was confirmed that the affinity between the surface-modified inorganic nitride and an organic substance is improved.

Furthermore, through the comparison between Example 1 and Example 25, between Example 2 and Example 23, and between Example 3 and Example 34, it was confirmed that in a case where the specific compound has a fused-ring structure containing three or more benzene rings, the dispersibility and the thermal conductivity are further improved.

From the results of Examples 58 to 71, it was confirmed that in a case where the specific compound is a compound represented by General Formula (2), the dispersibility is further improved.

What is claimed is:

1. A surface-modified inorganic nitride comprising:
an inorganic nitride; and
a specific compound adsorbed onto a surface of the inorganic nitride,
wherein the specific compound has a functional group selected from the group consisting of a boronic acid group, an aldehyde group, an isocyanate group, an isothiocyanate group, a cyanate group, an acyl azide group, a succinimide group, a sulfonyl chloride group, a carboxylic acid chloride group, an onium group, a carbonate group, an aryl halide group, a carbodiimide group, an acid anhydride group, a carboxylic acid group, a phosphonic acid group, a phosphinic acid group, a phosphoric acid group, a phosphoric acid ester group, a sulfonic acid group, a halogenated alkyl group, a nitrile group, a nitro group, an ester group, a carbonyl group, an imidoester group, an alkoxysilyl group, an acrylic group, a methacrylic group, an oxetanyl group, a vinyl group, an alkynyl group, a maleimide group, a thiol group, a hydroxyl group, a halogen atom, and an amino group; and has a fused-ring structure containing two or more rings selected from the group consisting of an aromatic hydrocarbon ring and an aromatic heterocyclic ring,
wherein the specific compound is a compound represented by General Formula (1), $$X\!\!-\!\!(Y)_n \quad (1)$$

in General Formula (1), X represents an n-valent organic group which has a fused-ring structure containing two or more rings selected from the group consisting of an aromatic hydrocarbon ring and an aromatic heterocyclic ring; n represents an integer of 1 or greater; Y represents a monovalent group represented by General Formula (B1), a monovalent group represented by General Formula (B2), or a monovalent group represented by General Formula (B4), or, in a case where n represents an integer of 2 or greater, represents a divalent group represented by General Formula (B3), formed by bonding a plurality of Y's to each other; and in a case where n is 2 or greater, the plurality of Y's may be the same as or different from each other, $$*^1\text{-}L^1\text{-}P^1 \qquad \text{General Formula (B1):}$$

in General Formula (B1), $L^1$ represents a single bond or a divalent linking group; $P^1$ represents, an aldehyde group, an isocyanate group, an isothiocyanate group, a cyanate group, an acyl azide group, a succinimide group, a sulfonyl chloride group, a carboxylic acid chloride group, an onium group, an aryl halide group, an acid anhydride group, a phosphinic acid group, a phosphoric acid group, a phosphoric acid ester group, a halogenated alkyl group, a nitrile group, a nitro group, an alkoxysilyl group, an acrylic group, a methacrylic group, an oxetanyl group, a vinyl group, an alkynyl group, a maleimide group, a thiol group, a halogen atom, or an amino group; and $*^1$ represents a position bonded to X, $$*^2\text{-}L^2\text{-}P^2 \qquad \text{General Formula (B2):}$$

in General Formula (B2), $L^2$ represents a divalent linking group containing a carbonate group, a carbodiimide group, an acid anhydride group, an ester group, a carbonyl group, or an imidoester group; $P^2$ represents a monovalent organic group; and $*^2$ represents a position bonded to X, $$*^{31}\text{-}L^3\text{-}*^{32} \qquad \text{General Formula (B3):}$$

in General Formula (B3), $L^3$ represents a divalent linking group containing a carbonate group, a carbodiimide group, an acid anhydride group, an ester group, a carbonyl group, or an imidoester group; and $*^{31}$ and $*^{32}$ represent positions bonded to X, General Formula (B4):

$$*^4\text{-}L^4\text{-}(P^4)_{m^{11}}$$

in General Formula (B4), $L^4$ represents an $(m^{11}+1)$-valent linking group; $m^{11}$ represents an integer of 2 or greater; $P^4$ represents a boronic acid group, an aldehyde group, an isocyanate group, an isothiocyanate group, a cyanate group, an acyl azide group, a succinimide group, a sulfonyl chloride group, a carboxylic acid chloride group, an onium group, an aryl halide group, an acid anhydride group, a carboxylic acid group, a phosphonic acid group, a phosphinic acid group, a phosphoric acid group, a phosphoric acid ester group, a sulfonic acid group, a halogenated alkyl group, a nitrile group, a nitro group, an alkoxysilyl group, an acrylic group, a methacrylic group, an oxetanyl group, a vinyl group, an alkynyl group, a maleimide group, a thiol group, a hydroxyl group, a halogen atom, or an amino group; and $*^4$ represents a position bonded to X.

2. The surface-modified inorganic nitride according to claim 1,
wherein Y contains an aldehyde group.

3. The surface-modified inorganic nitride according to claim 1,
wherein X has a fused-ring structure containing two or more aromatic hydrocarbon rings.

4. The surface-modified inorganic nitride according to claim 3,
wherein X has a fused-ring structure containing two or more benzene rings.

5. The surface-modified inorganic nitride according to claim 3,
wherein X has a fused-ring structure containing three or more benzene rings.

6. The surface-modified inorganic nitride according to claim 3,
wherein X has a fused-ring structure having a fused ring selected from the group consisting of biphenylene, indacene, acenaphthylene, fluorene, phenalene, phenanthrene, anthracene, fluoranthene, acephenanthrylene, aceanthrylene, pyrene, chrysene, tetracene, pleiadene, picene, perylene, pentaphene, pentacene, tetraphenylene, hexaphene, and triphenylene.

7. The surface-modified inorganic nitride according to claim 1,
wherein the inorganic nitride is at least one kind of nitride selected from the group consisting of boron nitride and aluminum nitride.

8. The surface-modified inorganic nitride according to claim 7,
wherein the inorganic nitride is boron nitride.

9. A composition comprising:
the surface-modified inorganic nitride according to claim 1; and
a polymerizable monomer.

10. The composition according to claim 9,
wherein the polymerizable monomer has a group selected from the group consisting of an acryloyl group, a methacryloyl group, an oxiranyl group, and a vinyl group.

11. The composition according to claim 9,
wherein the polymerizable monomer or a cured substance thereof exhibits liquid crystallinity.

12. The composition according to claim 9 that is used for forming a thermally conductive material.

13. A thermally conductive material comprising the surface-modified inorganic nitride according to claim 1.

14. The thermally conductive material according to claim 13 that is in the form of a sheet.

15. The thermally conductive material according to claim 13 that is used in a heat dissipation sheet.

16. A device with a thermally conductive layer, comprising:
a device; and
a thermally conductive layer which is disposed on the device and contains the thermally conductive material according to claim 13.

17. A surface-modified inorganic nitride comprising:
an inorganic nitride; and
a specific compound adsorbed onto a surface of the inorganic nitride,
wherein the specific compound has a functional group selected from the group consisting of a boronic acid group, an aldehyde group, an isocyanate group, an isothiocyanate group, a cyanate group, an acyl azide group, a succinimide group, a sulfonyl chloride group, a carboxylic acid chloride group, an onium group, a carbonate group, an aryl halide group, a carbodiimide group, an acid anhydride group, a carboxylic acid group, a phosphonic acid group, a phosphinic acid group, a phosphoric acid group, a phosphoric acid ester group, a sulfonic acid group, a halogenated alkyl group, a nitrile group, a nitro group, an ester group, a carbonyl group, an imidoester group, an alkoxysilyl group, an acrylic group, a methacrylic group, an oxetanyl group, a vinyl group, an alkynyl group, a maleimide group, a thiol group, a hydroxyl group, a halogen atom, and an amino group; and has a fused-ring structure containing two or more rings selected from the group consisting of an aromatic hydrocarbon ring and an aromatic heterocyclic ring, wherein the specific compound is a compound represented by General Formula (2),

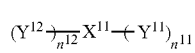 (2)

in General Formula (2), $X^{11}$ represents an $(n^{11}+n^{12})$-valent organic group which has a fused-ring structure containing two or more rings selected from the group consisting of an aromatic hydrocarbon ring and an aromatic heterocyclic ring; $n^{11}$ and $n^{12}$ each independently represent an integer of 1 or greater; and $Y^{11}$ represents a monovalent group represented by General Formula (C1) or a monovalent group represented by General Formula (C2), or, in a case where $n^{11}$ represents an integer of 2 or greater, represents a divalent group represented by General Formula (C3), formed by bonding a plurality of $Y^{11}$'s to each other, $*^1\text{-M}^1\text{-Q}^1$ General Formula (C1):

in General Formula (C1), $M^1$ represents a single bond or a divalent linking group; $Q^1$ represents an aldehyde group, an isocyanate group, an isothiocyanate group, a cyanate group, an acyl azide group, a succinimide group, a sulfonyl chloride group, a carboxylic acid chloride group, an onium group, an aryl halide group, an acid anhydride group, a phosphinic acid group, a phosphoric acid group, a phosphoric acid ester group, a halogenated alkyl group, a nitrile group, a nitro group, or a halogen atom; and $*^1$ represents a position bonded to $X^{11}$, $*^2\text{-M}^2\text{-Q}^2$ General Formula (C2):

in General Formula (C2), $M^2$ represents a divalent linking group containing a carbonate group, a carbodiimide group, an acid anhydride group, an ester group, a carbonyl group, or an imidoester group; $Q^2$ represents a monovalent organic group; and $*^2$ represents a position bonded to $X^{11}$, $*^{31}\text{-M}^3\text{-}*^{32}$ General Formula (C3):

in General Formula (C3), $M^3$ represents a divalent linking group containing a carbonate group, a carbodiimide group, an acid anhydride group, an ester group, a carbonyl group, or an imidoester group; and $*^{31}$ and $*^{32}$ represent positions bonded to $X^{11}$,
$Y^{12}$ represents a monovalent group represented by General Formula (D1) or a monovalent group represented by General Formula (D2), $*^1\text{-W}^1\text{-R}^1$ General Formula (D1):

in General Formula (D1), $W^1$ represents a single bond or a divalent linking group; $R^1$ represents a carboxylic acid group, an alkoxysilyl group, an acrylic group, a methacrylic group, an oxetanyl group, a vinyl group, an alkynyl group, a maleimide group, a thiol group, a hydroxyl group, or an amino group; and $*^1$ represents a position bonded to $X^{11}$, General Formula (D2):

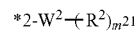

in General Formula (D2), $W^2$ represents an $(m^{21}+1)$-valent linking group; $m^{21}$ represents an integer of 2 or greater; $R^2$ represents a carboxylic acid group, an alkoxysilyl group, an acrylic group, a methacrylic group, an oxetanyl group, a vinyl group, an alkynyl group, a maleimide group, a thiol group, a hydroxyl group, or an amino group; and $*^2$ represents a position bonded to $X^{11}$, and in a case where $n^{11}$ is 2 or greater, the plurality of $Y^{11}$'s may be the same as or different from each other; and in a case where $n^{12}$ is 2 or greater, a plurality of $Y^{12}$'s may be the same as or different from each other.

18. The surface-modified inorganic nitride according to claim 17,
wherein $Y^{11}$ contains an aldehyde group.

19. The surface-modified inorganic nitride according to claim 17,
wherein $X^{11}$ has a fused-ring structure containing two or more aromatic hydrocarbon rings.

20. The surface-modified inorganic nitride according to claim 19,
wherein $X^{11}$ has a fused-ring structure containing two or more benzene rings.

21. The surface-modified inorganic nitride according to claim 19,
wherein $X^{11}$ has a fused-ring structure containing three or more benzene rings.

22. The surface-modified inorganic nitride according to claim 19,
wherein $X^{11}$ has a fused-ring structure having a fused ring selected from the group consisting of biphenylene, indacene, acenaphthylene, fluorene, phenalene, phenanthrene, anthracene, fluoranthene, acephenanthrylene, aceanthrylene, pyrene, chrysene, tetracene, pleiadene, picene, perylene, pentaphene, pentacene, tetraphenylene, hexaphene, and triphenylene.

* * * * *